United States Patent
Yamamoto

(10) Patent No.: US 10,026,738 B2
(45) Date of Patent: Jul. 17, 2018

(54) SEMICONDUCTOR DEVICE AND SEMICONDUCTOR INTEGRATED CIRCUIT USING THE SAME

(71) Applicant: ROHM CO., LTD., Kyoto (JP)

(72) Inventor: Seiichi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/292,475

(22) Filed: Oct. 13, 2016

(65) Prior Publication Data
US 2017/0110455 A1   Apr. 20, 2017

(30) Foreign Application Priority Data
Oct. 20, 2015  (JP) .................. 2015-206627

(51) Int. Cl.
| | |
|---|---|
| H01L 29/417 | (2006.01) |
| H01L 29/423 | (2006.01) |
| H01L 27/092 | (2006.01) |
| H01L 29/06 | (2006.01) |
| H01L 29/10 | (2006.01) |
| H01L 29/78 | (2006.01) |
| H03K 19/0948 | (2006.01) |

(52) U.S. Cl.
CPC ........ *H01L 27/092* (2013.01); *H01L 29/0649* (2013.01); *H01L 29/0653* (2013.01); *H01L 29/1033* (2013.01); *H01L 29/1079* (2013.01); *H01L 29/41775* (2013.01); *H01L 29/4238* (2013.01); *H01L 29/7831* (2013.01); *H03K 19/0948* (2013.01)

(58) Field of Classification Search
CPC . H01L 27/088; H01L 27/092; H01L 29/0649; H01L 29/0653; H01L 29/0847; H01L 29/1033; H01L 29/1079; H01L 29/41775; H01L 29/42376; H01L 29/4238; H01L 29/7831; H03K 19/0944; H03K 19/0948
See application file for complete search history.

(56) References Cited

FOREIGN PATENT DOCUMENTS

| | | | |
|---|---|---|---|
| GB | 1298375 A | * 11/1972 | ............. H01L 23/29 |
| JP | 07-086582 | 3/1995 | |
| JP | 2001-160623 | 6/2001 | |
| JP | 3397693 | 2/2003 | |
| JP | 2003-168779 | 6/2003 | |
| JP | 4136145 | 6/2008 | |
| KR | 2005-0001100 A | * 1/2005 | ............. H01L 29/78 |

* cited by examiner

*Primary Examiner* — Stephen W Smoot
(74) *Attorney, Agent, or Firm* — Fish & Richardson P.C.

(57) ABSTRACT

A semiconductor device includes a channel region of a first conductivity type, a gate insulating film formed on the channel region, a gate electrode formed on the gate insulating film, a first region of a second conductivity type and a second region of the second conductivity type, which are formed along the gate electrode while facing each other with the gate electrode interposed between the first region and the second region, a semiconductor region of the second conductivity type on which the first region, the second region and the channel region are formed, and an element isolation region which surrounds the semiconductor region. The gate electrode extends beyond a boundary portion between the channel region and the element isolation region. A width of the first region is smaller than a width of the second region in a channel width direction of the first region and the second region.

13 Claims, 38 Drawing Sheets

US 10,026,738 B2

SEMICONDUCTOR DEVICE AND SEMICONDUCTOR INTEGRATED CIRCUIT USING THE SAME

CROSS-REFERENCE TO RELATED APPLICATION(S)

This application is based upon and claims the benefit of priority from Japanese Patent Application No. 2015-206627, filed on Oct. 20, 2015, the entire contents of which are incorporated herein by reference.

TECHNICAL FIELD

The present disclosure relates to a semiconductor device having a trench element isolation structure, and a semiconductor integrated circuit using the same.

BACKGROUND

In recent years, as a semiconductor device having a trench element isolation structure, a semiconductor device having a STI (Shallow Trench Isolation) structure or a DTI (Deep Trench Isolation) structure has attracted attention.

FIG. 29 is a schematic plan view illustrating the configuration of a semiconductor device 10 having a STI structure in the related art. FIG. 30 is a schematic sectional view taken along line A-A of the semiconductor device 10 of FIG. 29. FIG. 31 is a schematic sectional view taken along line B-B of the semiconductor device 10 of FIG. 29. FIG. 32 is a schematic plan view illustrating a main transistor and a parasitic transistor of the semiconductor device 10 of FIG. 29. FIG. 33 is a circuit diagram illustrating a relationship between the main transistor and the parasitic transistor of the semiconductor device 10 of FIG. 29. FIG. 34 is a graph showing a gate-source voltage (Vgs)-drain current (Id) characteristic of the semiconductor device 10 of FIG. 29.

Hereinafter, the semiconductor device 10 having a STI structure in the related art will be described with reference to the drawings. In FIGS. 29 to 32, as indicated by arrows X, Y and Z, three mutually orthogonal directions are defined as X, Y and Z directions, respectively. Throughout these figures, elements and parts or portions having the same functions may be denoted by the same reference numerals or symbols and explanation of which will not be repeated for the purpose of brevity and clarity.

As illustrated in FIG. 29, the semiconductor device 10 forms a transistor including an element isolation region 11 made of an insulating material, a source region 12, a drain region 13, a gate electrode 14, a semiconductor region 15 and a gate insulating film 16.

The semiconductor region 15 is a region on which the source region 12 and the drain region 13 are formed and also a region which is surrounded by the element isolation region 11. In a case of forming an NMOS transistor, the semiconductor region 15 is formed of the same P-type region as a silicon substrate.

The drain region 13 is formed in a substantially rectangular shape on a main surface of the semiconductor region 15. A long side of the drain region 13 extends in the Y direction, that is, the direction of a channel width W1 and channel a width W2 and a short side thereof extends in the X direction, that is, the direction of a channel length L1. An end portion of the drain region 13 in the Y and X directions is in contact with the element isolation region 11.

The source region 12 is formed in a substantially rectangular shape on the main surface of the semiconductor region 15 at a predetermined interval in the X direction with respect to the drain region 13. A long side of the source region 12 extends in the Y direction and a short side thereof extends in the X direction. An end portion of the source region 12 in the Y and X directions is in contact with the element isolation region 11, like the drain region 13.

The channel width W1 of the source region 12 in the Y direction and the channel width W2 of the drain region 13 in the Y direction are determined by the shape of the element isolation region 11. In typical, the channel width W1 and the channel width W2 are made approximately equal to each other. The length L1 from the end portion of the source region 12 to the end portion of the drain region 13 is typically called a channel length.

The element isolation region 11 is formed on the main surface of the semiconductor region 15 and inside the semiconductor region 15 so as to surround the source region 12 and the drain region 13.

The gate insulating film 16 is formed in a substantially rectangular shape on an upper portion of the semiconductor region 15 between the source region 12 and the drain region 13. Both end portions of the gate insulating film 16 in the Y direction are connected to the element isolation region 11. One end portion of the gate insulating film 16 in the X direction substantially overlaps the source region 12. The other end portion of the gate insulating film 16 in the X direction substantially overlaps the drain region 13.

The gate electrode 14 is formed in a substantially rectangular shape so as to overlap the gate insulating film 16. A long side of the gate electrode 14 extends in the Y direction and a short side thereof extends in the X direction.

FIG. 30 is a schematic sectional view taken along line A-A of the semiconductor device 10 of FIG. 29. As shown in FIG. 30, the semiconductor region 15 is formed on a main surface of a semiconductor substrate 17. In FIG. 30, the semiconductor region 15 and the semiconductor substrate 17 may be of the same conductivity type or of different conductivity types. Each of the element isolation region 11, the source region 12 and the drain region 13 has a certain depth from the main surface of the semiconductor region 15 in the Z direction. For example, the element isolation region 11 is formed to be deeper than the source region 12 and the drain region 13. In addition, a channel region ch is formed in the semiconductor region 15 between the source region 12 and the drain region 13. The end portions of the source region 12 and the drain region 13 are formed in contact with the element isolation region 11.

FIG. 31 is a schematic sectional view taken along line B-B of the semiconductor device 10 of FIG. 29. As shown in FIG. 31, a thickness ox of each of both end portions of the gate insulating films 16 at a boundary portion between the channel region ch and the element isolation region 11 in the Y direction, that is, the direction of the channel width W1 and the channel width W2, is smaller than those of other portions.

FIG. 32 is a schematic plan view showing a relationship between a main transistor and parasitic transistors in the semiconductor device 10 of FIG. 29. As shown in FIG. 32, the semiconductor device 10 includes a main transistor Q10, a parasitic transistor Q11 and a parasitic transistor Q12. The parasitic transistor Q11 and the parasitic transistor Q12 are formed at the boundary portion between the channel region ch and the element isolation region 11 in the Y direction, that is, the direction of the channel width W1 and the channel width W2. The main transistor Q10 is formed in the channel region ch in the semiconductor region 15 where the parasitic transistor Q11 and the parasitic transistor Q12 are not formed. In the semiconductor device 10, it is not possible to clearly delineate a boundary between the main transistor Q10 and the parasitic transistors Q11 and Q12. However, in the specification, for convenience of explanation, they are distinguished from each other in this way. The number of parasitic transistors is not limited to two but may be three or more.

FIG. 33 is a schematic equivalent circuit diagram of the semiconductor device 10 of FIG. 32. The sources, the drains and the gates of the parasitic transistor Q11 and the parasitic transistor Q12 are connected to the source, the drain and the gate of the main transistor Q10, respectively. That is, the main transistor Q10, the parasitic transistor Q11 and the parasitic transistor Q12 are connected in parallel in such a manner that the sources, drains and gates of the main transistor Q10, the parasitic transistor Q11 and the parasitic transistor Q12 form a common source S, a common drain D and a common gate G, respectively. The semiconductor device 10 is constituted by the common source S, the common drain D and the common gate G.

The gate thickness t10 of the main transistor Q10 is larger than the gate thickness t11 of the parasitic transistor Q11 and the gate thickness t12 of the parasitic transistor Q12 (t10>t11 (t12)). In this case, within a certain range of a gate width of the main transistor Q10, threshold voltages of the parasitic transistor Q11 and the parasitic transistor Q12 may be lower than a threshold voltage of the main transistor Q10. In addition, unlike the gate thickness t10 of the main transistor Q10, it is difficult to limit the gate thickness t11 of the parasitic transistor Q11 and the gate thickness t12 of the parasitic transistor Q12 to a certain range in manufacture. The thicknesses thereof are denoted by ox in FIG. 31.

Channel surface potentials of the parasitic transistor Q11 and the parasitic transistor Q12 are different from a channel surface potential of the main transistor Q10. Since gate insulating films of the parasitic transistor Q11 and the parasitic transistor Q12 are often made thin, thereby providing a low threshold voltage, a drain current (Id) flows in a state where a gate-source voltage (Vgs) is low. A drain current of the main transistor Q10 in a sub-threshold region may be smaller than the drain current of the parasitic transistor Q11 and the parasitic transistor Q12. A desired circuit operation obtained by controlling the drain current of the sub-threshold region of the main transistor Q10 may be inhibited by the drain current of the parasitic transistor Q11 and the parasitic transistor Q12.

FIG. 34 shows a gate-source voltage (Vgs)-drain current (Id) characteristic in the semiconductor device 10 of FIG. 29 and the equivalent circuit diagram of FIG. 33. In FIG. 34, symbol X denotes a curve showing a gate-source voltage (Vgs)-drain current (Id) characteristic of the parasitic transistor Q11 and the parasitic transistor Q12. Symbol Y denotes a curve showing a gate-source voltage (Vgs)-drain current (Id) characteristic of the main transistor Q10. As shown in the gate-source voltage (Vgs)-drain current (Id) characteristic curve, when the parasitic transistor Q11 and the parasitic transistor Q12 are present, in a weak inversion region, i.e., the sub-threshold region, where the gate-source voltage Vgs of the main transistor Q10 is small, the drain current of the parasitic transistor Q11 and the parasitic transistor Q12 is predominant over the drain current of the main transistor Q10. Therefore, with an increase in the gate-source voltage, when the parasitic transistor Q11 and the parasitic transistor Q12 reach a strong inversion region and the drain current of the weak inversion region of the main transistor Q10 which does not reach the strong inversion region exceeds the amount of current of the parasitic transistors, there occurs a hump (kink) phenomenon that the drain current Id suddenly increases.

As described above, a reverse narrow channel effect by the parasitic transistor Q11 and the parasitic transistor Q12 having a low threshold voltage occurs in the semiconductor device 10 shown in FIGS. 29 to 34. This may result in the electrical characteristics different from those expected for the main transistor Q10, thereby causing an unexpected circuit operation due to the parasitic transistor Q11 and the parasitic transistor Q12.

Next, another configuration of the semiconductor device in the related art will be described. FIG. 35 is a schematic plan view illustrating another configuration of the semiconductor device in the related art. FIG. 36 is a schematic sectional view taken along line C-C of the semiconductor device 20 of FIG. 35. FIG. 37 is a schematic sectional view taken along line D-D of the semiconductor device 20 of FIG. 35. FIG. 38 is a perspective sectional view taken along line E-E of the semiconductor device 20 of FIG. 35. FIG. 39 is a schematic plan view illustrating a main transistor and a parasitic transistor of the semiconductor device 20 of FIG. 35. FIG. 40 is a circuit diagram illustrating a relationship between the main transistor and the parasitic transistor of the semiconductor device 20 of FIG. 35.

Hereinafter, another configuration of the semiconductor device having a STI structure in the related art will be described with reference to the drawings. In FIGS. 35 to 39, as indicated by arrows X, Y and Z, three mutually orthogonal directions are defined as X, Y and Z directions, respectively. Throughout these figures, elements and parts or portions having the same functions are denoted by the same reference numerals or symbols and an explanation of which will not be repeated for the purpose of brevity and clarity.

As illustrated in FIG. 35, the semiconductor device 20 includes a transistor 20a and a transistor 20b. The transistor 20a includes a source region 22a, a drain region 23a, a gate electrode 24a, a semiconductor region 25 and a gate insulating film 26a. Like the transistor 20a, the transistor 20b includes a source region 22b, a drain region 23b, a gate electrode 24b, a semiconductor region 25 and a gate insulating film 26b. The transistor 20a and the transistor 20b have a symmetrical structure with line E-E in the Y direction as an axis.

The semiconductor region 25 is a region on which the source region 22a, the drain region 23a, the source region 22b and the drain region 23b are formed and also a region which is surrounded by an element isolation region 21. In a case of forming an NMOS transistor, the semiconductor region 25 is formed of the same P-type region as a silicon substrate.

The drain region 23a and the drain region 23b are formed adjacent to each other in a substantially rectangular shape on a main surface of the semiconductor region 25. The drain region 23a and the drain region 23b are electrically connected in common. A long side of each of the drain region 23a and the drain region 23b extends in the Y direction, that is, the direction of a channel width W3 and a channel width W4 and a short side thereof extends in the X direction, that is, the direction of a channel length L2a and a channel length L2b. An end portion of each of the drain region 23a and the drain region 23b in the Y direction is in contact with the element isolation region 21.

The source region 22a is formed in a substantially rectangular shape on the main surface of the semiconductor region 25 at a predetermined interval in the X direction with respect to the drain region 23a. Along side of the source region 22a extends in the Y direction and a short side thereof extends in the X direction. The source region 22b is formed in a substantially rectangular shape at a predetermined interval in the X direction with respect to the drain region 23a. A long side of the source region 22b extends in the Y direction and a short side thereof extends in the X direction. An end portion of each of the source region 22a and the source region 22b in the Y and X directions is in contact with the element isolation region 21.

The channel width W3 of the source region 22a in the Y direction and the channel width W4 of the drain region 23a in the Y direction are equal to each other. The channel width W3 of the source region 22b in the Y direction and the channel width W4 of the drain region 23b in the Y direction are also equal to each other. The channel length L2a from the end portion of the source region 22a in the X direction to the end portion of the drain region 23a in the X direction is equal to the channel length L2b from the end portion of the source region 22b in the X direction to the end portion of the drain region 23b in the X direction.

The element isolation region 21 is formed on the main surface of the semiconductor region 25 and inside the semiconductor region 25 so as to surround the source region 22a, the drain region 23a, the source region 22b and the drain region 23b.

The gate insulating film 26a is formed in a substantially rectangular shape on an upper portion of the semiconductor region 25a between the source region 22a and the drain region 23a. Both end portions of the gate insulating film 26a in the Y direction are connected to the element isolation region 21. One end portion of the gate insulating film 26a in the X direction substantially overlaps the source region 22a. The other end portion of the gate insulating film 26a in the X direction substantially overlaps the drain region 23a.

The gate insulating film 26b is formed in a substantially rectangular shape on an upper portion of the semiconductor region 25b between the source region 22b and the drain region 23b. Both end portions of the gate insulating film 26b in the Y direction are connected to the element isolation region 21. One end portion of the gate insulating film 26b in the X direction substantially overlaps the source region 22b. The other end portion of the gate insulating film 26b in the X direction substantially overlaps the drain region 23b.

The gate electrode 24a is formed in a substantially rectangular shape so as to overlap the gate insulating film 26a. A long side of the gate electrode 24a extends in the Y direction and a short side thereof extends in the X direction. The gate electrode 24b is formed in a substantially rectangular shape so as to overlap the gate insulating film 26b. A long side of the gate electrode 24b extends in the Y direction and a short side thereof extends in the X direction.

FIG. 36 is a schematic sectional view taken along line C-C of the semiconductor device 20 of FIG. 35. As shown in FIG. 36, the semiconductor region 25 is formed on a main surface of a semiconductor substrate 27. In FIG. 36, the semiconductor region 25 and the semiconductor substrate 27 may be of the same conductivity type or of different conductivity types. Each of the source region 22a, the drain region 23a, the source region 22b, the drain region 23b and the element isolation region 21 has a certain depth from the main surface of the semiconductor region 25 in the Z direction. For example, the element isolation region 21 is formed to be deeper than the source region 22a, the drain region 23a, the source region 22b and the drain region 23b. A channel region ch is formed in the semiconductor region 25 between the source region 22a and the drain region 23a, and between the source region 22b and the drain region 23b.

FIG. 37 is a schematic sectional view taken along line D-D of the semiconductor device 20 of FIG. 35. FIG. 37 is a sectional view of a boundary portion between the element isolation region 21, the source region 22a, the drain region 23a, the source region 22b and the drain region 23b in FIG. 35. Therefore, the thickness of the gate insulating film 26a shown in FIG. 37 is smaller than the thickness of the gate insulating film 26a shown in FIG. 36. In this way, a parasitic transistor Q21a and a parasitic transistor Q22a shown in FIGS. 39 and 40 to be described below are formed in a portion ox where the thickness of the gate insulating film 26a is small. In addition, the thickness of the gate insulating film 26b is smaller than the thickness of the gate insulating film 26b shown in FIG. 36. In this way, a parasitic transistor Q21b and a parasitic transistor Q22b shown in FIGS. 39 and 40 to be described below are formed in a portion ox where the thickness of the gate insulating film 26b is small. When the thicknesses of the gate insulating film 26a and the gate insulating film 26b become small, threshold voltages of the gate insulating film 26a and the gate insulating film 26b are accordingly lowered.

FIG. 38 is a perspective sectional view taken along line E-E of the semiconductor device 20 of FIG. 35, showing the transistor 20a. As shown in FIG. 38, the transistor 20a includes the source region 22a, the drain region 23a, the gate electrode 24a, the gate insulating film 26a and the semiconductor region 25. An end portion of the drain region 23a in the X direction is in contact with the element isolation region 21. The configuration that the end portion of the drain region is in contact with an element region is the same as, e.g., one example of the related art shown in FIG. 32. In addition, although a relationship in boundary portion between the source region 22a and the element isolation region 21 in the respect of a section is not shown in FIG. 38, an end portion of the source region 22a is in contact with the element isolation region 21.

FIG. 39 is a schematic plan view showing a relationship between a main transistor and a parasitic transistor of the semiconductor device 20 of FIG. 35. As shown in FIG. 39, the transistor 20a includes a main transistor Q20a, a parasitic transistor Q21a and a parasitic transistor Q22a. The transistor 20b includes a main transistor Q20b, a parasitic transistor Q21b and a parasitic transistor Q22b. The parasitic transistor Q21a and the parasitic transistor Q22a are formed at the boundary portion between the channel region ch and the element isolation region 21 in the Y direction of the transistor 20a, that is, the direction of the channel width W3 and the channel width W4. The main transistor Q20a is formed between the parasitic transistor Q21a and the parasitic transistor Q22a. The parasitic transistor Q21b and the parasitic transistor Q22b are formed at the boundary portion between the channel region ch and the element isolation region 21 in the Y direction of the transistor 20b. The main transistor Q20b is formed in the channel region ch in the semiconductor region 25 where the parasitic transistor Q21b and the parasitic transistor Q22b are not formed. In the semiconductor device 20, it is not possible to clearly delineate a boundary between the main transistors Q20a and Q20b and the parasitic transistors Q21a, Q22a, Q21b and Q22b. However, in the specification, for convenience of explanation, they are distinguished from each other in this way. The number of parasitic transistors is not limited to four but may be fewer or more.

FIG. 40 is a schematic equivalent circuit diagram of the semiconductor device 20 of FIG. 39. The sources, the drains and the gates of the parasitic transistor Q21a and the parasitic transistor Q22a are connected to the source, the drain and the gate of the main transistor Q20a, respectively. That is, the main transistor Q20a, the parasitic transistor Q21a and the parasitic transistor Q22a are connected in parallel. The sources and the gates of the main transistor Q20a, the parasitic transistor Q21a and the parasitic transistor Q22a form a common source S and a common gate G, respectively.

In addition, the sources, the drains and the gates of the parasitic transistor Q21b and the parasitic transistor Q22b are connected to the source, the drain and the gate of the main transistor Q20b, respectively. That is, the main transistor Q20b, the parasitic transistor Q21b and the parasitic transistor Q22b are connected in parallel. The sources and the gates of the main transistor Q20b, the parasitic transistor Q21b and the parasitic transistor Q22b form a common source S and a common gate G, respectively.

Further, the drain of the main transistor Q20a and the drain of the main transistor Q20b are interconnected. That is, the drains of the main transistor Q20a, the parasitic transistor Q21a, the parasitic transistor Q22a, the drain of the main transistor Q20b, the parasitic transistor Q21b and the parasitic transistor Q22b form a common drain D. The semiconductor device 20 is constituted by the common source S, the common drain D and the common gate G.

The gate thickness t20a of the main transistor Q20a is larger than the gate thickness t21a of the parasitic transistor Q21a and the gate thickness t22a of the parasitic transistor Q22a (t20a>t21a (t22a)). In this case, within a certain range of a gate width of the main transistor Q20a, threshold voltages of the parasitic transistor Q21a and the parasitic transistor Q22a may be lower than a threshold voltage of the main transistor Q20a. In addition, unlike the gate thickness t20a of the main transistor Q20a, it is difficult to limit the gate thickness t21a of the parasitic transistor Q21a and the gate thickness t22a of the parasitic transistor Q22a to a certain range in manufacture. The thicknesses thereof are denoted by ox in FIG. 31.

The gate thickness t20b of the main transistor Q20b is larger than the gate thickness t21b of the parasitic transistor Q21b and the gate thickness t22b of the parasitic transistor Q22b (t20b>t21b (t22b)). In this case, within a certain range of a gate width of the main transistor Q20b, threshold voltages of the parasitic transistor Q21b and the parasitic transistor Q22b may be lower than a threshold voltage of the main transistor Q20b. In addition, unlike the gate thickness t20b of the main transistor Q20b, it is difficult to limit the gate thickness t21b of the parasitic transistor Q21b and the gate thickness t22b of the parasitic transistor Q22b to a certain range in manufacture. The thicknesses thereof are denoted by ox in FIG. 31.

Channel surface potentials of the parasitic transistor Q21a and the parasitic transistor Q22a are different from a channel surface potential of the main transistor Q20a. Since gate insulating films of the parasitic transistor Q21a and the parasitic transistor Q22a are often made thin, thereby providing a low threshold voltage, a drain current (Id) flows in a state where a gate-source voltage (Vgs) is low. A drain current of the main transistor Q20a in a sub-threshold region may be smaller than the drain current of the parasitic transistor Q21a and the parasitic transistor Q22a. A desired circuit operation obtained by controlling the drain current of the sub-threshold region of the main transistor Q20a may be inhibited by the drain current of the parasitic transistor Q21a and the parasitic transistor Q22a.

Channel surface potentials of the parasitic transistor Q21b and the parasitic transistor Q22b are different from a channel surface potential of the main transistor Q20b. Since gate insulating films of the parasitic transistor Q21b and the parasitic transistor Q22b are often made thin, thereby providing a low threshold voltage, a drain current (Id) flows in a state where a gate-source voltage (Vgs) is low. A drain current of the main transistor Q20b in a sub-threshold region may be smaller than the drain current of the parasitic transistor Q21b and the parasitic transistor Q22b. A desired circuit operation obtained by controlling the drain current of the sub-threshold region of the main transistor Q20b may be inhibited by the drain current of the parasitic transistor Q21b and the parasitic transistor Q22b.

As described above, since the semiconductor device 20 shown in FIGS. 35 to 40 includes the parasitic transistor Q21a, the parasitic transistor Q22a, the parasitic transistor Q21b and the parasitic transistor Q22b, a reverse narrow channel effect and a hump (kink) phenomenon occur in the semiconductor device 20. This may result in the electrical characteristics different from those expected for the main transistor Q20a and the main transistor Q20b, thereby causing an unexpected circuit operation due to the parasitic transistor Q21a, the parasitic transistor Q22a, the parasitic transistor Q21b and the parasitic transistor Q22b.

A variety of measures has been adopted to solve the above problems.

In the semiconductor devices disclosed in the related art, a silicon oxide film ($SiO_2$ film) filling an element isolation trench constituting the STI structure is formed so as to extend outside the element isolation trench on a substrate surface and project slightly upward from the substrate surface. Thus, even when a gate electrode extends over the $SiO_2$ film, no electric field concentration occurs in the substrate, thereby avoiding a problem of a variation in a threshold voltage.

In the semiconductor devices disclosed in the related art, by making a difference in shape between an NMOSFET (N-channel Metal Oxide Semiconductor Field Effect Transistor) and a PMOSFET (P-channel Metal Oxide Semiconductor Field Effect Transistor), a balance with a lateral distribution of channel impurities occurred by a thermal process is kept to prevent a threshold voltage near the top portion of an element isolation trench from differing from a threshold voltage near a gate electrode central portion. This makes it possible to suppress a reverse narrow channel effect which occurs when the element isolation trench is formed, and a reverse channel effect of PMOS at once. Further, this makes it possible to prevent a hump (link) phenomenon from occurring in a sub-threshold region.

In the semiconductor devices disclosed in the related art, since an inclination of a trench side wall located in a channel corner portion covered with a gate electrode of a transistor is made smooth, it is possible to mitigate a concentration of an electric field from the gate electrode and prevent lowering of a threshold voltage of a channel corner portion of a transistor peculiar to an STI structure.

In the semiconductor devices disclosed in the related art, a channel edge portion below a gate of a MOS transistor is out of a region into which high concentration impurity ions used to form a source-drain region are implanted. Since the channel edge portion exists out of an operation region of the MOS transistor, no hump (kink) phenomenon occurs.

In the semiconductor devices disclosed in the related art, an element formation region or a gate electrode is shaped such that an effective resistance is higher near a boundary between the element formation region and an element isolation region than at the channel center. This reduces an effect of a channel portion having a low threshold value on a drain current.

In the semiconductor devices disclosed in the related art, since a SiO$_2$ film is formed to slightly project upward from a substrate surface, it makes a process of manufacturing a semiconductor device more complicated while increasing the number of processes of manufacturing the semiconductor device.

In the semiconductor devices disclosed in the related art, since a balance with a lateral distribution of channel impurities is kept by making a difference in shape between an NMOS and a PMOS to prevent a threshold voltage near the top portion of an element isolation trench from differing from a threshold voltage near a gate electrode central portion, it makes a process of manufacturing a semiconductor device more complicated while increasing the number of processes of manufacturing the semiconductor device.

In the semiconductor devices disclosed in the related art, since there is a need to smoothen an inclination of a trench side wall located in a channel corner portion covered with a gate electrode of a transistor, it makes a process of manufacturing a semiconductor device more complicated while increasing the number of processes of manufacturing the semiconductor device.

In the semiconductor devices disclosed in the related art, an active region other than a high concentration impurity ion implantation region is exposed. Therefore, the exposed active region may be field-inverted due to an effect by other electric fields, which may cause a hump (kink) phenomenon.

In the semiconductor devices disclosed in the related art, an element formation region or a gate electrode is shaped such that an effective resistance is higher near a boundary between the element formation region and an element isolation region than at the channel center. In this case, it is necessary to adjust the shape of the element formation region or the gate electrode, which makes a process of manufacturing a semiconductor device more complicated while increasing the number of processes of manufacturing the semiconductor device.

In the above-described semiconductor devices disclosed in the related art, measures to suppress the reverse narrow channel effect and the hump (kink) phenomenon have been taken. However, these measures have a problem in that these make a process of manufacturing a semiconductor device more complicated in some aspects.

SUMMARY

The present disclosure provides some embodiments of a semiconductor device and a semiconductor integrated circuit using the same, which are capable of solving the above problems.

According to one embodiment of the present disclosure, there is provided a semiconductor device including: a channel region of a first conductivity type; a gate insulating film formed on the channel region; a gate electrode formed on the gate insulating film; a first region of a second conductivity type and a second region of the second conductivity type, which are formed along the gate electrode while facing each other with the gate electrode interposed between the first region and the second region; a semiconductor region of the second conductivity type on which the first region, the second region and the channel region are formed; and an element isolation region which surrounds the semiconductor region. The gate electrode extends beyond a boundary portion between the channel region and the element isolation region, and a width of the first region is smaller than a width of the second region in a channel width direction of the first region and the second region.

In one embodiment, both ends of the first region may be located more inside than both ends of the second region in the channel width direction, and the both ends of the first region may be located more inside than both ends of the gate insulating film in the channel width direction.

According to another embodiment of the present disclosure, there is provided a semiconductor device including: a first region of a first conductivity type; a second region of the first conductivity type and a third region of the first conductivity type with the first region interposed between the second region and the third region; a first channel region of a second conductivity type formed between the first region and the second region; a second channel region of the second conductivity type formed between the first region and the third region; a first gate insulating film formed on the first channel region; a first gate electrode formed on the first gate insulating film; a second gate insulating film formed on the second channel region; a second gate electrode formed on the second gate insulating film; a semiconductor region of the second conductivity type on which the first region, the second region, the third region, the first channel region and the second channel region are formed; and an element isolation region which surrounds the semiconductor region. The first gate electrode extends beyond a first boundary portion between the first channel region and the element isolation region. The second gate electrode extends beyond a second boundary portion between the second channel region and the element isolation region. A width of the first region is smaller than widths of the second region and the third region in a channel width direction of the first region, the second region and the third region.

In one embodiment, both ends of the first region may be located more inside than both ends of the second region and both ends of the third region in the channel width direction, and a first end of the first region may be located between both ends of the first gate insulating film and a second end of the first region is located between both ends of the second gate insulating film in a channel length direction of the first region, the second region and the third region.

In one embodiment, the semiconductor device further includes a third gate insulating film and a fourth gate insulating film formed on the semiconductor region between the element isolation region and the first region. The semiconductor device further includes a third gate electrode and a fourth gate electrode formed on the third gate insulating film and the fourth gate insulating film, respectively. The first gate insulating film, the second gate insulating film, the third gate insulating film and the fourth gate insulating film may be integrated, and the first gate electrode, the second gate electrode, the third gate electrode and the fourth gate electrode may be integrated.

According to another embodiment of the present disclosure, there is provided a semiconductor integrated circuit including at least one transistor corresponding to the above-described semiconductor device.

In one embodiment, the semiconductor integrated circuit may include a differential transistor pair including at least two transistors, each of the at least two transistors corresponding to the above-described semiconductor device, and the at least two transistors are common source coupled or common drain coupled.

In one embodiment, the at least two transistors may be operated in a weak inversion region (sub-threshold region) of a MOS transistor operation region.

In one embodiment, the at least two transistors may be operated in a strong inversion region of a MOS transistor operation region.

In one embodiment, the at least two transistors may be operated in an unsaturated region of a MOS transistor operation region.

In one embodiment, the at least two transistors may be configured as at least one selected from a group consisting of a differential amplifier, a cascode circuit, a current mirror circuit, a comparator and an operational amplifier.

In one embodiment, the at least one transistor may be configured as a MOS-type circuit formed on a single semiconductor substrate.

In one embodiment, the MOS-type circuit may be a CMOS inverter. The at least one transistor may include a substrate electrode connected to a predetermined potential such that a substrate bias effect occurs in the at least one transistor.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
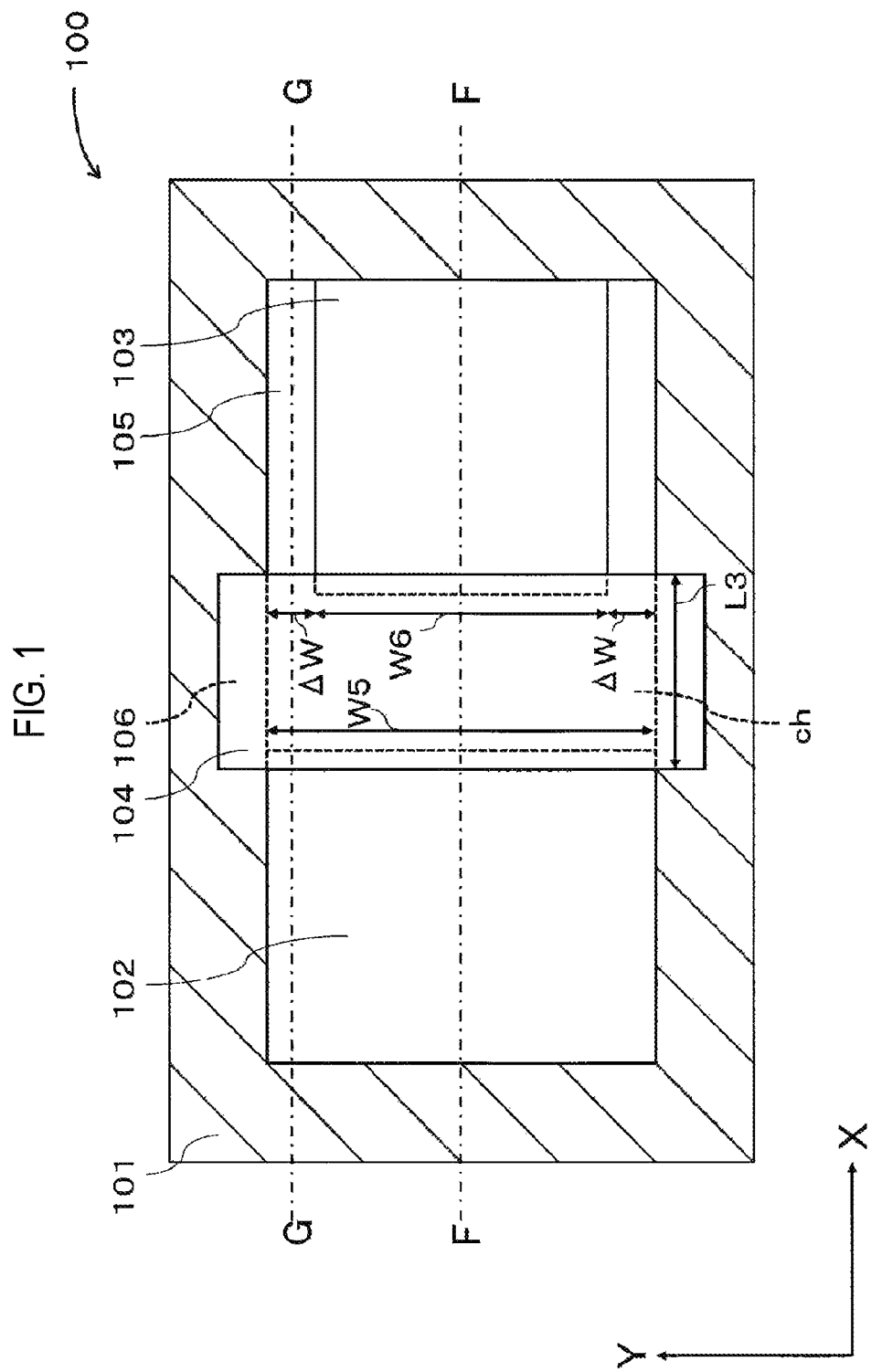
FIG. 1 is a schematic plan view illustrating the configuration of a semiconductor device according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Throughout the entire drawings serving to explain the following embodiments, elements and parts or portions having the same functions are denoted by the same reference numerals or symbols and explanation of which will not be repeated for the purpose of brevity and clarity. In addition, In FIGS. 1 to 4, FIGS. 6 to 10 and FIGS. 12 to 16, as indicated by arrows X, Y and Z, three mutually orthogonal directions are defined as X, Y and Z directions, respectively.

First Embodiment

Figure 2:
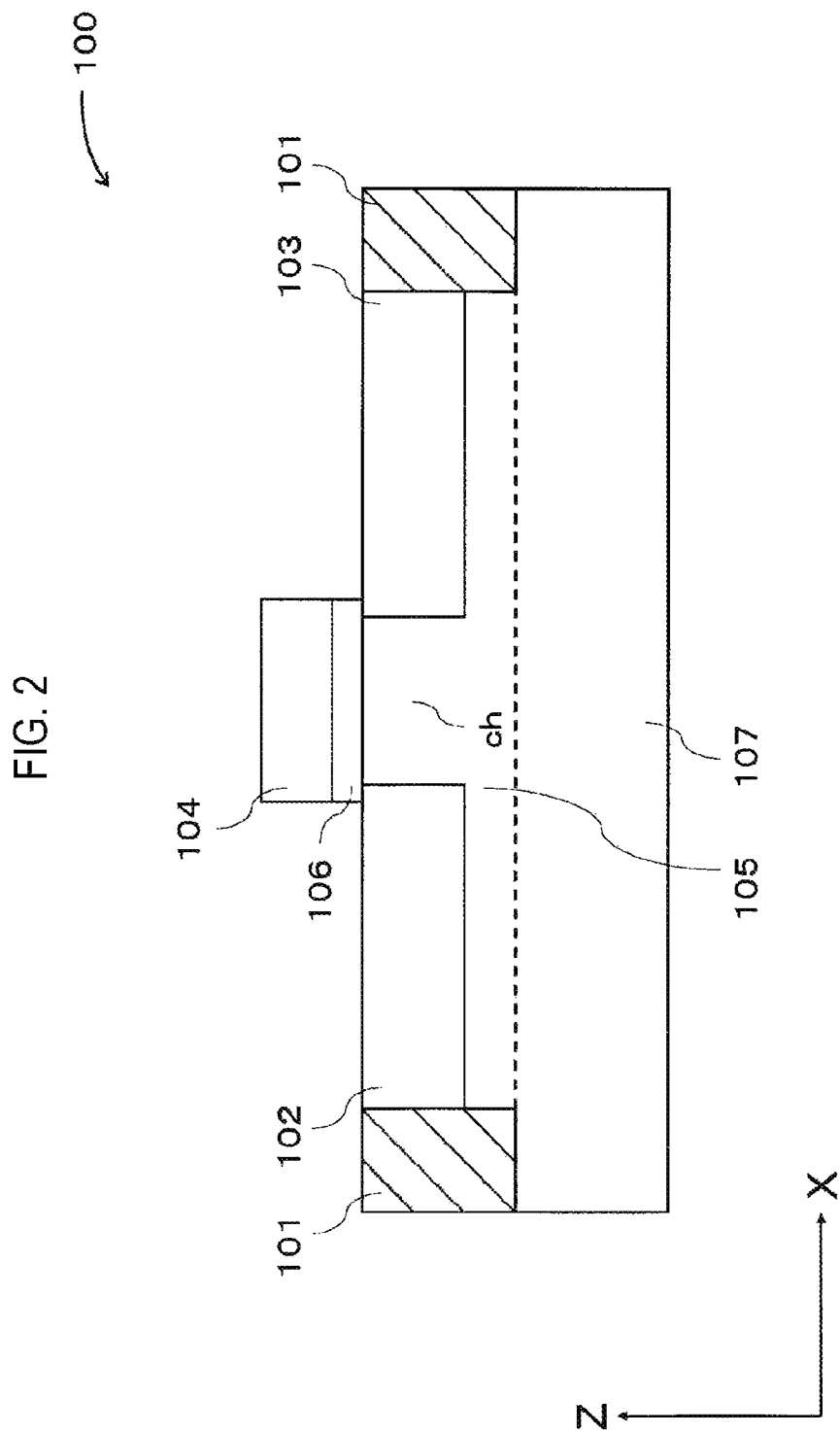
FIG. 2 is a schematic sectional view taken along line F-F of the semiconductor device according to the first embodiment of the present disclosure.
Figure 3:
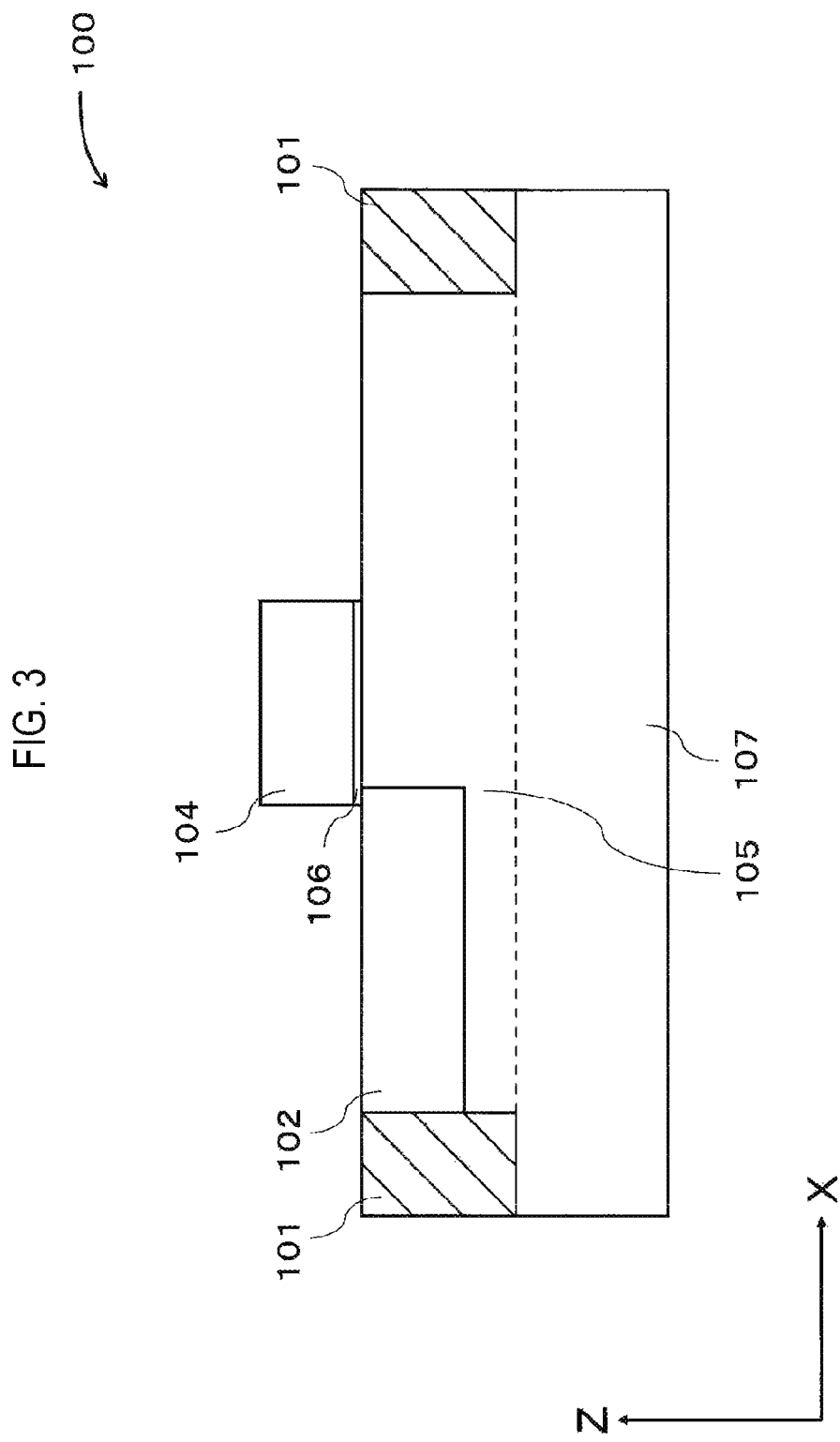
FIG. 3 is a schematic sectional view taken along line G-G of the semiconductor device according to the first embodiment of the present disclosure.
Figure 4:
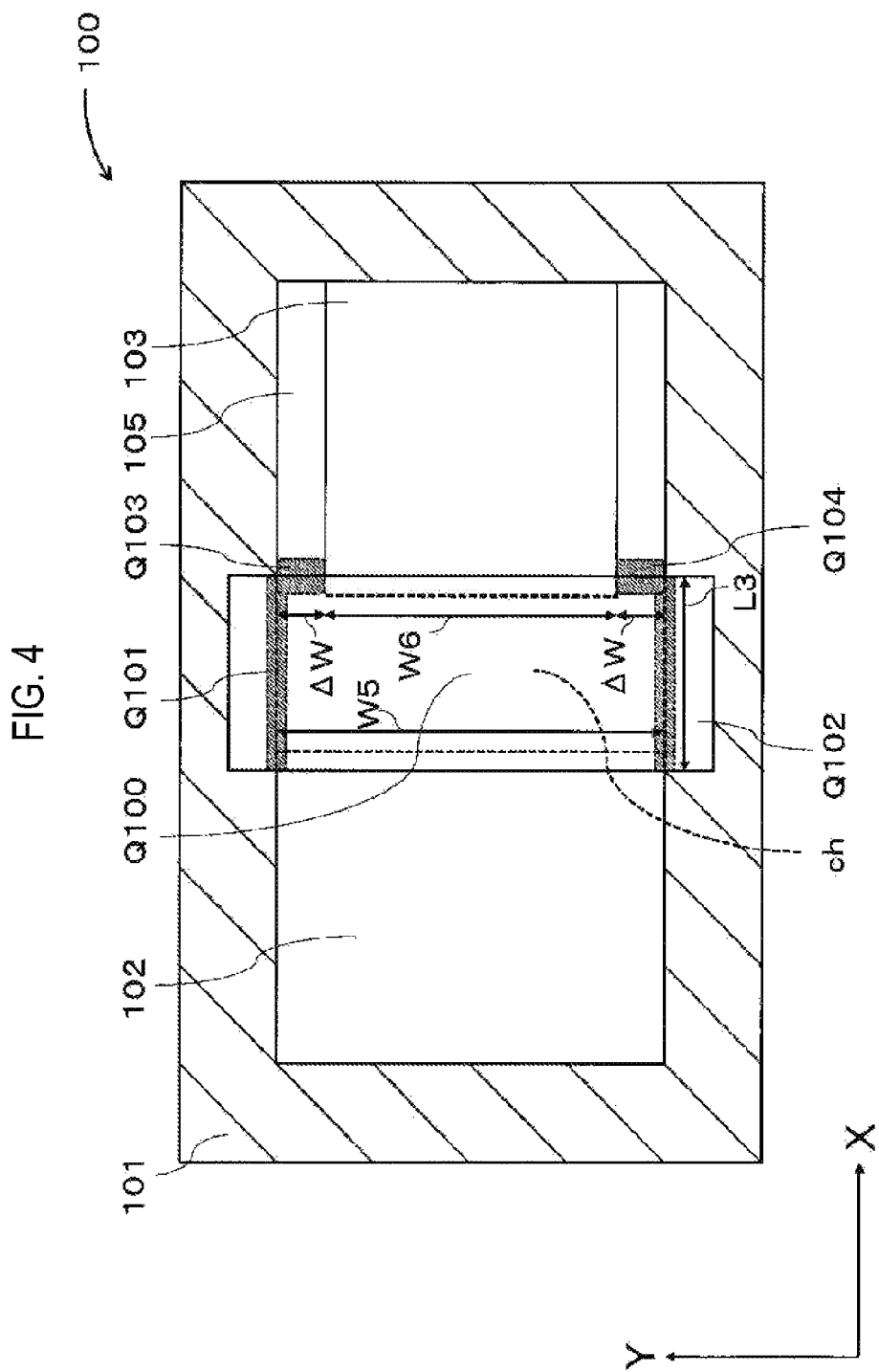
FIG. 4 is a schematic plan view illustrating a relationship between a main transistor and a parasitic transistor of the semiconductor device according to the first embodiment of the present disclosure.
Figure 5:
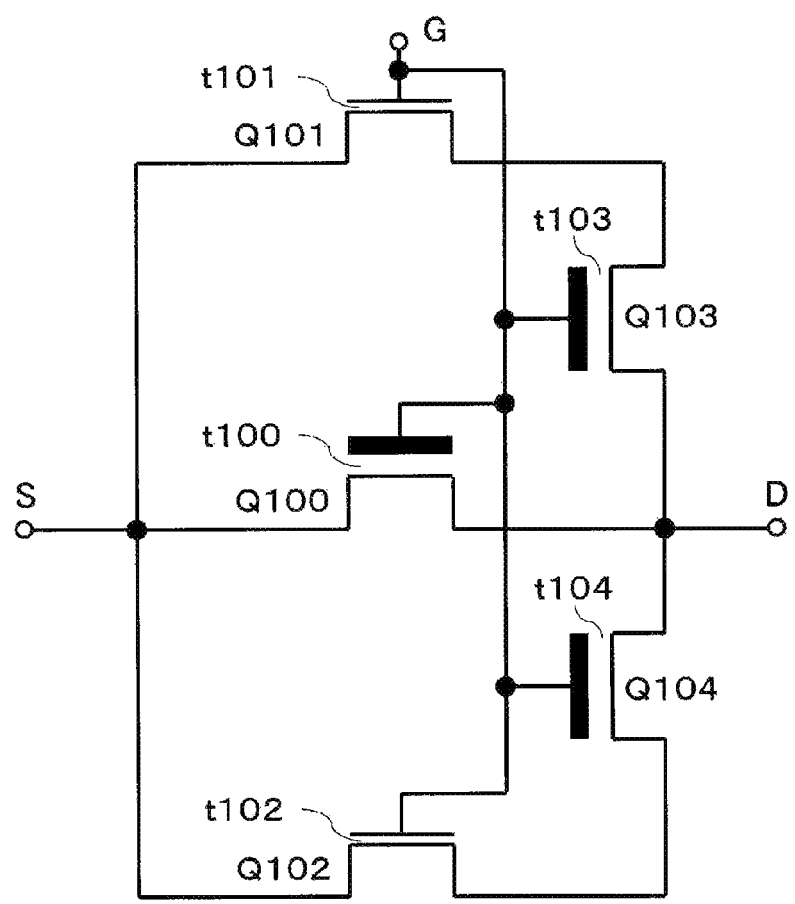
FIG. 5 is a circuit diagram illustrating the relationship between the main transistor and the parasitic transistor of the semiconductor device according to the first embodiment of the present disclosure.

A first embodiment of the present disclosure will now be described with reference to the drawings. FIG. 1 is a schematic plan view illustrating the configuration of a semiconductor device 100 according to a first embodiment of the present disclosure. FIG. 2 is a schematic sectional view taken along line F-F of the semiconductor device 100 of FIG. 1. FIG. 3 is a schematic sectional view taken along line G-G of the semiconductor device 100 of FIG. 1. FIG. 4 is a schematic plan view illustrating a main transistor and a parasitic transistor of the semiconductor device 100 of FIG. 1. FIG. 5 is a circuit diagram illustrating a relationship between the main transistor and the parasitic transistor of the semiconductor device 100 of FIG. 1.

As illustrated in FIG. 1, the semiconductor device 100 forms a transistor including a source region 102, a drain region 103, a gate electrode 104, a gate insulating film 106 and a semiconductor region 105. The semiconductor device 100 is formed from, e.g., a Si (silicon) semiconductor, a SiC (silicon carbide) semiconductor, a SiGe (silicon germanium) semiconductor, a GaN (gallium nitride) semiconductor, etc.

The semiconductor region 105 is a region on which the source region 102 and the drain region 103 are formed and also a region which is surrounded by an element isolation region 101. In a case of forming an NMOS transistor, the semiconductor region 105 is formed of, e.g., the same P-type region as a silicon substrate. When the element isolation region 101 is formed, the semiconductor region 105 is uniquely defined.

The drain region 103 is formed in a substantially rectangular shape on a main surface of the semiconductor region 105 at an interval of a channel width ΔW from the element isolation region 101 in the Y direction. A long side of the drain region 103 extends in the direction, that is, the direction of a channel width W5 and a channel width W6 and a short side thereof extends in the X direction, that is, the direction of a channel length L3. An end portion of the drain region 103 in the X direction is in contact with the element isolation region 101, whereas an end portion of the drain region 103 in the Y direction is in no contact with the element isolation region 101. In addition, the end portion of the drain region 103 need not be in contact with the element isolation region 101 and a portion of the semiconductor region 105 may be interposed between the drain region 103 and the element isolation region 101. Further, in a case where the end portion of the drain region 103 is in contact with the element isolation region 101, the element isolation region 101 is not necessarily an insulating film but may be, e.g., a P-type or N-type well region.

The source region 102 is formed in a substantially rectangular shape on the main surface of the semiconductor region 105 at a certain interval in the X direction with respect to the drain region 103. A long side of the source region 102 extends in the Y direction and a short side thereof extends in the X direction. An end portion of the source region 102 in the Y and X directions is in contact with the element isolation region 101. However, an end portion of the source region 102 in the X direction may not be in contact with the element isolation region 101.

The source region 102 and the drain region 103 are formed of a conductivity type (e.g., N-type) opposite to that of the silicon substrate and are formed along the gate electrode 104 while facing each other with the gate electrode 104 interposed between the source region 102 and the drain region 103. In addition, the source region 102 and the drain region 103 are not limited to the rectangular shape but may be square, circular, elliptical or the like.

Although it is shown in FIG. 1 that the long sides (indicated by a broken line) of the source region 102 and the drain region 103 enter the inside of the gate electrode 104, the present disclosure is not limited thereto. For example, an end portion of the gate electrode 104 may overlap with the long sides of the source region 102 and the drain region 103. In addition, the long sides of the source region 102 and the drain region 103 may be disposed slightly outward from the gate electrode 104. The above-mentioned allowable conditions are equally applied to second and third embodiments to be described later, as well as the first embodiment.

The channel width W6 of the drain region 103 in the Y direction is smaller than the channel width W5 of the source region 102 in the Y direction. That is, both ends of the drain region 103 in the direction of the channel width W6 are located to be closer to the central portion of the channel region ch, i.e., more inside the channel region ch, than both ends of the source region 102 in the direction of the channel width W5. The channel region ch is formed of, e.g., the same P-type region as the silicon substrate. In the specification, when a first conductivity type is a P-type, a second conductivity type is an N-type. However, the present disclosure is not limited thereto. For example, when the first conductivity type is an N-type, the second conductivity type may be a P-type.

The element isolation region 101 is formed on the main surface of the semiconductor region 105 and inside the semiconductor region 105 so as to surround the source region 102 and the drain region 103. The element isolation region 101 is composed of, STI, DTI or LOCOS (Local Oxidation of Silicon). Specifically, the element isolation region 101 is filled with silicon dioxide ($SiO_2$). In addition, the entire element isolation region 101 may be composed of STI or DTI. However, the present disclosure is not limited thereto. For example, a portion of the element isolation region 101 may be formed in a P-type or N-type well region. In addition, the element isolation region 101 need not completely surround the source region 102 and the drain region 103.

The gate insulating film 106 is formed in a substantially rectangular shape on an upper portion of the semiconductor region 105 between the source region 102 and the drain region 103. Both end portions of the gate insulating film 106 in the Y direction are connected to the element isolation region 101. One end portion of the gate insulating film 106 in the X direction substantially overlaps the source region 102. The other end portion of the gate insulating film 106 in the X direction substantially overlaps the drain region 103.

In addition, the shape of the gate insulating film 106, the source region 102, the drain region 103 and the element isolation region 101 is not limited to the rectangular shape. In typical, in a design of this type of semiconductor device, the size and the shape of the source region 102 and the drain region 103 are first determined and the shape of the element isolation region 101 and the gate insulating film 106 is then uniquely defined in accordance with the shape of the source region 102 and the drain region 103. Therefore, the shape of this gate insulating film and a variety of regions is not limited to the rectangular shape but may be, e.g., circular, semicircular, elliptical, triangular, hexagonal, octagonal or the like.

The gate electrode 104 is formed in a substantially rectangular shape so as to overlap the gate insulating film 106. Further, the gate electrode 104 extends beyond a boundary portion between the channel region ch, which is formed between the source region 102 and the drain region 103, and the element isolation region 101. The gate electrode 104 is made of, for example, metal or the like having conductivity, such as polysilicon or aluminum having conductivity; which is highly doped with P-type or N-type element material.

It is the first characteristic of the semiconductor device 100 shown in FIG. 1 that the channel width W6 of the drain region 103 is smaller than the channel width W5 of the source region 102. The second characteristic is that the end portion of the drain region 103 in the direction of the channel width W6 is in no contact with the element isolation region 101. The end portions of the drain region 103 and the source region 102 in the direction of the channel length L3 are in contact with the element isolation region 101. In addition, the element isolation region 101 may be composed of STI or DTI, or a combination of STI or DTI with a P-type or N-type well region. This configuration prevents the drain region 103 and the element isolation region 101 from being in contact in the direction of the channel width W6. In more detail, this configuration prevents parasitic transistors Q101 and Q102 (see FIG. 4) existing in the boundary between the element isolation region 101 and the channel region ch from being directly connected to the drain region 103.

It is shown in FIG. 1 that the channel width W5 of the source region 102 and the channel width W6 of the drain region 103 have a relationship of W6<W5. However, the channel width W5 may be smaller than the channel width W6. That is, the channel width W5 and the channel width W6 may have a relationship of W5<W6.

FIG. 2 is a schematic sectional view taken along line F-F of the semiconductor device 100 of FIG. 1. As shown in FIG. 2, the semiconductor region 105 is formed on a main surface of a semiconductor substrate 107. In FIG. 2, the semiconductor region 105 and the semiconductor substrate 107 may be either the same conductivity type or different conductivity types. The element isolation region 101, the source region 102 and the drain region 103 have a certain depth from the main surface of the semiconductor region 105 in the Z direction. The element isolation region 101 is formed to be deeper than the source region 102 and the drain region 103. In addition, the element isolation region 101 may be formed to be shallower than the source region 102 and the drain region 103. In addition, the channel region ch is formed in the semiconductor region 105 between the source region 102 and the drain region 103. The depth of the element isolation region 101 is, e.g., several tens nm to several hundred μm. In addition, in the specification, a well region is included in the semiconductor substrate. For example, in a case where a P well region is formed in the original semiconductor substrate and an NMOS transistor is formed in the P well region or in a case where a PMOS transistor is formed in an N well region, the P well region or the N well region falls under the category of semiconductor substrate in the specification. In addition, when the NMOS transistor is formed, the P well region may be formed in a deep N well region and the NMOS transistor may be formed in the P well region. In this case, the P well region corresponds to the semiconductor substrate 107 in the present disclosure. Therefore, under this configuration, a so-called back gate using the semiconductor substrate 107 as a gate becomes a P well region (not shown). In addition, if a deep N well region is formed broadly and an N well region is formed in the deep N well region, the N well region may be responsible to element isolation and a PMOS transistor may be formed in the N well region.

FIG. 3 is a schematic sectional view taken along line G-G of the semiconductor device 100 of FIG. 1. FIG. 3 is a sectional view of a boundary portion between the element isolation region 101 and the source region 102 and drain region 103 in FIG. 1. Therefore, the thickness of the gate insulating film 106 shown in FIG. 3 is smaller than the thickness of the gate insulating film 106 shown in FIG. 2. In this way, a parasitic transistor Q101 and a parasitic transistor Q102 shown in FIGS. 4 and 5 to be described later are formed in a portion where the thickness of the gate insulating film 106 is smaller. When the thickness of the gate insulating film 106 becomes smaller, a threshold voltage of the gate insulating film 106 is lowered. On the other hand, as shown in FIG. 1, since the width W6 of the drain region 103 is smaller than the width W5 of the source region 102, the drain region 103 is not present in a portion where the gate insulating film 106 of FIG. 3 becomes thinner.

FIG. 4 is a schematic plan view illustrating a relationship between a main transistor and a parasitic transistor of the semiconductor device 100 of FIG. 1. As shown in FIG. 4, the semiconductor device 100 includes a main transistor Q100 and parasitic transistors Q101 to Q104. The parasitic transistor Q101 and the parasitic transistor Q102 are formed in a boundary portion between the channel region ch and the element isolation region 101 in the Y direction, i.e., the direction of the channel width W5 and the channel width W6. In addition, the parasitic transistor Q103 and the parasitic transistor Q104 are formed within the channel region ch between the element isolation region 101 and the drain region 103 in the Y direction. The size of the parasitic transistor Q103 and the parasitic transistor Q104 is determined depending on the size of the channel width 4 W. In addition, the main transistor Q100 is formed in the channel region ch within the semiconductor region 105 where the main transistor Q100 is little affected by the parasitic transistors Q101 to Q104. In the semiconductor device 100, it is not possible to clearly delineate a boundary between the main transistor Q100 and the parasitic transistors Q101, Q102, Q103 and Q104. However, in the specification, for convenience of explanation, they are distinguished from each other in this way. The number of parasitic transistors is not limited to four but may be fewer or more.

FIG. 5 is a schematic equivalent circuit diagram of the semiconductor device 100 of FIG. 4. The sources and the gates of the parasitic transistors Q101 and Q102 are connected to the source and gate of the main transistor Q100, respectively. The parasitic transistor Q101 is connected to the drain of the main transistor Q100 via the parasitic transistor Q103 and the parasitic transistor Q102 is connected to the drain of the main transistor Q100 via the parasitic transistor Q104. That is, the parasitic transistor Q101 and the parasitic transistor Q103 are connected in series, the parasitic transistor Q102 and the parasitic transistor Q104 are connected in series, and these two sets of serial connections and the main transistor Q100 are connected in parallel. The sources of the main transistor Q100 and the parasitic transistors Q101 and Q102 form a common source S. The gates of the main transistor Q100 and the parasitic transistors Q101, Q102, Q103 and Q104 form a common gate G. The drains of the main transistor Q100 and the parasitic transistors Q103 and Q104 form a common drain D. The semiconductor device 100 is constituted by the common source S, the common drain D and the common gate G.

The gate thickness t100 of the main transistor Q100 is larger than the gate thickness t101 of the parasitic transistor Q101 and the gate thickness t102 of the parasitic transistor Q102 (t100>t101 (t102)). In this case, within a certain range of a gate width of the main transistor Q100, threshold voltages of the parasitic transistors Q101 and Q102 may be lower than a threshold voltage of the main transistor Q100. In addition, unlike the gate thickness t100 of the main transistor Q100, it is difficult to limit the gate thickness t101 of the parasitic transistor Q101 and the gate thickness t102 of the parasitic transistor Q102 to a certain range in manufacture. In addition, the gate thickness t103 of the parasitic transistor Q103 and the gate thickness t104 of the parasitic transistor Q104 are substantially equal to the gate thickness t100 of the main transistor Q100. Therefore, threshold voltages of the parasitic transistors Q103 and Q104 are substantially equal to the threshold voltage of the main transistor Q100.

Channel surface potentials of the parasitic transistors Q101 and Q102 are different from a channel surface potential of the main transistor Q100. On the other hand, channel surface potentials of the parasitic transistors Q103 and Q104 are substantially equal to the channel surface potential of the main transistor Q100. Since the parasitic transistors Q101 and Q102 have a low threshold voltage, in a state where a gate-source voltage (Vgs) is low, the channel surface potentials of the parasitic transistors Q101 and Q102 are inverted more easily than those of the main transistor Q100 and the parasitic transistors Q103 and Q104. Therefore, the parasitic transistors Q101 and Q102 are in a state in which a current is more likely to flow than the main transistor Q100 and the parasitic transistors Q103 and Q104. However, since the parasitic transistors Q101 and Q103 are connected in series and the parasitic transistors Q102 and Q104 are connected in series, the parasitic transistors Q103 and Q104 inhibit the current of the parasitic transistors Q101 and Q102.

As described above, the semiconductor device 100 includes the parasitic transistors Q101 and Q102. However, since the parasitic transistors Q103 and Q104 are formed between the drain region 103 and the parasitic transistor Q101 and between the drain region 103 and the parasitic transistor Q102, respectively, even when the surface potentials of the parasitic transistors Q101 and Q102 are inverted at the gate-source voltage (Vgs), the surface potentials of the parasitic transistors Q103 and Q104 are not inverted at the gate-source voltage (Vgs) more easily than those of the parasitic transistors Q101 and Q102. Therefore, no reverse channel effect occurs and no hump (kink) phenomenon occurs accordingly. Thereby, a transistor is not conducted at a gate voltage lower than a desired surface potential, which contributes to a reduction in a leak current of an off state. In addition, since the channel width W6 of the drain region 103 need only be shorter than the channel width W5 of the source region 102, what to change is only a mask layout, which eliminates the complexity of a manufacturing process without increasing the number of manufacturing processes.

Second Embodiment

Figure 6:
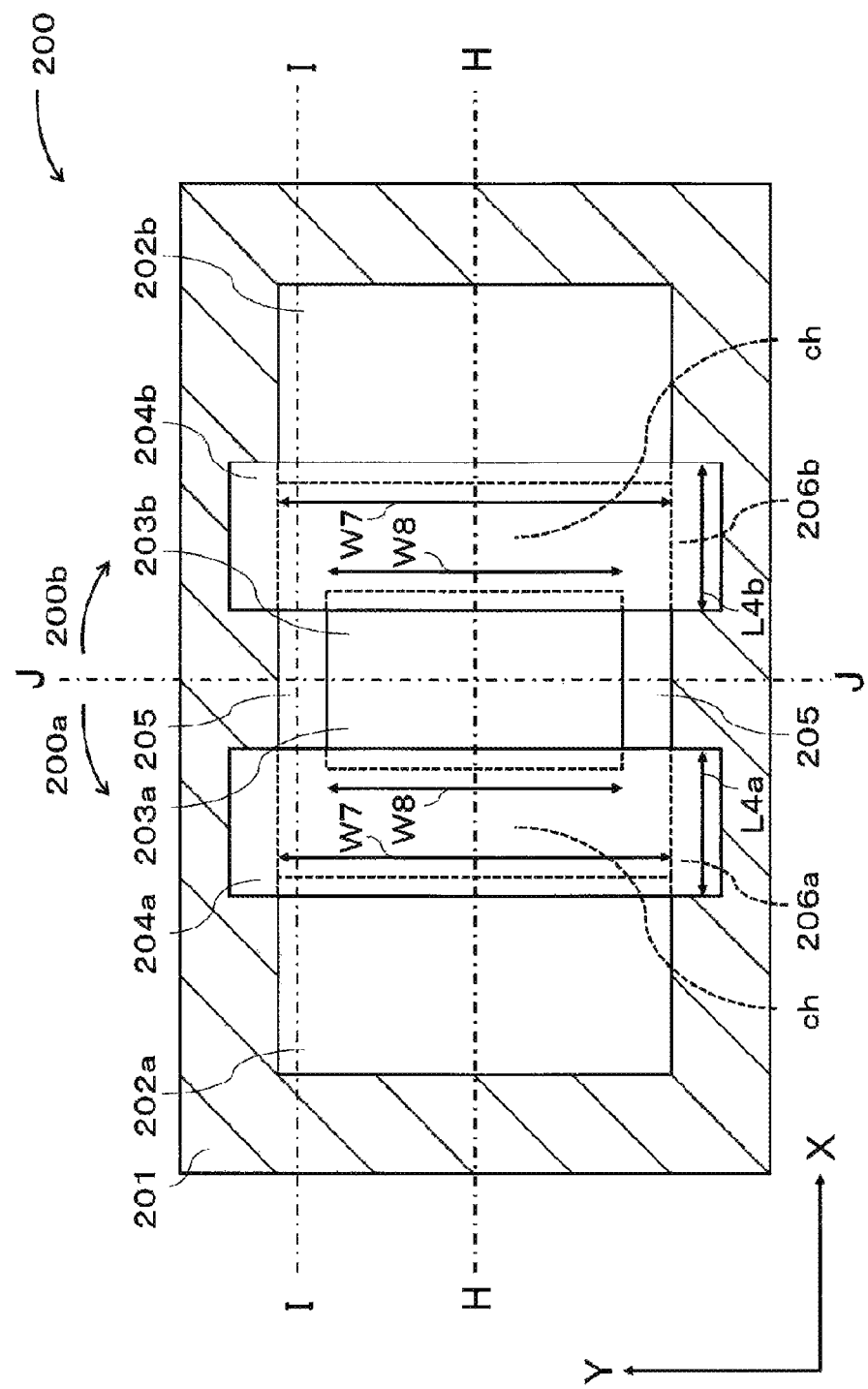
FIG. 6 is a schematic plan view illustrating the configuration of a semiconductor device according to a second embodiment of the present disclosure.
Figure 7:
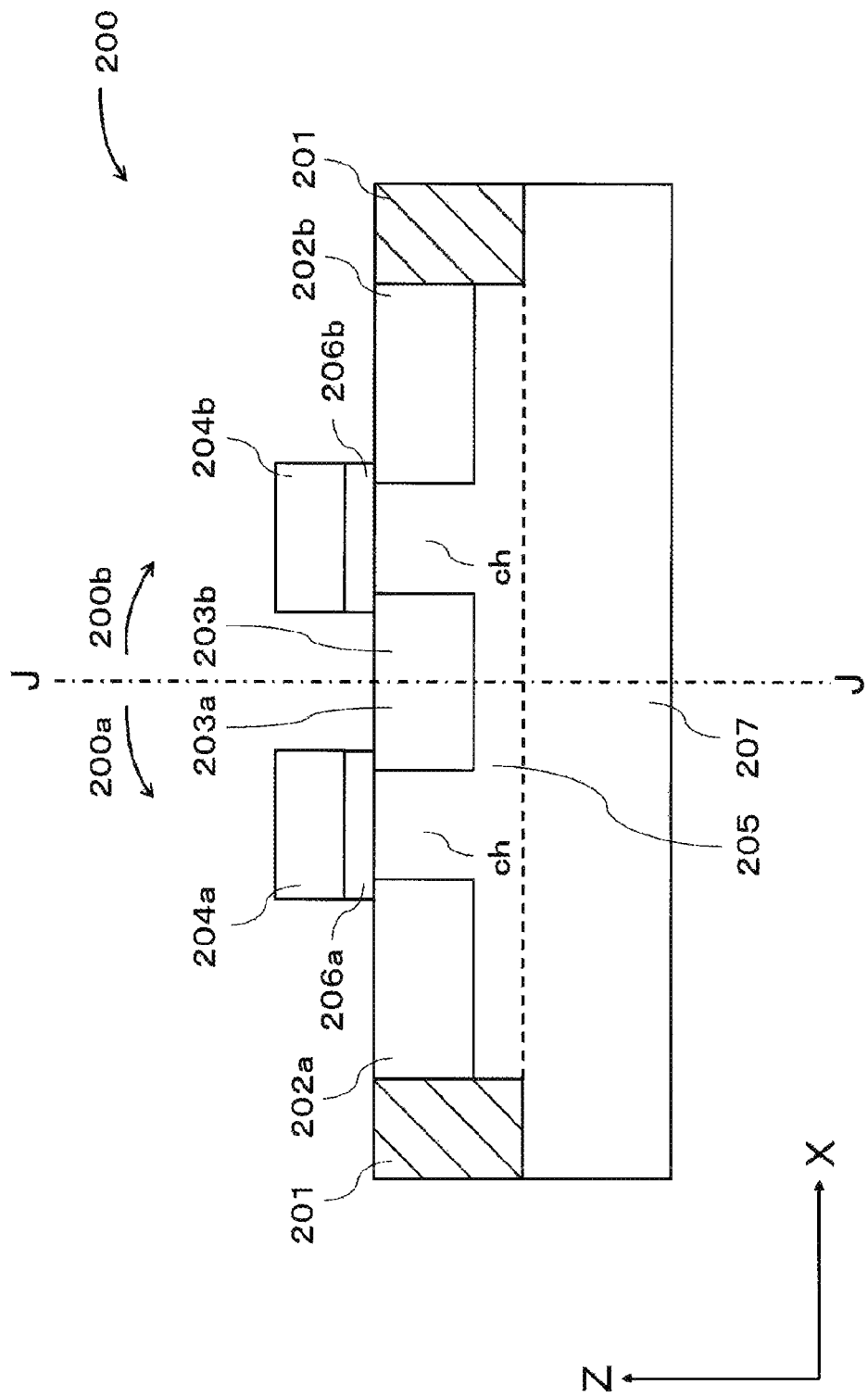
FIG. 7 is a schematic sectional view taken along line H-H of the semiconductor device according to the second embodiment of the present disclosure.
Figure 8:
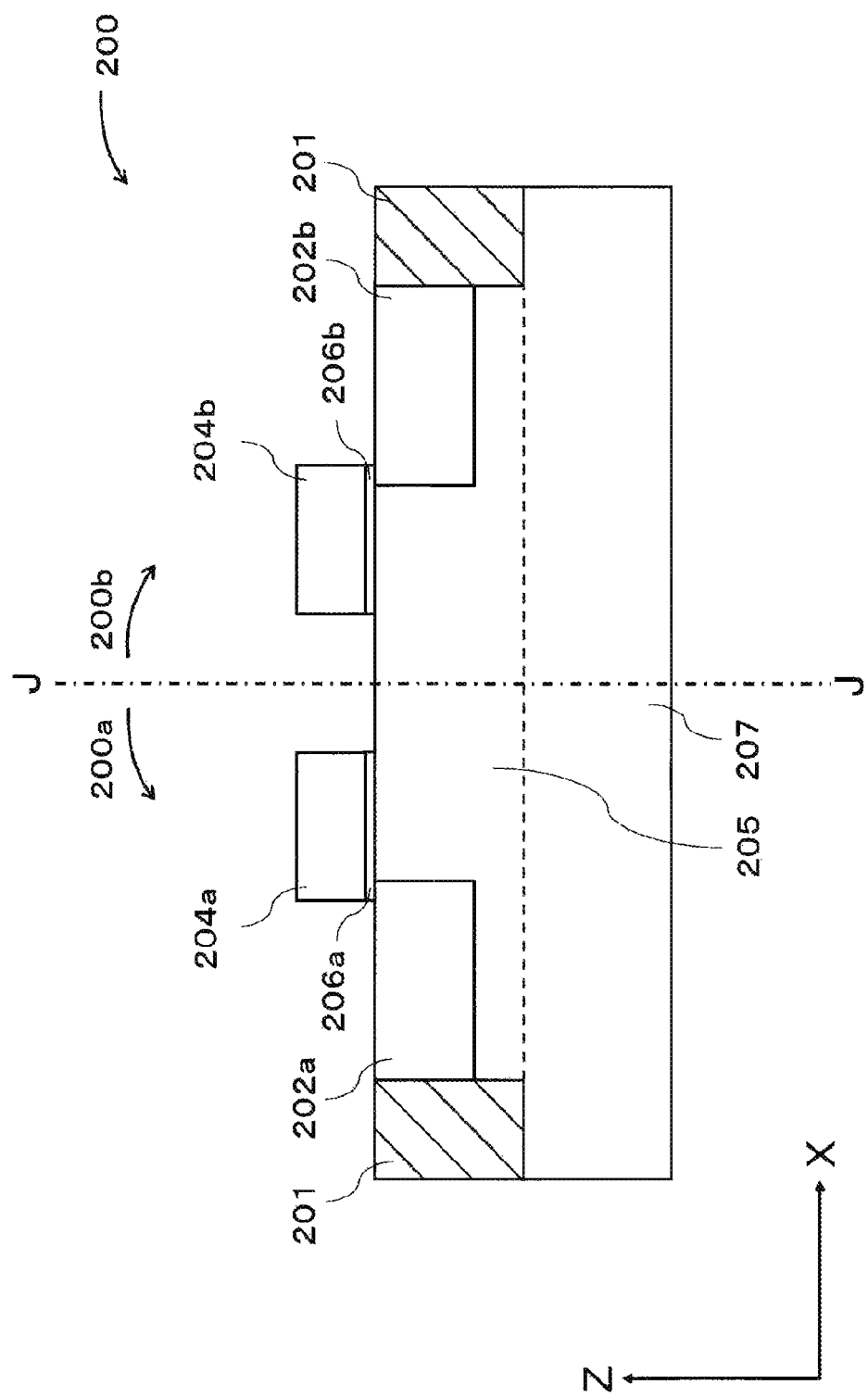
FIG. 8 is a schematic sectional view taken along line I-I of the semiconductor device according to the second embodiment of the present disclosure.
Figure 9:
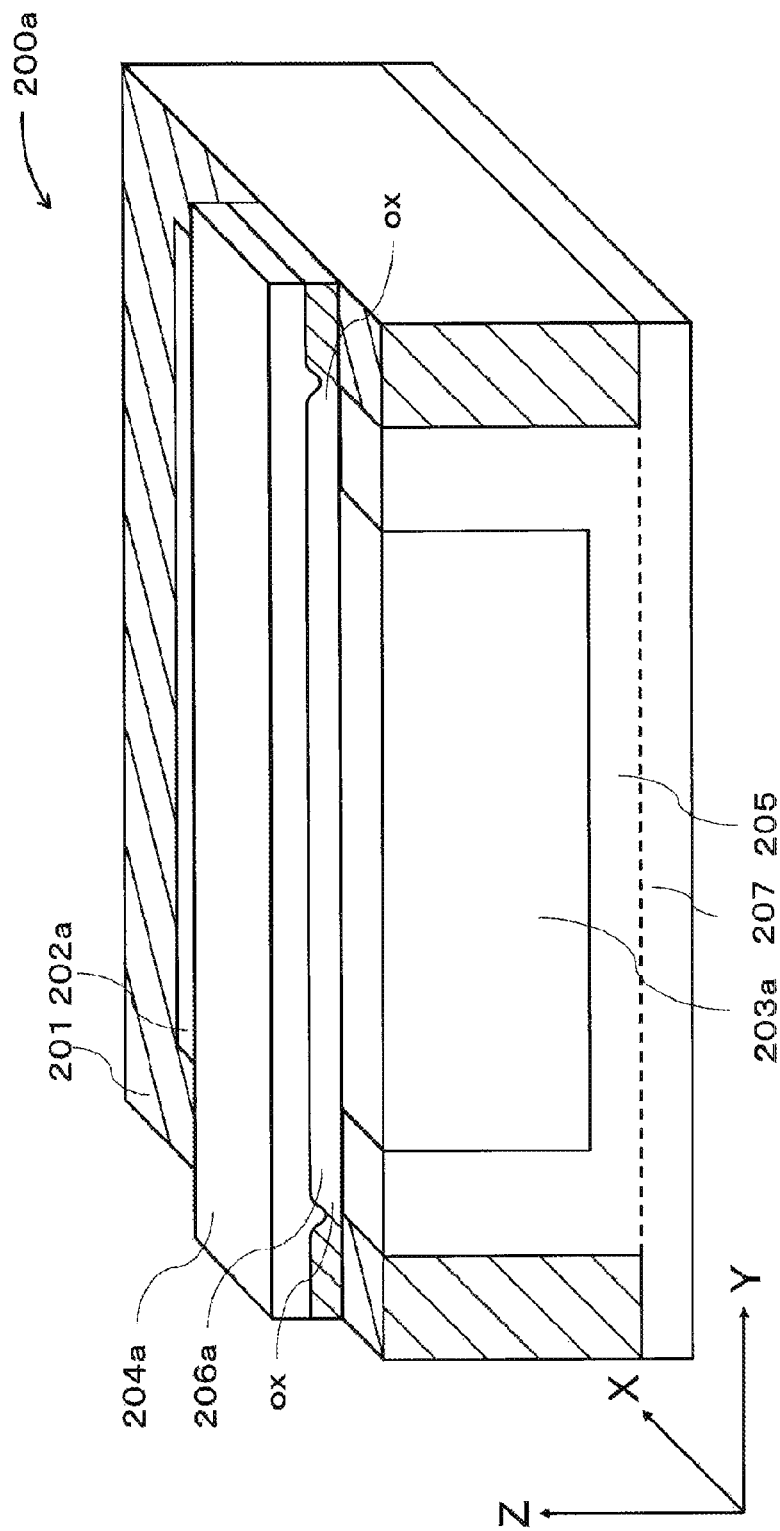
FIG. 9 is a schematic perspective sectional view taken along line J-J of the semiconductor device according to the second embodiment of the present disclosure.
Figure 10:
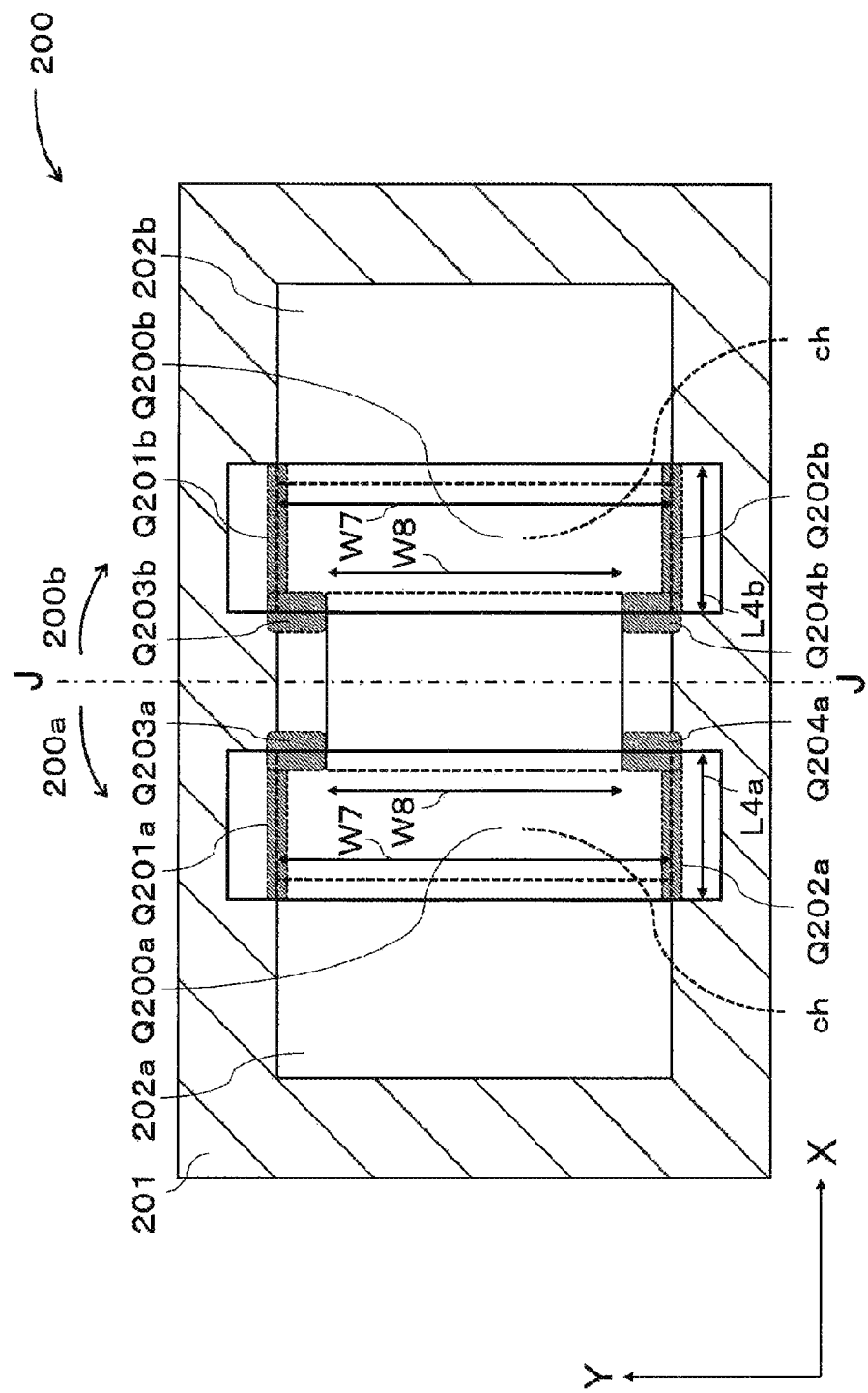
FIG. 10 is a schematic plan view illustrating a relationship between a main transistor and a parasitic transistor of the semiconductor device according to the second embodiment of the present disclosure.
Figure 11:
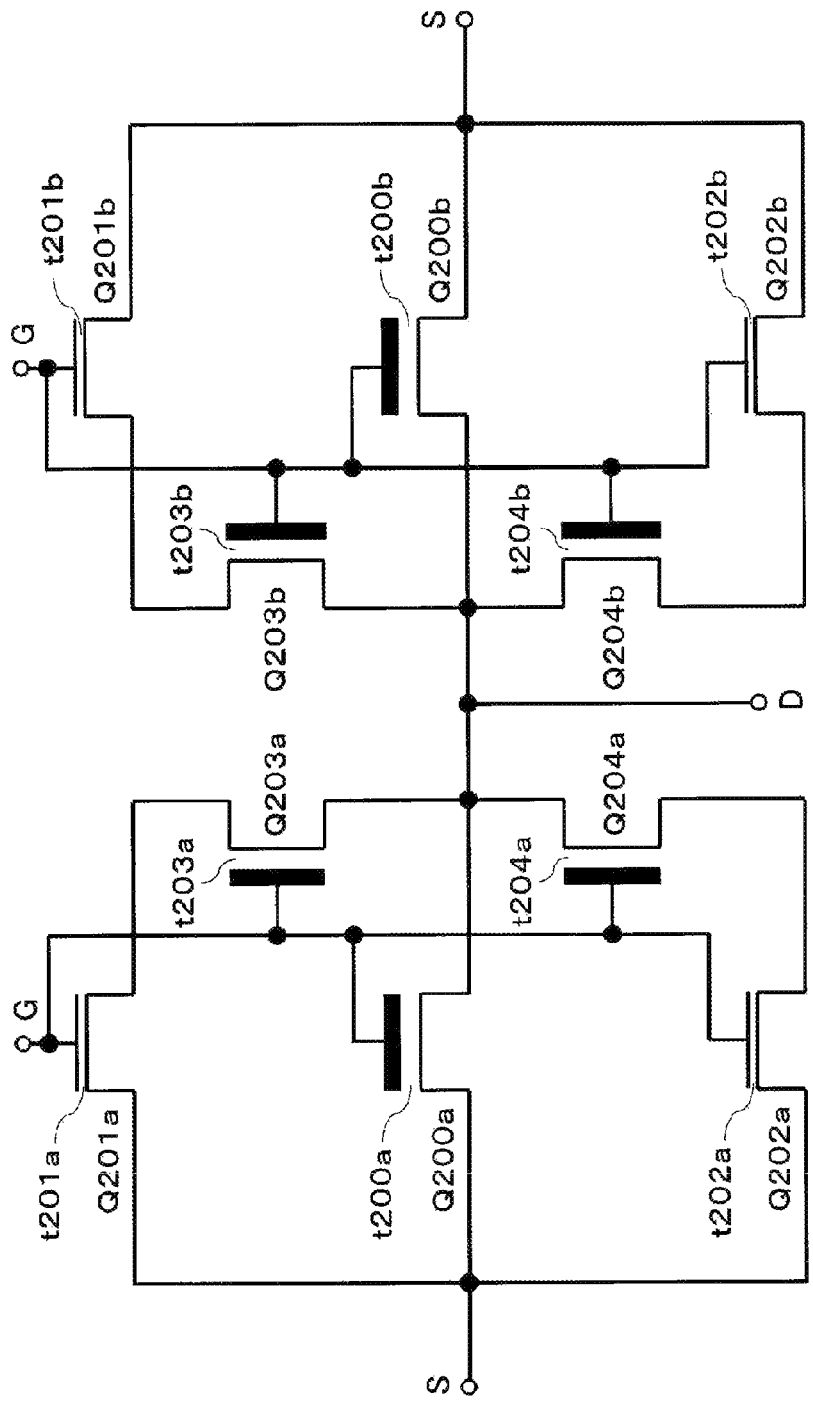
FIG. 11 is a circuit diagram illustrating the relationship between the main transistor and the parasitic transistor of the semiconductor device according to the second embodiment of the present disclosure.

Next, a second embodiment of the present disclosure will be described with reference to the drawings. FIG. 6 is a schematic plan view illustrating the configuration of a semiconductor device 200 according to a second embodiment of the present disclosure. FIG. 7 is a schematic sectional view taken along line H-H of the semiconductor device 200 of FIG. 6. FIG. 8 is a schematic sectional view taken along line I-I of the semiconductor device 200 of FIG. 6. FIG. 9 is a perspective sectional view taken along line J-J of the semiconductor device 200 of FIG. 6. FIG. 10 is a schematic plan view illustrating a main transistor and a parasitic transistor of the semiconductor device 200 of FIG. 6. FIG. 11 is a circuit diagram illustrating a relationship between the main transistor and the parasitic transistor of the semiconductor device 200 of FIG. 6.

As illustrated in FIG. 6, the semiconductor device 200 includes a transistor 200a and a transistor 200b. The semiconductor device 200 is formed from, e.g., a Si semiconductor, a SiC semiconductor, a SiGe semiconductor, a GaN semiconductor, etc. The transistor 200a includes a drain region 203a, a source region 202a, a gate electrode 204a, a gate insulating film 206a and a semiconductor region 205. Like the transistor 200a, the transistor 200b includes a drain region 203b, a source region 202b, a gate electrode 204b, a gate insulating film 206b and a semiconductor region 205. The transistor 200a and the transistor 200b have a symmetrical structure with line J-J in the Y direction as an axis.

The semiconductor region 205 is a region on which the source region 202a, the drain region 203a, the source region 202b and the drain region 203b are formed and also a region which is surrounded by an element isolation region 201. In a case of forming an NMOS transistor, the semiconductor region 205 is formed of, e.g., the same P-type region as a silicon substrate. When the element isolation region 201 is formed, the semiconductor region 205 is uniquely defined.

The drain region 203a and the drain region 203b are formed adjacent to each other in a substantially rectangular shape on a main surface of the semiconductor region 205. The drain region 203a and the drain region 203b are electrically connected in common. A long side of each of the drain region 203a and the drain region 203b extends in the Y direction, that is, the direction of a channel width W7 and a channel width W8 and a short side thereof extends in the X direction, that is, the direction of a channel length L4a and a channel length L4b. An end portion of each of the drain region 203a and the drain region 203b in the Y direction is in no contact with the element isolation region 201. In addition, the end portion of each of the drain region 203a and the drain region 203b need not be in contact with the element isolation region 201 and a portion of the semiconductor region 205 may be interposed between the drain regions 203a and 203b and the element isolation region 201. Further, in a case where the end portion of each of the drain regions 203a and 203b is in contact with the element isolation region 201, the element isolation region 201 is not necessarily an insulating film but may be, e.g., a P-type or N-type well region.

The source region 202a is formed in a substantially rectangular shape on the main surface of the semiconductor region 205 at a predetermined interval in the X direction with respect to the drain region 203a and at a predetermined interval in the Y direction from the element isolation region 201. A long side of the source region 202a extends in the Y direction and a short side thereof extends in the X direction. The source region 202b is formed in a substantially rectangular shape on the main surface of the semiconductor region 205 at a predetermined interval in the X direction with respect to the drain region 203b and at a predetermined interval in the Y direction from the element isolation region 201. A long side of the source region 202b extends in the Y direction and a short side thereof extends in the X direction. An end portion of each of the source regions 202a and 202b in the Y and X directions is in contact with the element isolation region 201. In addition, the end portion of each of the source regions 202a and 202b in the X direction may not be in contact with the element isolation region 201.

The source region 202a and the drain region 203a are formed of a conductivity type (e.g., N-type) opposite to that of the silicon substrate and are formed along the gate electrode 204a while facing each other. In addition, the source region 202b and the drain region 203b are formed of a conductivity type (e.g., N-type) opposite to that of the silicon substrate and are formed along the gate electrode 204b while facing each other. In addition, the source region 202a, the drain region 203a, the source region 202b and the drain region 203b are not limited to the rectangular shape but may be square, circular, elliptical or the like.

The channel width W8 of the drain region 203a in the Y direction is smaller than the channel width W7 of the source region 202a in the Y direction. The channel width W8 of the drain region 203b in the Y direction is smaller than the channel width W7 of the source region 202b in the Y direction. That is, both ends of the drain region 203a in the direction of the channel width W8 are located to be closer to the central portion of the channel region ch, i.e., more inside the channel region ch, than both ends of the source region 202a in the direction of the channel width W7. Similarly, both ends of the drain region 203b in the direction of the channel width W8 are located to be closer to the central portion of the channel region ch, i.e., more inside the channel region ch, than both ends of the source region 202b in the direction of the channel width W7. The channel region ch is formed of, e.g., the same P-type region as the silicon substrate. In the specification, when a first conductivity type is a P-type, a second conductivity type is an N-type. However, the present disclosure is not limited thereto. For example, when the first conductivity type is an N-type, the second conductivity type may be a P-type. The channel length L4a from the end portion of the source region 202a in the X direction to the end portion of the drain region 203a in the X direction is equal to the channel length L4b from the end portion of the source region 202b in the X direction to the end portion of the drain region 203b in the X direction.

The element isolation region 201 is formed on the main surface of the semiconductor region 205 and inside the semiconductor region 205 so as to surround the source region 202a, the drain region 203a, the source region 202b and the drain region 203b. The element isolation region 201 is composed of, e.g., STI, DTI or LOCOS. Specifically, the element isolation region 201 is filled with silicon dioxide ($SiO_2$). In addition, the entire element isolation region 201 may be composed of STI or DTI. However, the present disclosure is not limited thereto. For example, a portion of the element isolation region 201 may be formed in a P-type or N-type well region. In addition, the element isolation region 201 need not completely surround the source region 202a, the drain region 203a, the source region 202b and the drain region 203b.

The gate insulating film 206a is formed in a substantially rectangular shape on an upper portion of the semiconductor region 205a between the source region 202a and the drain region 203a. Both end portions of the gate insulating film 206a in the Y direction are connected to the element isolation region 201. One end portion of the gate insulating film 206a in the X direction substantially overlaps the source region 202a. The other end portion of the gate insulating film 206a in the X direction substantially overlaps the drain region 203a.

The gate insulating film 206b is formed in a substantially rectangular shape on an upper portion of the semiconductor region 205b between the source region 202b and the drain region 203b. Both end portions of the gate insulating film 206b in the Y direction are connected to the element isolation region 201. One end portion of the gate insulating film 206b in the X direction substantially overlaps the source region 202b. The other end portion of the gate insulating film 206b in the X direction substantially overlaps the drain region 203b.

In addition, the shape of the gate insulating film 206a, the gate insulating film 206b, the source region 202a, the drain region 203a, the source region 202b, the drain region 203b and the element isolation region 201 is not limited to the rectangular shape. In typical, in a design of this type of semiconductor device, the size and the shape of the source region 202a, the drain region 203a, the source region 202b and the drain region 203b are first determined and the shape of the element isolation region 201 and the gate insulating films 206a and 206b is then uniquely defined in accordance with the shape of the source region 202a, the drain region 203a, the source region 202b and the drain region 203b. Therefore, the shape of these gate insulating films and a variety of regions is not limited to the rectangular shape but may be, e.g., circular, semicircular, elliptical, triangular, hexagonal, octagonal or the like.

The gate electrode 204a is formed in a substantially rectangular shape so as to overlap the gate insulating film 206a. The gate electrode 204b is formed in a substantially rectangular shape so as to overlap the gate insulating film 206b. The gate electrode 204a extends beyond a boundary portion between the channel region ch, which is formed between the source region 202a and the drain region 203a, and the element isolation region 201. In addition, the gate electrode 204b extends beyond a boundary portion between the channel region ch, which is formed between the source region 202b and the drain region 203b, and the element isolation region 201. The gate electrodes 204a and 204b are made of, for example, metal or the like having conductivity, such s polysilicon or aluminum having conductivity, which is highly doped with P-type or N-type element material.

It is also shown in FIG. 6 that the channel width W7 of the source regions 202a and 202b and the channel width W8 of the drain regions 203a and 203b have a relationship of W8<W7. However, the channel width W7 may be smaller than the channel width W8. That is, the channel width W7 and the channel width W8 may have a relationship of W7<W8.

FIG. 7 is a schematic sectional view taken along line H-H of the semiconductor device 200 of FIG. 6. As shown in FIG. 7, the semiconductor region 205 is formed on a main surface of a semiconductor substrate 207. In FIG. 7, the semiconductor region 205 and the semiconductor substrate 207 may be either the same conductivity type or different conductivity types. The source region 202a, the drain region 203a, the source region 202b, the drain region 203b and the element isolation region 201 have a certain depth from the main surface of the semiconductor region 205 in the Z direction. The element isolation region 201 is formed to be deeper than the source region 202a, the drain region 203a, the source region 202b and the drain region 203b. The channel region ch is formed in the semiconductor region 205 between the source region 202a and the drain region 203a and between the source region 202b and the drain region 203b. The depth of the element isolation region 201 is, e.g., several tens nm to several hundred μm. In addition, in the specification, a well region is included in the semiconductor substrate. For example, in a case where a P well region is formed in the original semiconductor substrate and an NMOS transistor is formed in the P well region or in a case where a PMOS transistor is formed in an N well region, the P well region or the N well region falls under the category of semiconductor substrate in the specification. In addition, when the NMOS transistor is formed, the P well region may be formed in a deep N well region and the NMOS transistor may be formed in the P well region. In this case, the P well region corresponds to the semiconductor substrate 207 in the present disclosure. Therefore, under this configuration, a so-called back gate using the semiconductor substrate 207 as a gate becomes a P well region (not shown). In addition, if a deep N well region is formed broadly and an N well region is formed in the deep N well region, the N well region may be responsible to element isolation and a PMOS transistor may be formed in the N well region.

FIG. 8 is a schematic sectional view taken along line I-I of the semiconductor device 200 of FIG. 6. FIG. 8 is a sectional view of a boundary portion between the element isolation region 201 and the source region 202a, drain region 203a, source region 202b and drain region 203b in FIG. 6. Therefore, the thickness of the gate insulating film 206a shown in FIG. 8 is smaller than the thickness of the gate insulating film 206a shown in FIG. 7. In this way, a parasitic transistor Q201a and a parasitic transistor Q202a shown in FIGS. 10 and 11 to be described later are formed in a portion where the thickness of the gate insulating film 206a is smaller. In addition, the thickness of the gate insulating film 206b shown in FIG. 8 is smaller than the thickness of the gate insulating film 206b shown in FIG. 7. In this way, a parasitic transistor Q201b and a parasitic transistor Q202b shown in FIGS. 10 and 11 to be described later are formed in a portion where the thickness of the gate insulating film 206b is smaller. When the thickness of each of the gate insulating films 206a and 206b becomes smaller, a threshold voltage thereof is lowered. On the other hand, as shown in FIG. 6, since the width W8 of the drain region 203a is smaller than the width W7 of the source region 202a, the drain region 203a is not present in a portion where the gate insulating film 206a of FIG. 8 becomes thinner. In addition, since the width W8 of the drain region 203b is smaller than the width W7 of the source region 202b, the drain region 203b is not present in a portion where the gate insulating film 206b becomes thinner.

FIG. 9 is a perspective sectional view taken along line J-J of the semiconductor device 200 of FIG. 6, showing the transistor 200a. As shown in FIG. 9, the transistor 200a includes the source region 202a, the drain region 203a, the gate electrode 204a, the gate insulating film 206a and the semiconductor region 205. An end portion of the drain region 203a in the X direction is in no contact with the element isolation region 201. In addition, although a relationship in boundary portion between the source region 202a and the element isolation region 201 in the respect of a section is not shown in FIG. 9, an end portion of the source region 202a is in contact with the element isolation region 201.

FIG. 10 is a schematic plan view showing a relationship between a main transistor and a parasitic transistor of the semiconductor device 200 of FIG. 6. As shown in FIG. 10, the transistor 200a includes a main transistor Q200a, a parasitic transistor Q201a and a parasitic transistor Q202a. The transistor 200b includes a main transistor Q200b, a parasitic transistor Q201b and a parasitic transistor Q202b. The parasitic transistor Q201a and the parasitic transistor Q202a are formed at the boundary portion between the channel region ch and the element isolation region 201 in the Y direction of the transistor 200a, that is, the direction of the channel width W7 and the channel width W8. The parasitic transistor Q201b and the parasitic transistor Q202b are formed at the boundary portion between the channel region ch and the element isolation region 201 in the Y direction of the transistor 200b.

A parasitic transistor Q203a and a parasitic transistor Q204a are formed within the channel region ch between the element isolation region 201 and the drain region 203a in the Y direction. The size of the parasitic transistor Q203a and the parasitic transistor Q204a is determined depending on an interval between the element isolation region 201 and the drain region 203a. The parasitic transistor Q203b and the parasitic transistor Q204b are formed within the channel region ch between the element isolation region 201 and the drain region 203b in the Y direction. The size of the parasitic transistor Q203b and the parasitic transistor Q204b is determined depending on an interval between the element isolation region 201 and the drain region 203b.

The main transistor Q200a is formed in the channel region ch within the semiconductor region 205 where the main transistor Q200a is little affected by the parasitic transistors Q201a to Q204a. The main transistor Q200b is formed in the channel region ch within the semiconductor region 205 where the main transistor Q200b is little affected by the parasitic transistors Q201b to Q204b. In the semiconductor device 200, it is not possible to clearly delineate a boundary between the main transistors Q200a and 200b and the parasitic transistors Q101a to Q104a and Q101b to 104b. However, in the specification, for convenience of explanation, they are distinguished from each other in this way. The number of parasitic transistors is not limited to eight but may be fewer or more.

FIG. 11 is a schematic equivalent circuit diagram of the semiconductor device 200 of FIG. 10. The sources and the gates of the parasitic transistors Q201a and Q202a are connected to the source and gate of the main transistor Q200a, respectively. The parasitic transistor Q201a is connected to the drain of the main transistor Q200a via the parasitic transistor Q203a and the parasitic transistor Q202a is connected to the drain of the main transistor Q200a via the parasitic transistor Q204a. That is, the parasitic transistor Q201a and the parasitic transistor Q203a are connected in series, the parasitic transistor Q202a and the parasitic transistor Q204a are connected in series, and these two sets of serial connections and the main transistor Q200a are connected in parallel. The sources of the main transistor Q200a and the parasitic transistors Q201a and Q202a form a common source S. The gates of the main transistor Q200a and the parasitic transistors Q201a, Q202a, Q203a and Q204a form a common gate G.

In addition, the sources and the gates of the parasitic transistors Q201b and Q202b are connected to the source and gate of the main transistor Q200b, respectively. The parasitic transistor Q201b is connected to the drain of the main transistor Q200b via the parasitic transistor Q203b and the parasitic transistor Q202b is connected to the drain of the main transistor Q200b via the parasitic transistor Q204b. That is, the parasitic transistor Q201b and the parasitic transistor Q203b are connected in series, the parasitic transistor Q202b and the parasitic transistor Q204b are connected in series, and these two sets of serial connections and the main transistor Q200b are connected in parallel. The sources of the main transistor Q200b and the parasitic transistors Q201b and Q202b form a common source S. The gates of the main transistor Q200b and the parasitic transistors Q201b, Q202b, Q203b and Q204b form a common gate G.

Further, the drains of the main transistor Q200a and the parasitic transistors Q203a and Q204a and the drains of the main transistor Q200b and the parasitic transistors Q203b and Q204b form a common drain D. The semiconductor device 200 is constituted by the common source S, the common drain D and the common gate G.

The gate thickness t200a of the main transistor Q200a is larger than the gate thickness t201a of the parasitic transistor Q201a and the gate thickness t202a of the parasitic transistor Q202a (t200a>t201a (t202a)). In this case, within a certain range of a gate width of the main transistor Q200a, threshold voltages of the parasitic transistors Q201a and Q202a may be lower than a threshold voltage of the main transistor Q200a.

Unlike the gate thickness t200a of the main transistor Q200a, it is difficult to limit the gate thickness t201a of the parasitic transistor Q201a and the gate thickness t202a of the parasitic transistor Q202a to a certain range in manufacture. In addition, the gate thickness t203a of the parasitic transistor Q203a and the gate thickness t204a of the parasitic transistor Q204a are substantially equal to the gate thickness t200a of the main transistor Q200a. Therefore, threshold voltages of the parasitic transistors Q203a and Q204a are substantially equal to the threshold voltage of the main transistor Q200a.

The gate thickness t200b of the main transistor Q200b is larger than the gate thickness t201b of the parasitic transistor Q201b and the gate thickness t202b of the parasitic transistor Q202b (t200b>t201b (t202b)). In this case, within a certain range of a gate width of the main transistor Q200b, threshold voltages of the parasitic transistors Q201b and Q202b may be lower than a threshold voltage of the main transistor Q200b.

Unlike the gate thickness t200b of the main transistor Q200b, it is difficult to limit the gate thickness t201b of the parasitic transistor Q201b and the gate thickness t202b of the parasitic transistor Q202b to a certain range in manufacture. In addition, the gate thickness t203b of the parasitic transistor Q203b and the gate thickness t204b of the parasitic transistor Q204b are substantially equal to the gate thickness t200b of the main transistor Q200b. Therefore, threshold voltages of the parasitic transistors Q203b and Q204b are substantially equal to the threshold voltage of the main transistor Q200b.

Channel surface potentials of the parasitic transistors Q201a and Q202a are different from a channel surface potential of the main transistor Q200a. On the other hand, channel surface potentials of the parasitic transistors Q203a and Q204a are substantially equal to the channel surface potential of the main transistor Q200a. Since the parasitic transistors Q201a and Q202a have a low threshold voltage, in a state where a gate-source voltage (Vgs) is low, the channel surface potentials of the parasitic transistors Q201a and Q202a are inverted more easily than those of the main transistor Q200a and the parasitic transistors Q203a and Q204a. Therefore, the parasitic transistors Q201a and Q202a are in a state in which a current is more likely to flow than the main transistor Q200a and the parasitic transistors Q203a and Q204a. However, since the parasitic transistors Q201a and Q203a are connected in series and the parasitic transistors Q202a and Q204a are connected in series, the parasitic transistors Q203a and Q204a inhibit the current of the parasitic transistors Q201a and Q202a.

Channel surface potentials of the parasitic transistors Q201b and Q202b are different from a channel surface potential of the main transistor Q200b. On the other hand, channel surface potentials of the parasitic transistors Q203b and Q204b are substantially equal to the channel surface potential of the main transistor Q200b. Since the parasitic transistors Q201b and Q202b have a low threshold voltage, in a state where a gate-source voltage (Vgs) is low, the channel surface potentials of the parasitic transistors Q201b and Q202b are inverted more easily than those of the main transistor Q200b and the parasitic transistors Q203b and Q204b. Therefore, the parasitic transistors Q201b and Q202b are in a state in which a current is more likely to flow than the main transistor Q200b and the parasitic transistors Q203b and Q204b. However, since the parasitic transistors Q201b and Q203b are connected in series and the parasitic transistors Q202b and Q204b are connected in series, the parasitic transistors Q203b and Q204b inhibit the current of the parasitic transistors Q201b and Q202b.

As described above, the semiconductor device 200 includes the parasitic transistors Q201a, Q202a, Q201b and Q202b. However, since the parasitic transistors Q203a and Q204a are formed between the drain region 203a and the parasitic transistor Q201a and between the drain region 203a and the parasitic transistor Q202a, respectively, and the parasitic transistors Q203b and Q204b are formed between the drain region 203b and the parasitic transistor Q201b and between the drain region 203b and the parasitic transistor Q202b, respectively, even when the surface potentials of the parasitic transistors Q201a, Q202a, Q201b and Q202b are inverted at the gate-source voltage (Vgs), the surface potentials of the parasitic transistors Q203a, Q204a, Q203b and Q204b are not inverted at the gate-source voltage (Vgs) more easily than those of the parasitic transistors Q201a, Q202a, Q201b and Q202b. Therefore, no reverse channel effect occurs and no hump (kink) phenomenon occurs accordingly. Thereby, a transistor is not conducted at a gate voltage lower than a desired surface potential, which contributes to reduction in a leak current of an off state. In addition, since the channel width W8 of the drain region 203a need only be shorter than the channel width W7 of the source region 202b, what to change is only a mask layout, which eliminates the complexity of a manufacturing process without increasing the number of manufacturing processes.

Third Embodiment

Figure 12:
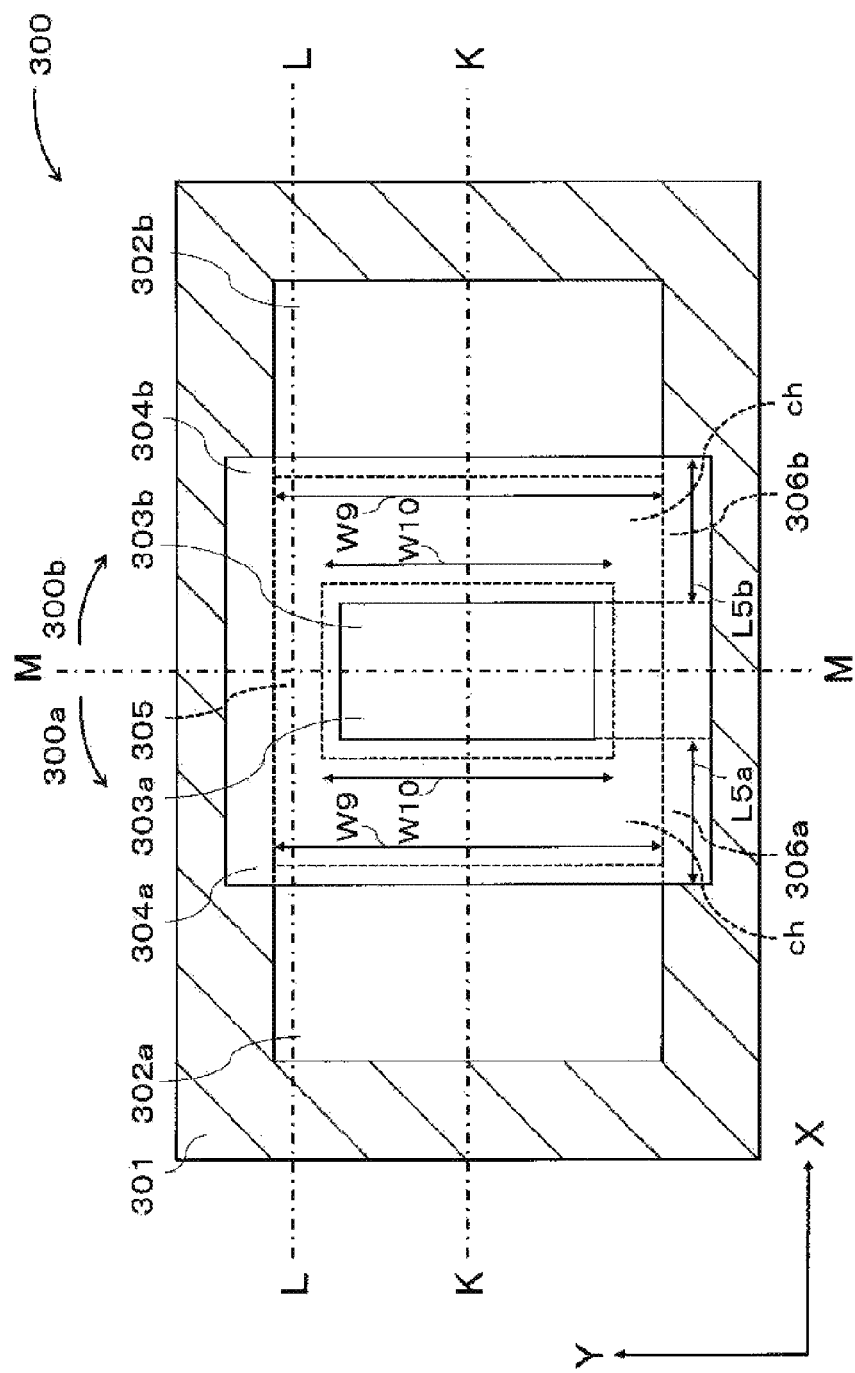
FIG. 12 is a schematic plan view illustrating the configuration of a semiconductor device according to a third embodiment of the present disclosure.
Figure 13:
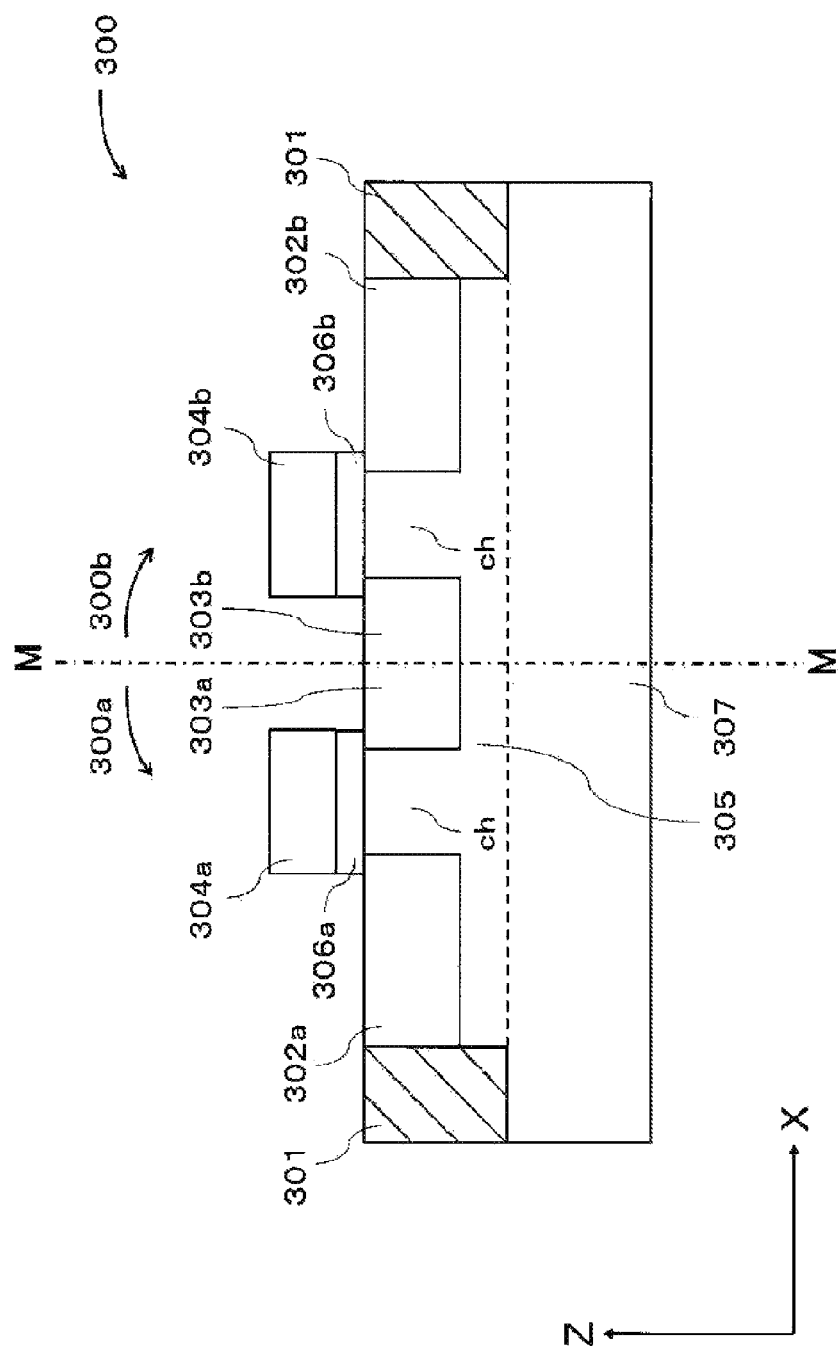
FIG. 13 is a schematic sectional view taken along line K-K of the semiconductor device according to the third embodiment of the present disclosure.
Figure 14:
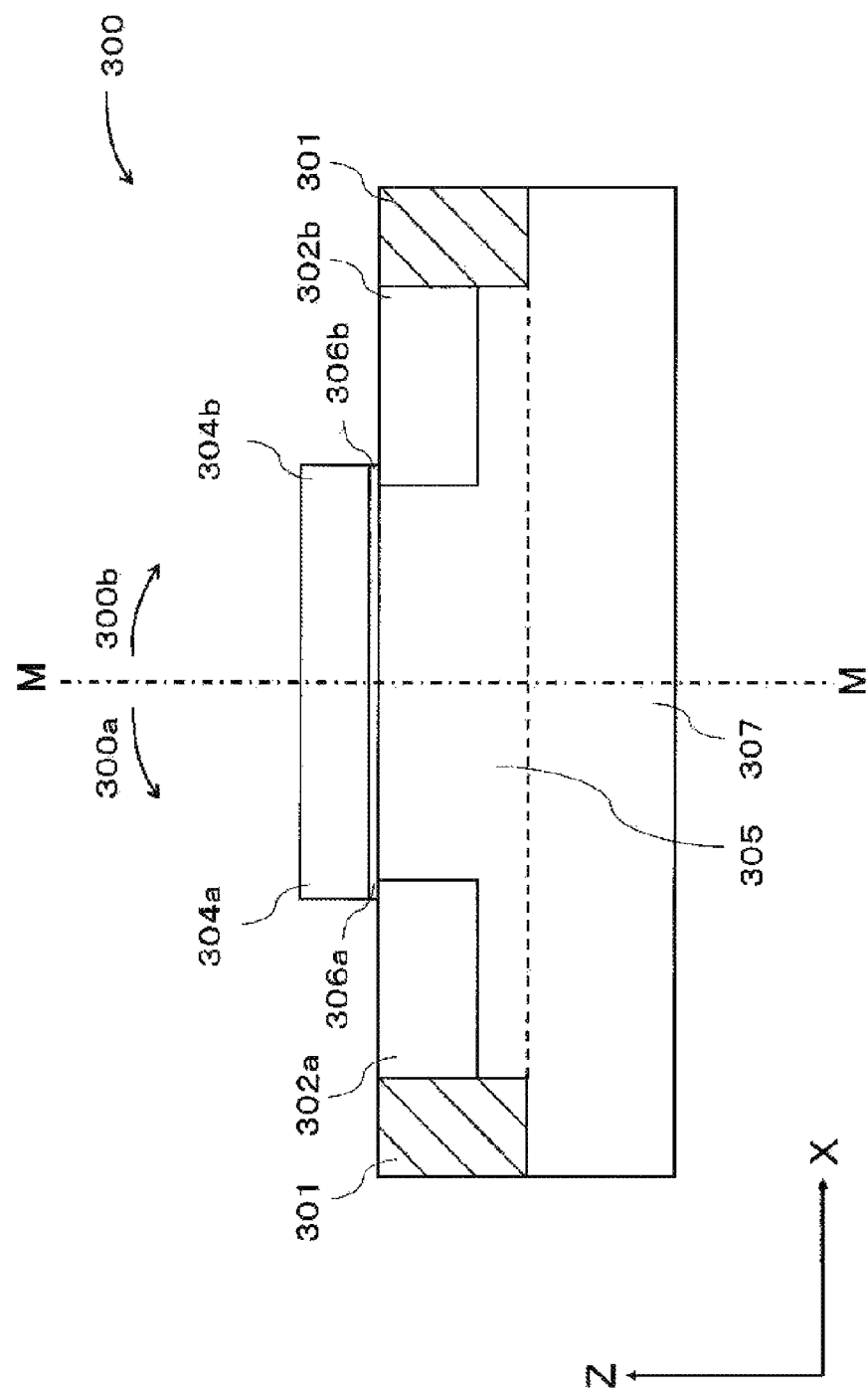
FIG. 14 is a schematic sectional view taken along line L-L of the semiconductor device according to the third embodiment of the present disclosure.
Figure 15:
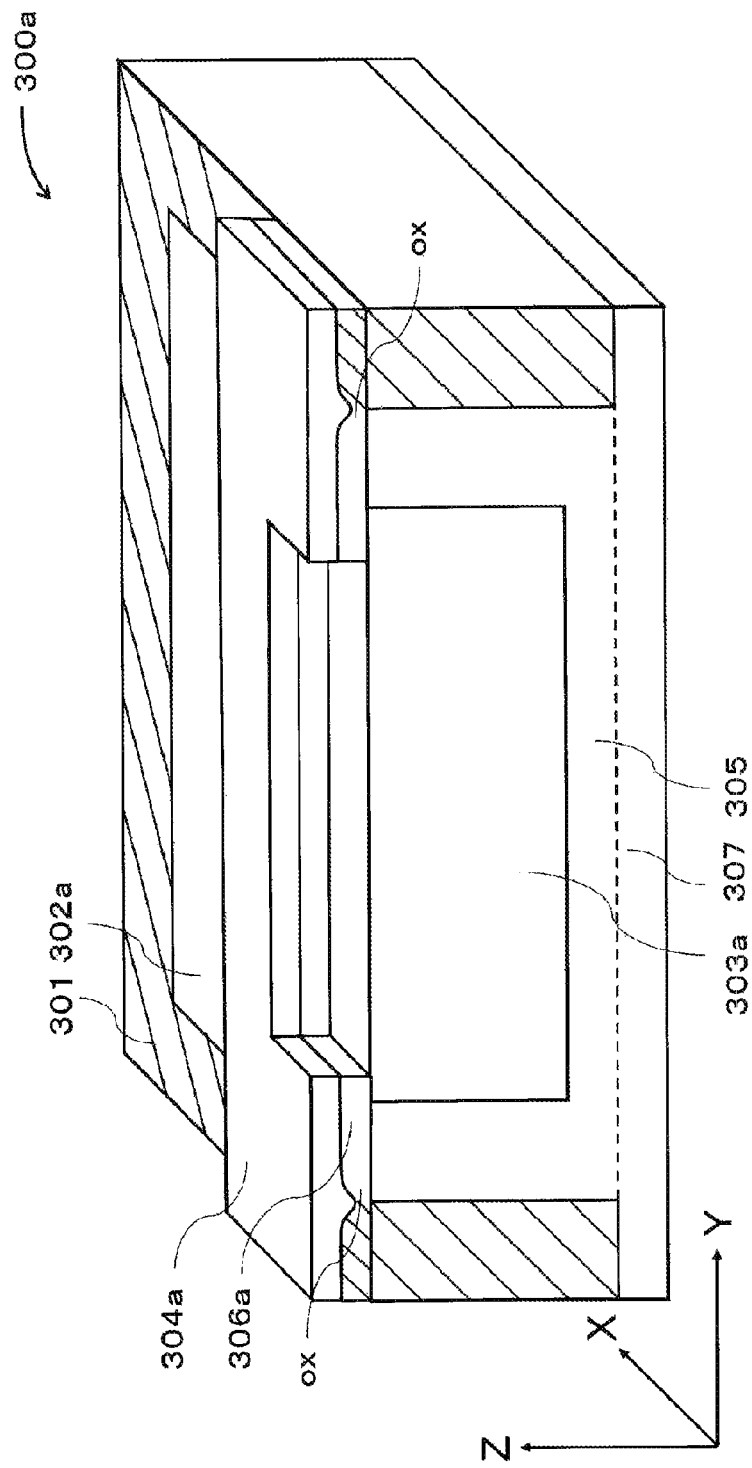
FIG. 15 is a schematic perspective sectional view taken along line M-M of the semiconductor device according to the third embodiment of the present disclosure.
Figure 16:
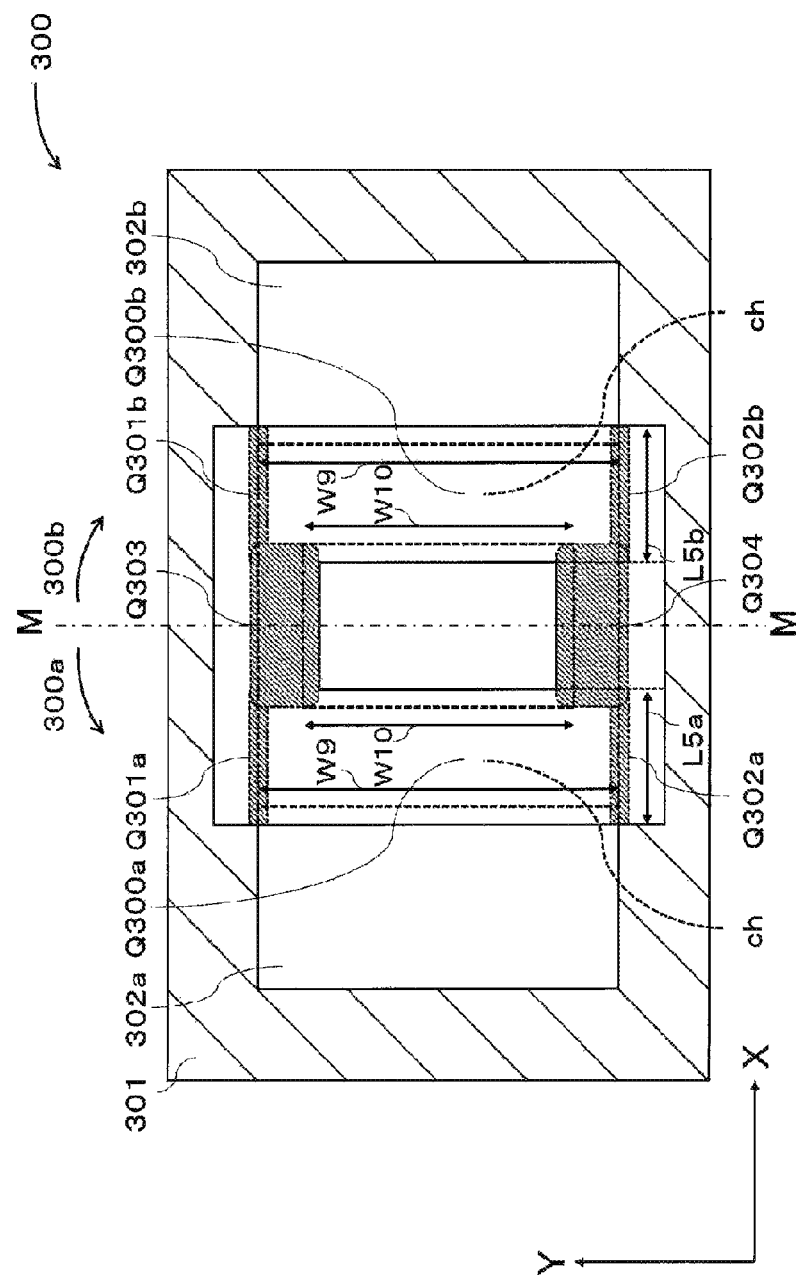
FIG. 16 is a schematic plan view illustrating a relationship between a main transistor and a parasitic transistor of the semiconductor device according to the third embodiment of the present disclosure.
Figure 17:
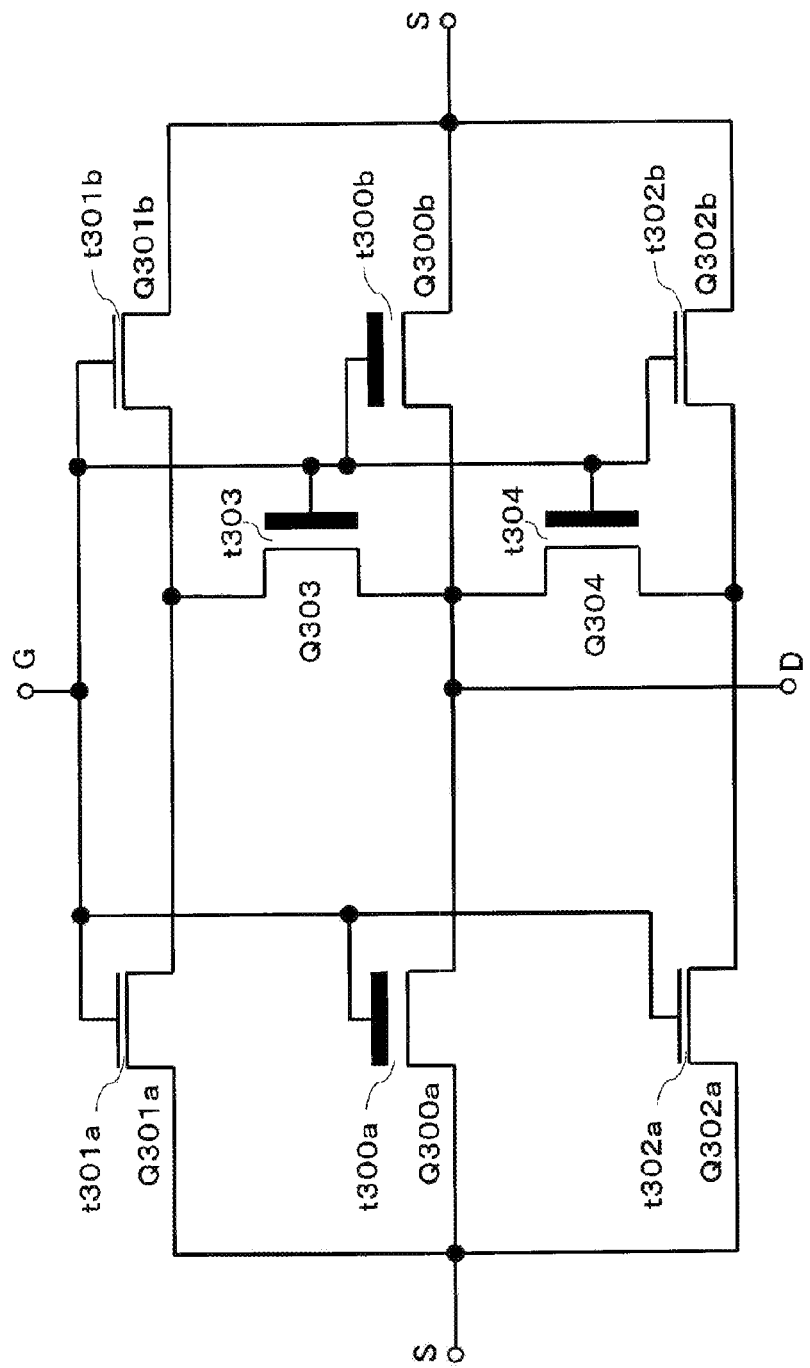
FIG. 17 is a circuit diagram illustrating the relationship between the main transistor and the parasitic transistor of the semiconductor device according to the third embodiment of the present disclosure.

Next, a third embodiment of the present disclosure will be described with reference to the drawings. FIG. 12 is a schematic plan view illustrating the configuration of a semiconductor device according to a third embodiment of the present disclosure. FIG. 13 is a schematic sectional view taken along line K-K of the semiconductor device of FIG. 12. FIG. 14 is a schematic sectional view taken along line L-L of the semiconductor device of FIG. 12. FIG. 15 is a perspective sectional view taken along line M-M of the semiconductor device of FIG. 12. FIG. 16 is a schematic plan view illustrating a main transistor and a parasitic transistor of the semiconductor device of FIG. 12. FIG. 17 is a circuit diagram illustrating a relationship between the main transistor and the parasitic transistor of the semiconductor device of FIG. 12.

As illustrated in FIG. 12, the semiconductor device 300 includes a transistor 300a and a transistor 300b. The semiconductor device 300 is formed from, e.g., a Si semiconductor, a SiC semiconductor, a SiGe semiconductor, a GaN semiconductor, etc. The transistor 300a includes a drain region 303a, a source region 302a, a gate electrode 304a, a gate insulating film 306a and a semiconductor region 305. Like the transistor 300a, the transistor 300b includes a drain region 303b, a source region 302b, a gate electrode 304b, a gate insulating film 306b and a semiconductor region 305. The transistor 300a and the transistor 300b have a symmetrical structure with line K-K in the Y direction as an axis.

The semiconductor region 305 is a region on which the source region 302a, the drain region 303a, the source region 302b and the drain region 303b are formed and also a region which is surrounded by an element isolation region 301. In a case of forming an NMOS transistor, the semiconductor region 305 is formed of, e.g., the same P-type region as a silicon substrate. When the element isolation region 301 is formed, the semiconductor region 305 is uniquely defined.

The drain region 303a and the drain region 303b are formed adjacent to each other in a substantially rectangular shape on a main surface of the semiconductor region 305. The drain region 303a and the drain region 303b are electrically connected in common. A long side of each of the drain region 303a and the drain region 303b extends in the Y direction, that is, the direction of a channel width W9 and a channel width W10 and a short side thereof extends in the X direction, that is, the direction of a channel length L5a and a channel length L5b. An end portion of each of the drain region 303a and the drain region 303b in the Y direction is in no contact with the element isolation region 301. In addition, the end portion of each of the drain region 303a and the drain region 303b need not be in contact with the element isolation region 301 and a portion of the semiconductor region 305 may be interposed between the drain regions 303a and 303b and the element isolation region 301. Further, in a case where the end portion of each of the drain regions 303a and 303b is in contact with the element isolation region 301, the element isolation region 301 is not necessarily an insulating film but may be, e.g., a P-type or N-type well region.

The source region 302a is formed in a substantially rectangular shape on the main surface of the semiconductor region 305 at a predetermined interval in the X direction with respect to the drain region 303a and at a predetermined interval in the Y direction from the element isolation region 301. A long side of the source region 302a extends in the Y direction and a short side thereof extends in the X direction. The source region 302b is formed in a substantially rectangular shape on the main surface of the semiconductor region 305 at a predetermined interval in the X direction with respect to the drain region 303b and at a predetermined interval in the Y direction from the element isolation region 301. A long side of the source region 302b extends in the Y direction and a short side thereof extends in the X direction. An end portion of each of the source regions 302a and 302b in the Y and X directions is in contact with the element isolation region 301. In addition, the end portion of each of the source regions 302a and 302b in the X direction may not be in contact with the element isolation region 301.

The source region 302a and the drain region 303a are formed of a conductivity type (e.g., N-type) opposite to that of the silicon substrate and are formed along the gate electrode 304a while facing each other. In addition, the source region 302b and the drain region 303b are formed of a conductivity type (e.g., N-type) opposite to that of the silicon substrate and are formed along the gate electrode 304b while facing each other. In addition, the source region 302a, the drain region 303a, the source region 302b and the drain region 303b are not limited to the rectangular shape but may be square, circular, elliptical or the like.

The channel width W10 of the drain region 303a in the Y direction is smaller than the channel width W9 of the source region 302a in the Y direction. The channel width W10 of the drain region 303b in the Y direction is smaller than the channel width W9 of the source region 302b in the Y direction. That is, both ends of the drain region 303a in the direction of the channel width W10 are located to be closer to the central portion of the channel region ch, i.e., more inside the channel region ch, than both ends of the source region 302a in the direction of the channel width W9. Similarly, both ends of the drain region 303b in the direction of the channel width W10 are located to be closer to the central portion of the channel region ch, i.e., more inside the channel region ch, than both ends of the source region 302b in the direction of the channel width W9. The channel region ch is formed of, e.g., the same P-type region as the silicon substrate. In the specification, when a first conductivity type is a P-type, a second conductivity type is an N-type. However, the present disclosure is not limited thereto. For example, when the first conductivity type is an N-type, the second conductivity type may be a P-type. The channel length L5a from the end portion of the source region 302a in the X direction to the end portion of the drain region 303a in the X direction is equal to the channel length L5b from the end portion of the source region 302b in the X direction to the end portion of the drain region 303b in the X direction.

The element isolation region 301 is formed so as to surround the source region 302a, the drain region 303a, the source region 302b and the drain region 303b. The element isolation region 301 is composed of, e.g., STI, DTI or LOCOS. Specifically, the element isolation region 301 is filled with silicon dioxide ($SiO_2$). In addition, the entire element isolation region 301 may be composed of, e.g., STI or DTI. However, the present disclosure is not limited thereto. For example, a portion of the element isolation region 301 may be formed in a P-type or N-type well region. In addition, the element isolation region 301 need not completely surround the source region 302a, the drain region 303a, the source region 302b and the drain region 303b.

The gate insulating film 306a is formed on an upper portion of the semiconductor region 305a between the source region 302a and the drain region 303a and an upper portion of the semiconductor region 305a between the drain region 303a and the element isolation region 301. Both end portions of the gate insulating film 306a in the Y direction are connected to the element isolation region 301. One end portion of the gate insulating film 306a in the X direction substantially overlaps the source region 302a. The other end portion of the gate insulating film 306a in the X direction substantially overlaps the drain region 303a.

The gate insulating film 306b is formed on an upper portion of the semiconductor region 305b between the source region 302b and the drain region 303b and an upper portion of the semiconductor region 305b between the drain region 303b and the element isolation region 301. Both end portions of the gate insulating film 306b in the Y direction are connected to the element isolation region 301. One end portion of the gate insulating film 306b in the X direction substantially overlaps the source region 302b. The other end portion of the gate insulating film 306b in the X direction substantially overlaps the drain region 303b.

In the third embodiment of the present disclosure, the gate insulating film 306a and the gate insulating film 306b are integrally formed in a rectangular frame shape. That is, when viewed from top, the circumference of the drain regions 303a and 303b is surrounded by the gate insulating films 306a and 306b. Of the outer edge of the frame-shaped gate insulating films, both end portions in the Y direction overlap the element isolation region 301 and both end portions in the X direction overlap the source region 302a and the source region 302b, respectively. The inner edge of the frame-shaped gate insulating films overlaps the drain region 303a and the drain region 303b.

In addition, the shape of the gate insulating film 306a, the gate insulating film 306b, the source region 302a, the drain region 303a, the source region 302b, the drain region 303b and the element isolation region 301 is not limited to the rectangular shape. In typical, in a design of this type of semiconductor device, the size and the shape of the source region 302a, the drain region 303a, the source region 302b and the drain region 303b are first determined and the shape of the element isolation region 301 and the gate insulating films 306a and 306b is then uniquely defined in accordance with the shape of the source region 302a, the drain region 303a, the source region 302b and the drain region 303b. Therefore, the shape of these gate insulating films and a variety of regions is not limited to the rectangular shape but may be, e.g., circular, semicircular, elliptical, triangular, hexagonal, octagonal or the like.

The gate electrode 304a is formed so as to overlap the gate insulating film 306a. The gate electrode 304b is formed so as to overlap the gate insulating film 306b. The gate electrode 304a extends beyond a boundary portion between the channel region ch, which is formed between the source region 302a and the drain region 303a, and the element isolation region 301. In addition, the gate electrode 304b extends beyond a boundary portion between the channel region ch, which is formed between the source region 302b and the drain region 303b, and the element isolation region 301. The gate electrodes 304a and 304b are made of, for example, metal or the like having conductivity, such as polysilicon or aluminum having conductivity, which is highly doped with P-type or N-type element material.

In the third embodiment of the present disclosure, the gate electrode 304a and the gate electrode 304b are integrally formed in a rectangular frame shape. Of the outer edge of the frame-shaped gate insulating films, both end portions in the Y direction overlap the element isolation region 301 and both end portions in the X direction overlap the source region 302a and the source region 302b, respectively. The inner edge of the frame-shaped gate insulating films overlaps the drain region 303a and the drain region 303b. In addition, the gate electrodes 304a and 304b need not completely surround the drain regions 303a and 303b hut may be, e.g., formed in a U shape.

FIG. 13 is a schematic sectional view taken along line K-K of the semiconductor device 300 of FIG. 12. As shown in FIG. 13, the semiconductor region 305 is formed on a main surface of a semiconductor substrate 307. In FIG. 13, the semiconductor region 305 and the semiconductor substrate 307 may be either the same conductivity type or different conductivity types. The source region 302a, the drain region 303a, the source region 302b, the drain region 303b and the element isolation region 301 have a certain depth from the main surface of the semiconductor region 305 in the Z direction. The element isolation region 301 is formed to be deeper than the source region 302a, the drain region 303a, the source region 302b and the drain region 303b. The channel region ch is formed in the semiconductor region 305 between the source region 302a and the drain region 303a and between the source region 302b and the drain region 303b. The depth of the element isolation region 301 is, e.g., several tens nm to several hundred μm. In addition, in the specification, a well region is included in the semiconductor substrate. For example, in a case where a P well region is formed in the original semiconductor substrate and an NMOS transistor is formed in the P well region or in a case where a PMOS transistor is formed in an N well region, the P well region or the N well region falls under the category of semiconductor substrate in the specification. In addition, when the NMOS transistor is formed, the P well region may be formed in a deep N well region and the NMOS transistor may be formed in the P well region. In this case, the P well region corresponds to the semiconductor substrate 307 in the present disclosure. Therefore, under this configuration, a so-called back gate using the semiconductor substrate 307 as a gate becomes a P well region (not shown). In addition, if a deep N well region is formed broadly and an N well region is formed in the deep N well region, the N well region may be responsible to element isolation and a PMOS transistor may be formed in the N well region.

FIG. 14 is a schematic sectional view taken along line L-L of the semiconductor device 300 of FIG. 12. FIG. 14 is a sectional view of a boundary portion between the element isolation region 301 and the source region 302a, drain region 303a, source region 302b and drain region 303b in FIG. 12. Therefore, the thickness of the gate insulating film 306a shown in FIG. 14 is smaller than the thickness of the gate insulating film 306a shown in FIG. 13. In this way, a parasitic transistor Q301a and a parasitic transistor Q302a shown in FIGS. 16 and 17 to be described later are formed in a portion where the thickness of the gate insulating film 306a is smaller. In addition, the thickness of the gate insulating film 306b shown in FIG. 14 is smaller than the thickness of the gate insulating film 306b shown in FIG. 13. In this way, a parasitic transistor Q301b and a parasitic transistor Q302b shown in FIGS. 16 and 17 to be described later are formed in a portion where the thickness of the gate insulating film 306b is smaller. When the thickness of each of the gate insulating films 306a and 306b becomes smaller, a threshold voltage thereof is lowered. On the other hand, as shown in FIG. 12, since the width W10 of the drain region 303a is smaller than the width W9 of the source region 302a, the drain region 303a is not present in a portion where the gate insulating film 306a of FIG. 14 becomes thinner. In addition, since the width W10 of the drain region 303b is smaller than the width W9 of the source region 302b, the drain region 303b is not present in a portion where the gate insulating film 306b becomes thinner.

FIG. 15 is a perspective sectional view taken along line M-M of the semiconductor device 300 of FIG. 12, showing the transistor 300a. As shown in FIG. 15, the transistor 300a includes the source region 302a, the drain region 303a, the gate electrode 304a, the gate insulating film 306a and the semiconductor region 305. An end portion of the drain region 303a in the X direction is in no contact with the element isolation region 301. In addition, although a relationship in boundary portion between the source region 302a and the element isolation region 301 in the respect of a section is not shown in FIG. 15, an end portion of the source region 302a is in contact with the element isolation region 301.

FIG. 16 is a schematic plan view showing a relationship between a main transistor and a parasitic transistor of the semiconductor device 300 of FIG. 12. As shown in FIG. 16, the transistor 300a includes a main transistor Q300a, a parasitic transistor Q301a and a parasitic transistor Q302a. The transistor 300b includes a main transistor Q300b, a parasitic transistor Q301b and a parasitic transistor Q302b. The parasitic transistor Q301a and the parasitic transistor Q302a are formed at the boundary portion between the channel region ch and the element isolation region 301 in the Y direction of the transistor 300a, that is, the direction of the channel width W9 and the channel width W10. The parasitic transistor Q301b and the parasitic transistor Q302b are formed at the boundary portion between the channel region ch and the element isolation region 301 in the Y direction of the transistor 300b.

A parasitic transistor Q303 and a parasitic transistor Q304 are formed within the channel region ch between the element isolation region 301 and the drain region 303a and drain region 303b in the Y direction. The size of the parasitic transistor Q303 and the parasitic transistor Q304 is determined depending on an interval between the element isolation region 301 and the drain region 303a and drain region 303b.

The main transistor Q300a is formed in the channel region ch within the semiconductor region 305 where the main transistor Q300a is little affected by the parasitic transistors Q301a, Q302a, Q303 and Q304. The main transistor Q300b is formed in the channel region ch within the semiconductor region 305 where the main transistor Q300b is little affected by the parasitic transistors Q301b, Q302b, Q303 and Q304. In the semiconductor device 300, it is not possible to clearly delineate a boundary between the main transistors Q300a and 300b and the parasitic transistors Q301a, Q302a, Q301b, Q302b, Q303 and Q304. However, in the specification, for convenience of explanation, they are distinguished from each other in this way. The number of parasitic transistors is not limited to six but may be fewer or more.

FIG. 17 is a schematic equivalent circuit diagram of the semiconductor device 300 of FIG. 16. The sources and the gates of the parasitic transistors Q301a and Q302a are connected to the source and gate of the main transistor Q300a, respectively. The parasitic transistor Q301a is connected to the drain of the main transistor Q300a via the parasitic transistor Q303 and the parasitic transistor Q302a is connected to the drain of the main transistor Q300a via the parasitic transistor Q304. That is, the parasitic transistor Q301a and the parasitic transistor Q303 are connected in series, the parasitic transistor Q302a and the parasitic transistor Q304 are connected in series, and these two sets of serial connections and the main transistor Q300a are connected in parallel.

The sources and the gates of the parasitic transistors Q301b and Q302b are connected to the source and gate of the main transistor Q300b, respectively. The parasitic transistor Q301b is connected to the drain of the main transistor Q300b via the parasitic transistor Q303 and the parasitic transistor Q302b is connected to the drain of the main transistor Q300b via the parasitic transistor Q304. That is, the parasitic transistor Q301b and the parasitic transistor Q303 are connected in series, the parasitic transistor Q302b and the parasitic transistor Q304 are connected in series, and these two sets of serial connections and the main transistor Q300b are connected in parallel.

The sources of the main transistor Q300a and the parasitic transistors Q301a and Q302a form a common source S. The sources of the main transistor Q300b and the parasitic transistors Q301b and Q302b form a common source S. The gates of the main transistor Q300a, the parasitic transistors Q301a and Q302a, the main transistor Q300b, the parasitic transistors Q301b, Q302b, Q303 and Q304 form a common gate G. The drains of the main transistors Q300a and Q300b and the parasitic transistors Q303 and Q304 form a common drain D. The semiconductor device 300a is constituted by the common source S, the common drain D and the common gate G.

The gate thickness t300a of the main transistor Q300a is larger than the gate thickness t301a of the parasitic transistor Q301a and the gate thickness t302a of the parasitic transistor Q302a (t300a>t301a (t302a)). In this case, within a certain range of a gate width of the main transistor Q300a, threshold voltages of the parasitic transistors Q301a and Q302a may be lower than a threshold voltage of the main transistor Q300a. Unlike the gate thickness t300a of the main transistor Q300a, it is difficult to limit the gate thickness t301a of the parasitic transistor Q301a and the gate thickness t302a of the parasitic transistor Q302a to a certain range in manufacture.

The gate thickness t300b of the main transistor Q300b is larger than the gate thickness t301b of the parasitic transistor Q301b and the gate thickness t302b of the parasitic transistor Q302b (t300b>t301b (t302b)). In this case, within a certain range of a gate width of the main transistor Q300b, threshold voltages of the parasitic transistors Q301b and Q302b may be lower than a threshold voltage of the main transistor Q300b. Unlike the gate thickness t300b of the main transistor Q300b, it is difficult to limit the gate thickness t301b of the parasitic transistor Q301b and the gate thickness t302b of the parasitic transistor Q302b to a certain range in manufacture.

In addition, the gate thickness t303 of the parasitic transistor Q303 and the gate thickness t304 of the parasitic transistor Q304 are substantially equal to the gate thickness t300a of the main transistor Q300a and the gate thickness t300b of the main transistor Q300b. Therefore, threshold voltages of the parasitic transistors Q303 and Q304 are substantially equal to the threshold voltages of the main transistors Q300a and Q300b.

Channel surface potentials of the parasitic transistors Q301a and Q302a are different from a channel surface potential of the main transistor Q300a. In addition, channel surface potentials of the parasitic transistors Q301b and Q302b are different from a channel surface potential of the main transistor Q300b. On the other hand, channel surface potentials of the parasitic transistors Q303 and Q304 are substantially equal to the channel surface potentials of the main transistors Q300a and Q300b. Since the parasitic transistors Q301a, Q302a, Q301b and Q302b have a low threshold voltage, in a state where a gate-source voltage (Vgs) is low, the channel surface potentials of the parasitic transistors Q301a, Q302a, Q301b and Q302b are inverted more easily than those of the main transistors Q300a and Q300b and the parasitic transistors Q303 and Q304. Therefore, the parasitic transistors Q301a, Q302a, Q301b and Q302b are in a state in which a current is more likely to flow than the main transistors Q300a and Q300b and the parasitic transistors Q303 and Q304. However, since the parasitic transistors Q301a, Q301b and Q303 are connected in series and the parasitic transistors Q302a, Q302b and Q304 are connected in series, the parasitic transistors Q303 and Q304 inhibit the current of the parasitic transistors Q301a, Q302a, Q301b and Q302b.

As described above, the semiconductor device 300 includes the parasitic transistors Q301a, Q302a, Q301b and Q302b. However, since the parasitic transistors Q303 and Q304 are formed between the drain region 303a and the parasitic transistor Q301a and Q301b and between the drain region 303a and the parasitic transistor Q302a and Q302b, respectively, even when the surface potentials of the parasitic transistors Q301a, Q302a, Q301b and Q302b are inverted at the gate-source voltage (Vgs), the surface potentials of the parasitic transistors Q303 and Q304 are not inverted at the gate-source voltage (Vgs) more easily than those of the parasitic transistors Q301a, Q302a, Q301b and Q302b. Therefore, no reverse channel effect occurs and no hump (kink) phenomenon occurs accordingly. Thereby, a transistor is not conducted at a gate voltage lower than a desired surface potential, which contributes to reduction in a leak current of an off state. In addition, since the channel width W10 of the drain region 303a need only be shorter than the channel width W9 of the source region 302a and the channel width W10 of the drain region 303b need only be shorter than the channel width W9 of the source region 302b, what to change is only a mask layout, which eliminates the complexity of a manufacturing process without increasing the number of manufacturing processes.

In the third embodiment of the present disclosure, since the upper portion of the semiconductor region 305 between the drain regions 303a and 303b and the element isolation region 301 is covered with the gate insulating films 306a and 306b and the gate electrodes 304a and 304b, even when wirings are disposed over the semiconductor device 300, there occurs no field inversion due to an effect of an electric field other than a potential applied to a drain, a source, a gate and a back gate of a transistor. Therefore, it is possible to more reliably prevent electrical conduction at a low threshold voltage by a parasitic transistor, make it harder to produce a reverse narrow channel effect, and more reliably prevent a hump (kink) phenomenon.

Fourth Embodiment

Figure 18:
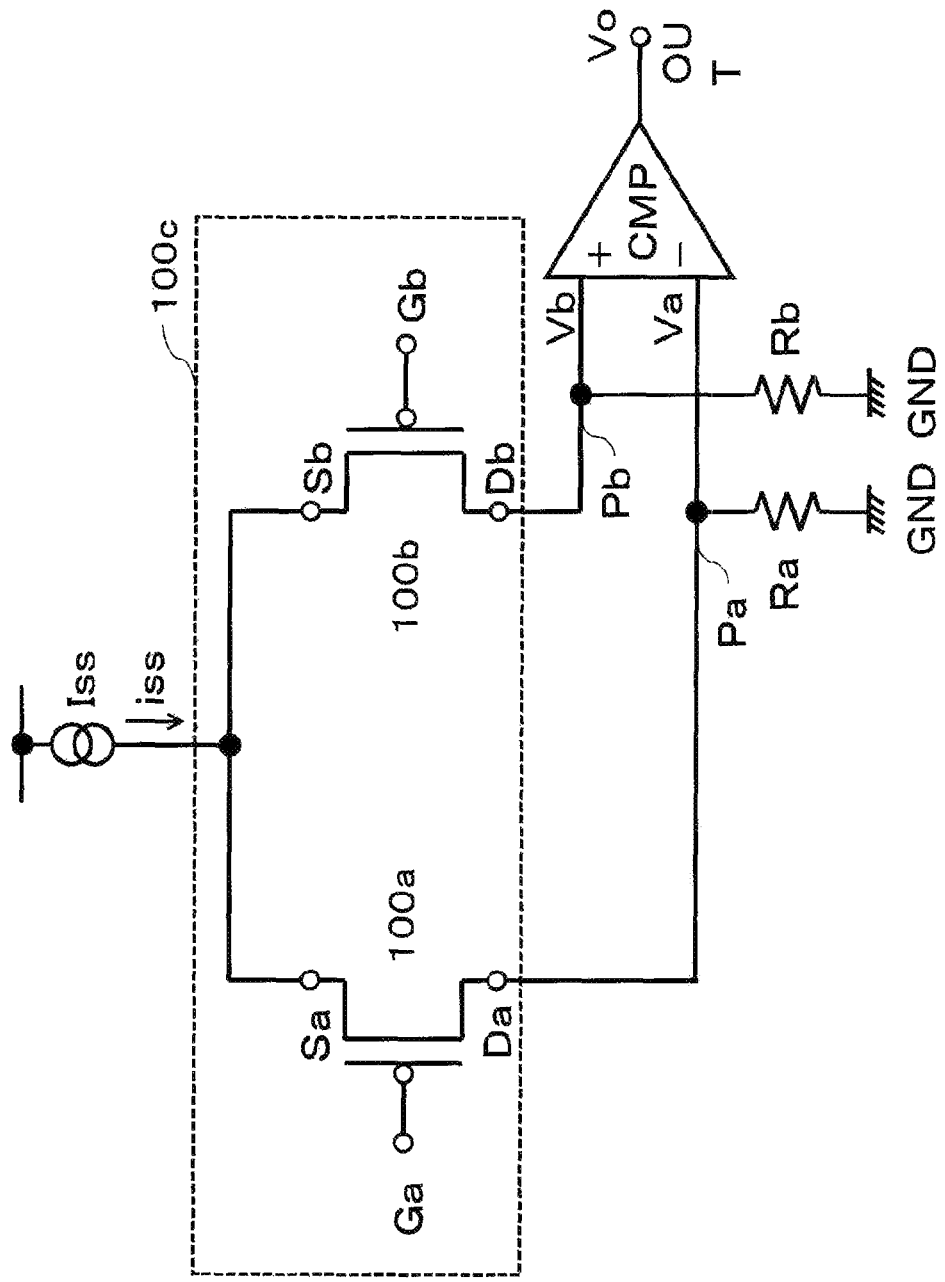
FIG. 18 is a circuit diagram illustrating one example where the semiconductor device according to the first to third embodiments of the present disclosure is used in a semiconductor integrated circuit.

Next, a fourth embodiment of the present disclosure will be described with reference to the drawings. FIG. 18 is a schematic circuit diagram illustrating the configuration of a semiconductor integrated circuit according to a fourth embodiment of the present disclosure. The semiconductor integrated circuit of FIG. 18 is one example of application of the semiconductor device described in the first to third embodiments to a semiconductor integrated circuit. The semiconductor device described in the first to third embodiments is employed for, e.g., a differential transistor pair, a differential amplifier, a current mirror circuit, a comparator, an operational amplifier and so on and is built in a semiconductor integrated circuit. The differential transistor pair is the generic term of a circuit which is constituted by two transistors of the same conductivity type and is operated in response to a difference in input signal, input voltage and input current between the two transistors. The differential amplifier consists mainly of the differential transistor pair and may further include another differential transistor pair, a constant current source, a resistor and a capacitor. The comparator consists basically of a plurality of (one or more) differential amplifiers. These configurations and logic circuits and so on may be included in the semiconductor integrated circuit of the present disclosure.

The application of semiconductor device according to the present disclosure to the semiconductor integrated circuit may be also made to, e.g., a CMOS circuit which uses no differential transistor pair. For example, an NMOS transistor and a PMOS transistor serving as the semiconductor device of the present disclosure may be prepared according to one of the first to third embodiments, a CMOS circuit may be formed by the semiconductor device, and a semiconductor integrated circuit may be constructed by the CMOS circuit. A CMOS inverter is representative of the CMOS circuit. The CMOS inverter can perform a stable circuit operation with reduced variations of element characteristics from a weak inversion region (pentode region or sub-threshold region) to a strong inversion region (triode region) in an operation region of a MOS transistor while excluding the hump (kink) phenomenon. To summarize, the semiconductor device according to the present disclosure can be applied to the general semiconductor integrated circuit including at least two transistors on a semiconductor substrate.

FIG. 18 is a circuit diagram including a differential transistor pair 100c consisting of a P-type MOS transistor 100a and a P-type MOS transistor 100b. In typical, the MOS transistor 100a and the MOS transistor 100b require the complete electrical characteristics. The MOS transistor 100a has a source Sa, a drain Da and a gate Ga. The MOS transistor 100b is of the same conductivity type as the MOS transistor 100a and has a source Sb, a drain Db and a gate Gb. The source Sa of the MOS transistor 100a and the source Sb of the MOS transistor 100b are connected in common to a constant current source Iss. A constant current iss from the constant current source Iss is supplied to the source Sa of the MOS transistor 100a and the source Sb of the MOS transistor 100b. Instead of the constant current iss by the constant current source Iss, a current may be supplied through a resistor or the like connected to a supply voltage (not shown) or any voltage (not shown).

The drain Da of the MOS transistor 100a is connected to a ground potential GND via a wiring Pa and a load resistor Ra and the drain Db of the MOS transistor 100b is connected to the ground potential GND via a wiring Pb and a load resistor Rb. In addition, the drain Da of the MOS transistor 100a is connected to an inverting input terminal (−) of a comparator CMP and the drain Db of the MOS transistor 100b is connected to a noninverting input terminal (+) of the comparator CMP. A differential amplifier is constituted by the MOS transistor 100a, the MOS transistor 100b, the load resistor Ra and the load resistor Rb. In addition, a current mirror circuit, a diode or the like may be used as a load corresponding to the load resistor Ra and the load resistor Rb.

A first differential pair output Va is applied to the inverting input terminal (−) of the comparator CMP and a second differential pair output Vb is applied to the noninverting input terminal (+) of the comparator CMP. The magnitude of the first differential pair output Va and the second differential pair output Vb is determined depending on the magnitude of the constant current iss supplied from the constant current source Iss and the size of the load resistor Ra and the load resistor Rb. The magnitude of the first differential pair output Va and the second differential pair output Vb is determined according to a difference between an input voltage applied to the gate Ga of the MOS transistor 100a and an input voltage applied to the gate Gb of the MOS transistor 100b. When a potential of the gate Ga is sufficiently lower than a potential of the gate Gb, most of the constant current iss flows into the MOS transistor 100a. Therefore, since the first differential pair output Va becomes sufficiently larger than the second differential pair output Vb, the second differential pair output Vb becomes nearly zero. When the potential of the gate Gb is sufficiently lower than the potential of the gate Ga, most of the constant current iss flows into the MOS transistor 100b. Therefore, since the second differential pair output Vb becomes sufficiently larger than the first differential pair output Va, the first differential pair output Va becomes nearly zero.

An output voltage Vo is output from an output terminal OUT of the comparator CMP. The output voltage Vo has a high level H or a low level L depending on the magnitude of the first differential pair output Va and the second differential pair output Vb. When the first differential pair output Va is larger than the second differential pair output Vb, the output voltage Vo has the low level L. When the second differential pair output Vb is larger than the first differential pair output Va, the output voltage Vo has the high level H.

Although the detailed circuit configuration of the comparator CMP is not shown, a differential transistor pair similar to the MOS transistor 100a and the MOS transistor 100b is included, as a part of the circuit configuration, in the comparator CMP. In other words, the inverting input terminal (−) and noninverting input terminal (+) of the comparator CMP are connected to one gate G and the other gate G of the differential transistor pair, respectively. Therefore, the comparator CMP is one semiconductor integrated circuit including the differential transistor pair. Further, the comparator CMP includes a differential amplifier. The differential amplifier is configured to vary the differential pair output Va and the differential pair output Vb by controlling a potential difference between the gate Ga of the MOS transistor 100a and the gate Gb of the MOS transistor 100b, with the differential pair output Va and the differential pair output Vb as an output of the differential amplifier. In addition, the resistor used to generate the differential pair output Va and the differential pair output Vb may be one which can convert a current into a voltage, such as an active load, a diode or the like. A current of each of the drain Da of the MOS transistor 100a and the drain Db of the MOS transistor 100b is a current output of the differential amplifier.

In the semiconductor integrated circuit schematically shown in FIG. 18 including the differential transistor pair, the differential amplifier and the comparator CMP, the differential pair output Va and the differential pair output Vb can be measured by varying the input voltage applied to the gate Ga of the MOS transistor 100a and the gate Gb of the MOS transistor 100b. In addition, a current difference output from the drain in accordance with the mutual conductance gm of the transistor is converted into a voltage by impedance connected to the drain and, e.g., a ground potential and, in typical, the potential difference between the gate Ga of the MOS transistor 100a and the gate Gb of the MOS transistor 100b can be amplified and output. Therefore, the potential difference between the gate Ga of the MOS transistor 100a and the gate Gb of the MOS transistor 100b can be detected by the comparator CMP. The potential difference between the gate Ga of the MOS transistor 100a and the gate Gb of the MOS transistor 100b can be amplified.

In the semiconductor integrated circuit according to the fourth embodiment of the present disclosure, an operation region of the MOS transistor may be a linear region, i.e., a weak inversion region in the respect of power saving. The weak inversion region is also called a sub-threshold region.

When a transistor having a STI structure or a DTI structure in the related art is applied to a semiconductor integrated circuit such as a current mirror circuit, a differential amplifier, a comparator, an operational amplifier, a logic circuit or the like, since the hump (kink) phenomenon may occur as described previously, it is difficult to adjust a current flown into the MOS transistor to a predetermined amount. Such a hump (kink) phenomenon is the cause of a reverse narrow channel effect.

In the semiconductor integrated circuit according to the fourth embodiment of the present disclosure, since the MOS transistor in which no hump (kink) phenomenon occurs is used, it is possible to adjust a current flown into the MOS transistor to a predetermined amount. That is, according to the semiconductor integrated circuit of the fourth embodiment of the present disclosure, it is possible to perform an operation supposed in manufacture and circuit design even in the weak inversion region.

Figure 19:
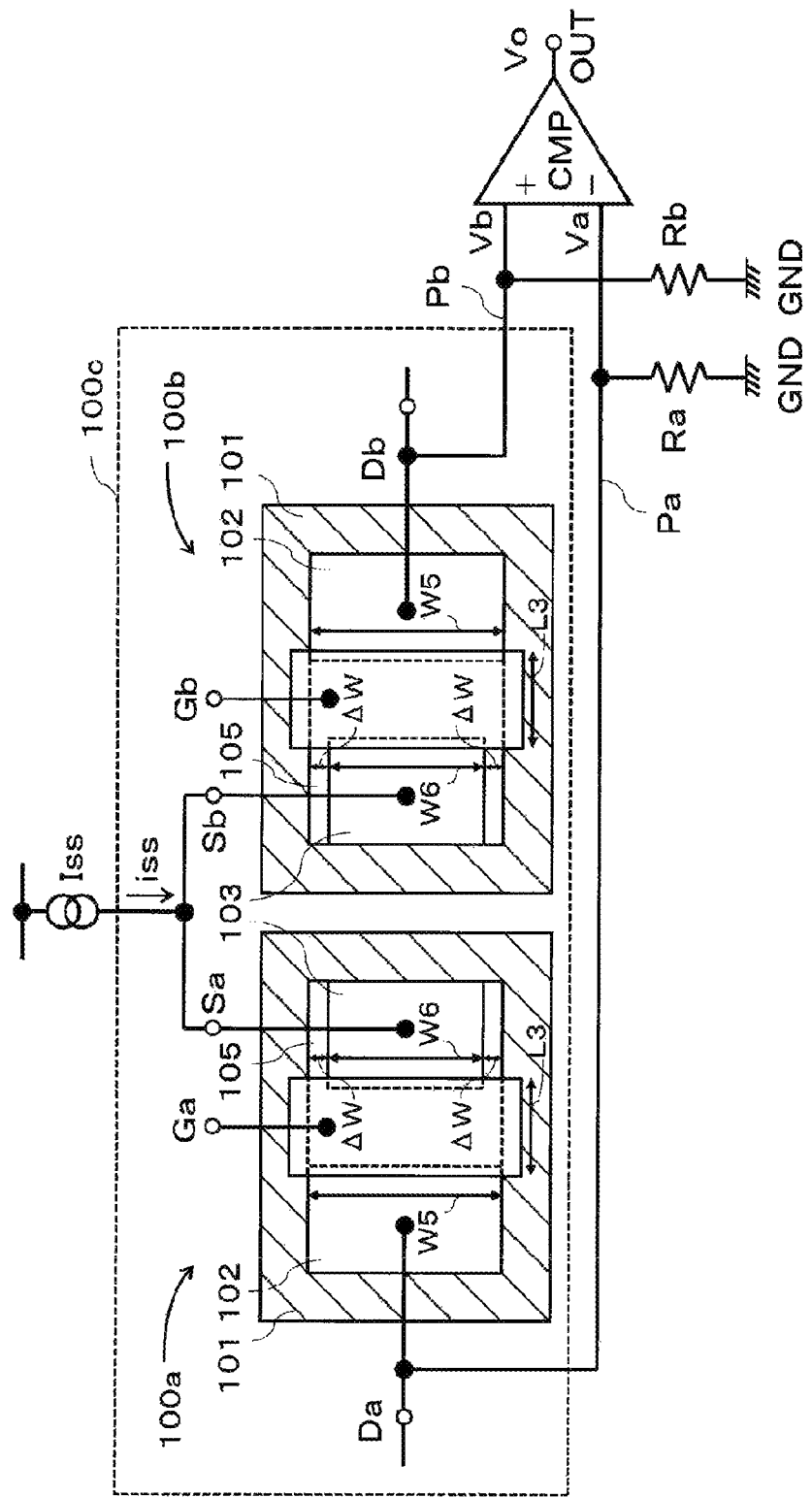
FIG. 19 is a schematic view illustrating a differential transistor pair depicted in plane in the semiconductor integrated circuit illustrated in FIG. 18.

FIG. 19 also illustrates a semiconductor circuit according to the fourth embodiment of the present disclosure. An essential difference with FIG. 18 is that the MOS transistor 100a and the MOS transistor 100b constituting the differential transistor pair 100c are depicted in plane and other circuit configurations are denoted by circuit symbols like FIG. 18. FIG. 19 is useful to more clearly explain the structural features of the MOS transistor 100a and the MOS transistor 100b according to the present disclosure and simplify other depictions.

In FIG. 19, the MOS transistor 100a and the MOS transistor 100b are arranged next to each other or in proximity to make alignment of the electrical characteristics of the differential transistor pair. Such arrangement is adopted well before now. Here, the electrical characteristics of the differential transistor pair may include, e.g., a threshold voltage of the MOS transistor, electrical characteristics between a gate-source voltage Vgs and a drain current Id, characteristics between a gate-source voltage and a drain current, a conductance gm of the MOS transistor, etc. The conductance gm is the electrical characteristic indicating a change in drain current Id with respect to a change in gate-source voltage Vgs. These electrical characteristics are not so affected in a semiconductor integrated circuit constituted by a combination of unit MOS transistors but are significantly affected in a semiconductor integrated circuit consisting mainly of a differential transistor pair.

In FIG. 19, the channel width W5 of the MOS transistor 100a is larger than the channel width W6 thereof. In other words, the channel width W6 is smaller than the channel width W5 by a channel width ΔW in each of two end portions in the long side direction thereof. That is, the channel width W6 and the channel width W5 have the relationship of W6=W5−2ΔW.

The MOS transistor 100a includes a source region 102 and a drain region 103. Both end portions of the drain region 103 in the direction of the channel width W6 are in no contact with an element isolation region 101 since they have an interval of predetermined channel width ΔW from the element isolation region 101. One end of the drain region 103 in the direction of the channel length L3 is in contact with the element isolation region 101. Both end portions of the source region 102 in the direction of the channel width W5 are in contact with the element isolation region 101, unlike the drain region 103. One end portion of the source region 102 in the direction of the channel length L3 is also in contact with the element isolation region 101. Such a configuration is substantially the same as the configuration of the semiconductor device 100 shown in FIG. 1. In addition, the source region 102 and the drain region 103 in the direction of the channel length L3 may not be in contact with the element isolation region 101.

The MOS transistor 100b has the same configuration as the MOS transistor 100a. That is, the MOS transistor 100b has also a source region 102 and a drain region 102. Both end portions of the drain region 103 in the direction of the channel width W6 are in no contact with an element isolation region 101 since they have an interval of predetermined channel width ΔW from the element isolation region 101. One end of the drain region 103 in the direction of the channel length L3 is in contact with the element isolation region 101. Both end portions of the source region 102 in the direction of the channel width W5 are in contact with the element isolation region 101, unlike the drain region 103. One end portion of the source region 102 in the direction of the channel length L3 is also in contact with the element isolation region 101. Such a configuration is substantially the same as the configuration of the semiconductor device 100 shown in FIG. 1. In addition, the source region 102 and the drain region 103 in the direction of the channel length L3 may not be in contact with the element isolation region 101.

FIG. 19 illustrates a circuit forming a differential transistor pair 100c with a P-type MOS transistor 100a and a P-type MOS transistor 100b. The MOS transistor 100a has a source Sa, a drain Da and a gate Ga. The MOS transistor 100b is of the same conductivity type as the MOS transistor 100a and has a source Sb, a drain Db and a gate Gb. The source Sa of the MOS transistor 100a and the source Sb of the MOS transistor 100b are connected in common to a constant current source Iss. Instead of the constant current iss by the constant current source Iss, a current may be supplied through a resistor or the like connected to a supply voltage (not shown) or any voltage (not shown).

The drain Da of the MOS transistor 100a is connected to a ground potential GND via a wiring Pa and a load resistor Ra and the drain Db of the MOS transistor 100b is connected to the ground potential GND via a wiring Pb and a load resistor Rb. In addition, the drain Da of the MOS transistor 100a is connected to an inverting input terminal (−) of a comparator CMP and the drain Db of the MOS transistor 100b is connected to a noninverting input terminal (+) of the comparator CMP. A differential amplifier is constituted by the MOS transistor 100a, the MOS transistor 100b, the load resistor Ra and the load resistor Rb. In addition, a current mirror circuit, a diode or the like may be used as a load corresponding to the load resistor Ra and the load resistor Rb.

A first differential pair output Va is applied to the inverting input terminal (−) of the comparator CMP and a second differential pair output Vb is applied to the noninverting input terminal (+) of the comparator CMP. The magnitude of the first differential pair output Va and the second differential pair output Vb is determined depending on the magnitude of the constant current iss supplied from the constant current source Iss and the size of the load resistor Ra and the load resistor Rb. The magnitude of the first differential pair output Va and the second differential pair output Vb is determined according to a difference between an input voltage applied to the gate Ga of the MOS transistor 100a and an input voltage applied to the gate Gb of the MOS transistor 100b. When a potential of the gate Ga is sufficiently lower than a potential of the gate Gb, most of the constant current iss flows into the MOS transistor 100a. Therefore, since the first differential pair output Va becomes sufficiently larger than the second differential pair output Vb, the second differential pair output Vb becomes nearly zero. When the potential of the gate Gb is sufficiently lower than the potential of the gate Ga, most of the constant current iss flows into the MOS transistor 100b. Therefore, since the second differential pair output Vb becomes sufficiently larger than the first differential pair output Va, the first differential pair output Va becomes nearly zero.

An output voltage Vo is output from an output terminal OUT of the comparator CMP. The output voltage Vo has a high level H or a low level L depending on the magnitude of the first differential pair output Va and the second differential pair output Vb. When the first differential pair output Va is larger than the second differential pair output Vb, the output voltage Vo has the low level L. When the second differential pair output Vb is larger than the first differential pair output Va, the output voltage Vo has the high level H.

In the semiconductor integrated circuit according to the fourth embodiment of the present disclosure, since the MOS transistor in which no hump (kink) phenomenon occurs is used, it is possible to adjust a current flown into the MOS transistor to a predetermined amount. That is, according to the semiconductor integrated circuit of the fourth embodiment of the present disclosure, it is possible to perform a stable operation even in the weak inversion region. Here, the "stable operation" refers to that Vgs and Id are generally expressed by an exponential function in the weak inversion region in a situation where a temperature, a potential, a change in physical structure and dimension of an element, etc. other than Vgs are negligible, increase in log(Id) with increase in Vgs is substantially linearly monotonous, and a rate of change in Id with respect to a variation of Vgs is substantially constant. A circuit operating point is changed a variation of temperature at which the semiconductor integrated circuit is placed, each of elements constituting the semiconductor integrated circuit, etc. In the specification an "amplification factor" refers to a mutual conductance gm, that is, a rate of change in drain current ids with respect to a change in gate-source voltage Vgs (Δids/ΔVgs). In the following description, the "stable operation" means that the mutual conductance gm, that is, the amplification factor, is established in the weak inversion region on the relation of exponential function of Vgs and Id, and on the relationship that increase in log(Id) with increase in Vgs is substantially linearly monotonous and a rate of change in Id with respect to a variation of Vgs is substantially constant.

In a MOS-type circuit, there is a case where a substrate of a MOS transistor is connected to a source electrode, a ground terminal (low potential terminal) or any voltage source. The MOS transistor built in the semiconductor integrated circuit has a substrate electrode in addition to three electrodes of the source, the drain and the gate. Depending on how to treat the substrate electrode, the MOS transistor receives a physical effect called a substrate bias effect (back gate effect). The follow description will be given to a relationship between the substrate bias effect (back gate effect) and the hump (kink) phenomenon.

Figure 20:
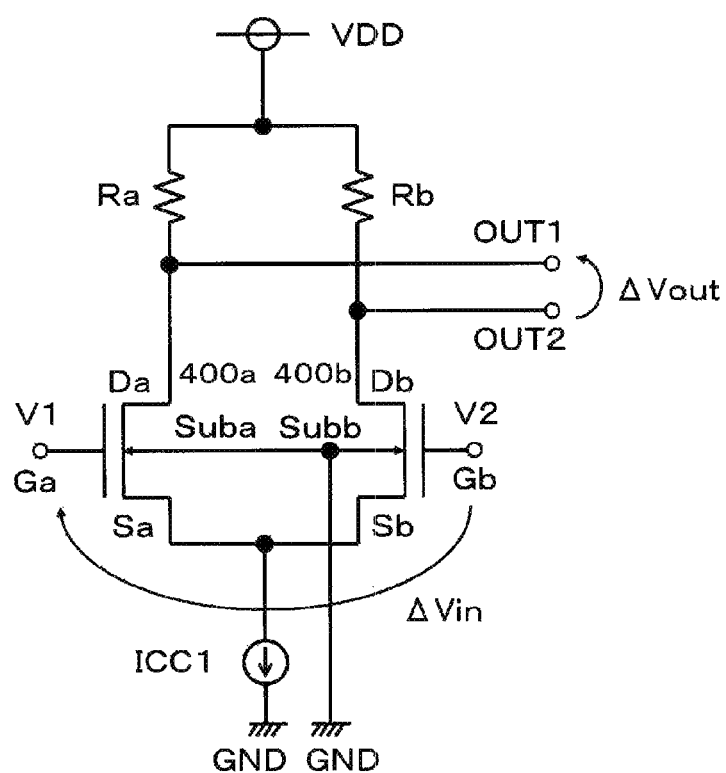
FIG. 20 is a circuit diagram illustrating one example where the semiconductor device according to the first to third embodiments of the present disclosure is used in a differential amplifier or differential comparator.

FIG. 20 illustrates a differential amplifier or differential comparator constituted by an MMOS transistor 400a and an NMOS transistor 400b in the related art. The NMOS transistor 400a has a drain Da, a gate Ga, a source Sa and a substrate electrode Suba. Like the NMOS transistor 400a, the NMOS transistor 400b has a drain Db, a gate Gb, a source Sb and a substrate electrode Subb. The drain Da of the NMOS transistor 400a and the drain Db of the NMOS transistor 400b are connected in common to a power terminal (high level terminal) VDD via a resistor Ra and a resistor Rb, respectively. An input voltage V1 is supplied to the gate Ga of the NMOS transistor 400a. An input voltage V2 is supplied to the gate Gb of the NMOS transistor 400b. The source Sa of the NMOS transistor 400a and the source Sb of the NMOS transistor 400b are connected in common to a constant current source ICC1.

The substrate electrode Suba of the NMOS transistor 400a and the substrate electrode Subb of the NMOS transistor 400b are connected in common to a ground terminal (low potential terminal) GND. That is, FIG. 20 shows a case where the substrate electrode Suba and the substrate electrode Subb of the differential amplifier or differential comparator are connected to the ground terminal (low potential terminal). However, the substrate electrode Suba and the substrate electrode Subb may be connected to a potential different from the source Sa of the NMOS transistor 400a and the source Sb of the NMOS transistor 400b, rather than the ground terminal (low potential terminal) GND.

The drain Da of the NMOS transistor 400a is connected to an output terminal OUT1. The drain Db of the NMOS transistor 400b is connected to an output terminal OUT2. The differential amplifier or differential comparator outputs a differential output voltage ΔVout in response to a difference voltage ΔVin between the input voltage V1 and the input voltage V2.

As shown in FIG. 20, when the substrate electrode is connected to the ground terminal (low potential terminal) GND or even when the substrate electrode is connected to other voltage source, the hump (kink) phenomenon occurs in the differential amplifier or differential comparator using the NMOS transistor of the related art of FIG. 20. However, no hump (kink) phenomenon occurs in the differential amplifier or differential comparator using the NMOS transistor of the first to third embodiments of the present disclosure. Therefore, it is possible to obtain the "stable operation" in the differential amplifier or differential comparator.

Figure 21:
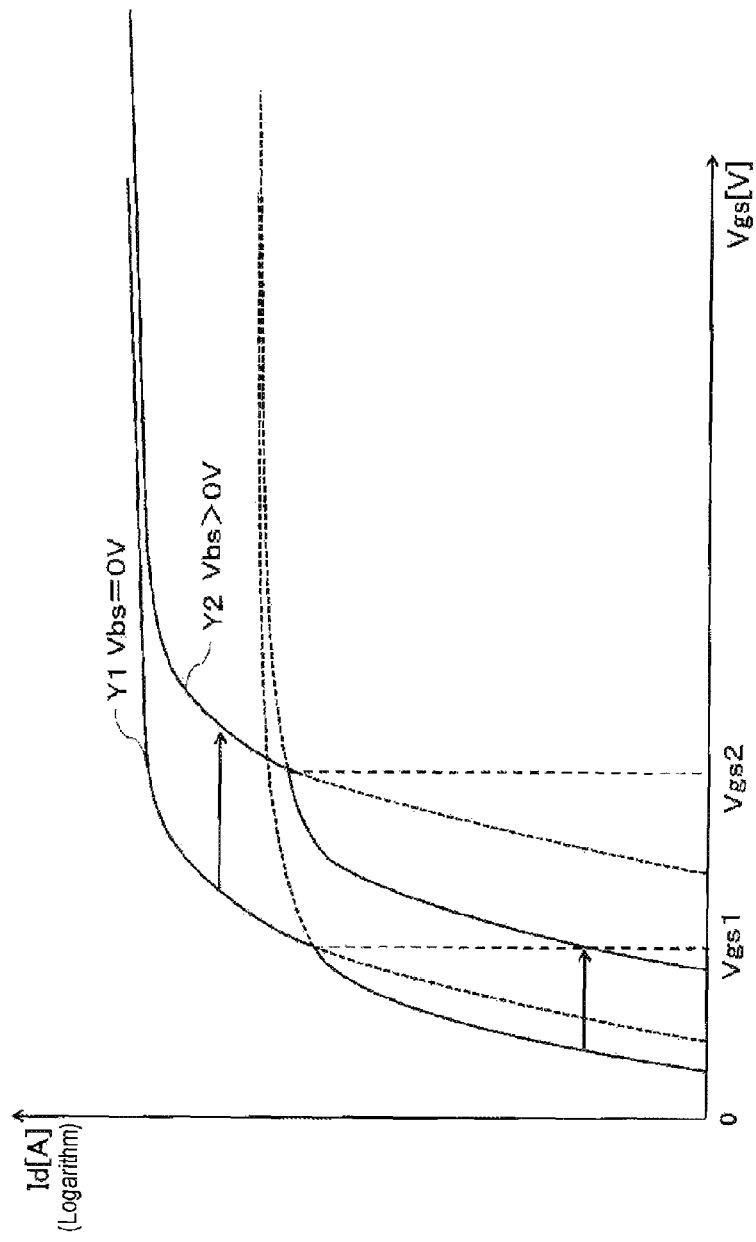
FIG. 21 is a graph showing a gate-source voltage (Vgs)-drain current (Id) characteristic of the semiconductor device of FIG. 20.

FIG. 21 illustrates a relationship between the gate-source voltage (Vgs) and the drain current (Id) in a case where a potential difference between the substrate electrode Suba (Subb) and the source Da (Sb) of the differential amplifier or differential comparator of FIG. 20, that is, the back gate bias Vbs, is set to 0V and a case where the back gate bias Vbs is set to be higher than 0V. In the figure, symbol Y1 schematically shows a case where the back gate bias Vbs is set to 0V and symbol Y2 schematically shows a case where the back gate bias Vbs is set to be higher than 0V.

As shown in FIG. 21, when the back gate bias Vbs is increased from 0V, a threshold voltage is changed while a hump (lump) is being changed. Although this substrate bias effect is differently affected by gate oxide film capacitance, depletion layer capacitance which occurs in a channel substrate, etc., in general, as a threshold value of a transistor becomes higher, the amount of increase in the threshold value becomes larger with increase in the back gate bias. Therefore, when a threshold value of a parasitic transistor and a threshold value of a main transistor are different from each other, a variation of the threshold value of the main transistor and a variation of the threshold value of the parasitic transistor by a change in the back gate bias are different from each other. When the threshold value of the parasitic transistor is smaller than the threshold value of the main transistor, a relative position between Vgs-Id characteristic curves is changed by the increase in the back gate bias, as shown in FIG. 21, and the shape of a Vgs-Id characteristic curve obtained by combining both curves. Therefore, the mutual conductance gm (ΔId/ΔVgs) is changed by the potentials of the input voltage V1 and the input voltage V2 and a relationship between the difference voltage ΔVin between the input voltage V1 and the input voltage V2 and the output voltage difference ΔVout is distorted. Therefore, a differential amplifier or differential comparator having such characteristics is unfavorable. However, in the differential amplifier or differential comparator using the semiconductor device of the first to third embodiments of the present disclosure, since no hump (kink) phenomenon occurs, it is possible to obtain the "stable operation" even when the back gate bias Vbs is set to be equal to or higher than 0V.

Figure 22:
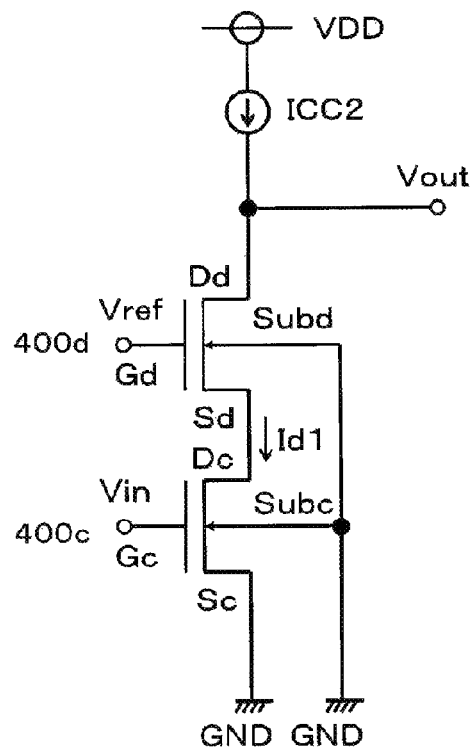
FIG. 22 is a circuit diagram illustrating a configuration where the semiconductor device according to the first to third embodiments of the present disclosure is used in a cascode circuit.

FIG. 22 illustrates a MOS-type circuit (cascode circuit) typically called a cascode connection. The cascode connection is commonly often used as one way to increase a voltage gain Gv (=Vout/Vin). The cascode connection in the related art of FIG. 22 includes an NMOS transistor 400c, an NMOS transistor 400d and a constant current source ICC2 in the related art. The NMOS transistor 400c has a drain Dc, a gate Gc, a source Sc and a substrate electrode Subc. The NMOS transistor 400d has a drain Dd, a gate Gd, a source Sd and a substrate electrode Subd.

The source Sc of the NMOS transistor 400c is connected to a ground terminal (low potential terminal) GND. The drain Dc of the NMOS transistor 400c is connected to the source Sd of the NMOS transistor 400d. The drain Dd of the NMOS transistor 400d is connected to the constant current source ICC2. An output voltage Vout is taken out from the drain Dd of the NMOS transistor 400d. An input voltage Vin is applied to the gate Gc of the NMOS transistor 400c. A predetermined reference voltage Vref is applied to the gate Gd of the NMOS transistor 400d. The substrate electrode Subc of the NMOS transistor 400c and the substrate electrode Subd of the NMOS transistor 400d are connected in common to the ground terminal (low potential terminal) GND.

In the cascode connection in the related art shown in FIG. 22, a change in drain current Id1 occurring due to a variation of the input voltage Vin appears as a change in voltage by output impedance in the side of the drain Dc of the NMOS transistor 400c. This change in voltage is suppressed by gate ground of the gate Gd of the NMOS transistor 400d and a variation of the output impedance is suppressed to prevent the voltage gain Gv from being reduced. However, if the hump (kink) phenomenon occurs in the NMOS transistor 400d, a change in drain voltage of the NMOS transistor 400c with respect to a change in drain current ID1 of the NMOS transistor 400c is distorted due to the hump (kink) phenomenon, which leads to a variation of the output impedance, appearing as a change in voltage gain Gv. Like the differential amplifier or differential comparator shown in FIG. 20, in a case where a cascode connection is constituted in a semiconductor device (transistor) from which the hump (kink) phenomenon is not excluded and a substrate electrode is used as a back gate, a distortion may occur in the voltage gain Gv, making it difficult to exclude defects or errors from the semiconductor device.

In the circuit operations of the differential amplifier or differential comparator shown in FIG. 20 and the cascode connection shown in FIG. 22, in a case where a substrate electrode is used as a back gate, the hump (kink) phenomenon is greatly affected by the magnitude of back gate bias, as described above. In the semiconductor device of the first to third embodiments of the present disclosure, since the hump (kink) phenomenon can be excluded, it is possible to exclude a distortion of voltage control without depending on the presence or not of the substrate bias effect (back gate effect). In addition, in semiconductor integrated circuits and MOS-type circuits of other embodiments (described below) using the semiconductor device of the first to third embodiments of the present disclosure, the same effects as the differential amplifier or differential comparator shown in FIG. 20 and the cascode connection shown in FIG. 22 are achieved, although the substrate bias effect (back gate effect) is not mentioned.

Other Embodiments

While one example where the semiconductor device according to the first to third embodiments of the present disclosure is used in the semiconductor integrated circuit has been described with reference to FIGS. 18 and 19, the following description will be given to cases where the semiconductor device according to the first to third embodiments of the present disclosure is used in MOS-type circuits and other general semiconductor integrated circuits.

Figure 23:
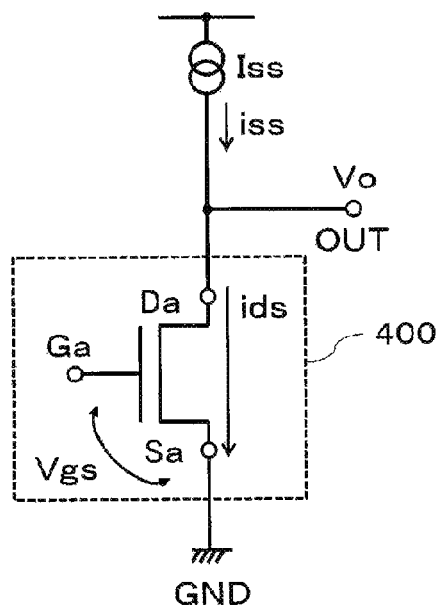
FIG. 23 is a circuit diagram illustrating a configuration where the semiconductor device according to the first to third embodiments of the present disclosure is used in a MOS-type circuit.

FIG. 23 illustrates an example where the semiconductor device according to the present disclosure is used in a MOS-type circuit. For convenience of explanation, the MOS-type circuit has a very simple structure consisting of one NMOS transistor and one constant current source. The NMOS transistor 400 has a drain Da, a gate Ga and a source Sa. The source Sa is connected to a ground terminal (low potential terminal) GND and the drain Da is connected to the constant current source Iss. A constant current iss is supplied from the constant current source Iss to the NMOS transistor 400. An output terminal OUT is connected to the drain Da and an output Vo depending on an input signal or input voltage (not shown) applied to the gate Ga is taken out from the output terminal OUT.

A drain current ids flowing through the NMOS transistor 400 is equal to the constant current iss. A gate-source voltage Vgs of the NMOS transistor 400 is uniquely determined depending on the magnitude of the drain current ids. Since no hump phenomenon occurs, the semiconductor device of the present disclosure can minimize a change in ratio of change in gate-source voltage Vgs to change in drain current ids, in other words, a change in ratio of change in drain current ids to change in gate-source voltage Vgs, that is, in the mutual conductance gm (Δids/ΔVgs). Since the change in mutual conductance gm is small, a distortion can be suppressed even when the MOS-type circuit is used as either a linear circuit or a digital circuit.

On the other hand, when a semiconductor device in which the hump phenomenon appears is used in the MOS-type circuit, since the ratio of change in drain current ids to change in gate-source voltage Vgs, that is, the mutual conductance gm (Δids/ΔVgs), is greatly fluctuated in a current region where the hump phenomenon occurs and other current regions before and after the region, there is a problem that a distortion occurring in a voltage or current signal becomes large.

Figure 24:
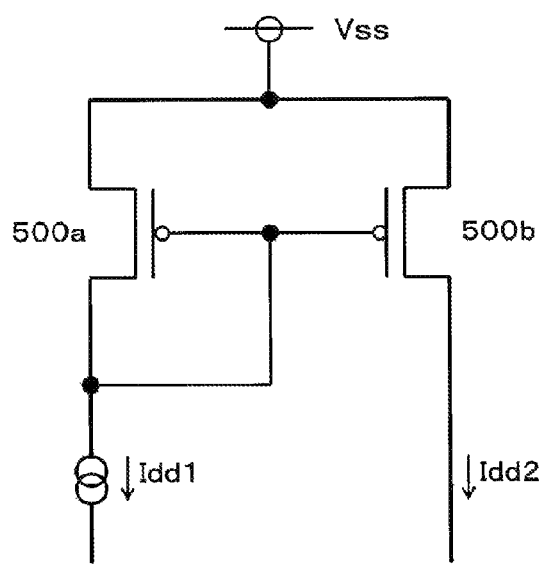
FIG. 24 is a circuit diagram illustrating a configuration where the semiconductor device according to the first to third embodiments of the present disclosure is used in a current mirror circuit.

FIG. 24 is a circuit diagram illustrating one example configuration where the semiconductor device according to the first to third embodiments of the present disclosure is used in a current mirror circuit (semiconductor integrated circuit).

The current mirror circuit of FIG. 24 includes a PMOS transistor 500*a*, a PMOS transistor 500*b* and a constant current source Idd1. A source of the PMOS transistor 500*a* and a source of the PMOS transistor 500*b* are connected in common to a power terminal (high level terminal) Vss. A gate and a drain of the PMOS transistor 500*a* and a gate of the PMOS transistor 500*b* are connected to a common node which is connected to the constant current source Idd1. A current Idd2 is flown into a drain of the PMOS transistor 500*b* by a current of the constant current source Idd1.

Since a MOS transistor in which no hump (kink) phenomenon occurs is used in the current mirror circuit of FIG. 24, a current flowing through the MOS transistor can be adjusted to a predetermined size. That is, the current mirror circuit of FIG. 24 can perform a stable operation particularly in a weak inversion region (pentode region or sub-threshold region) which is a region having a relatively small current.

It cannot be said that the current mirror circuit of FIG. 24 uses a differential transistor pair. However, the PMOS transistor 500*a* and the PMOS transistor 500*b* require substantially complete electrical characteristics. Therefore, the current mirror circuit of FIG. 24 requires substantially the same characteristics as a circuit using a differential transistor pair. This is equivalent to that the substantially complete electrical characteristics of the PMOS transistors 100*a* and 100*b* of FIG. 18 are required. Therefore, the semiconductor device according to the present disclosure is particularly suitable to the general semiconductor integrated circuits requiring the complete electrical characteristics of a plurality of semiconductor elements, as well as the circuit using the differential transistor pair.

Figure 25:
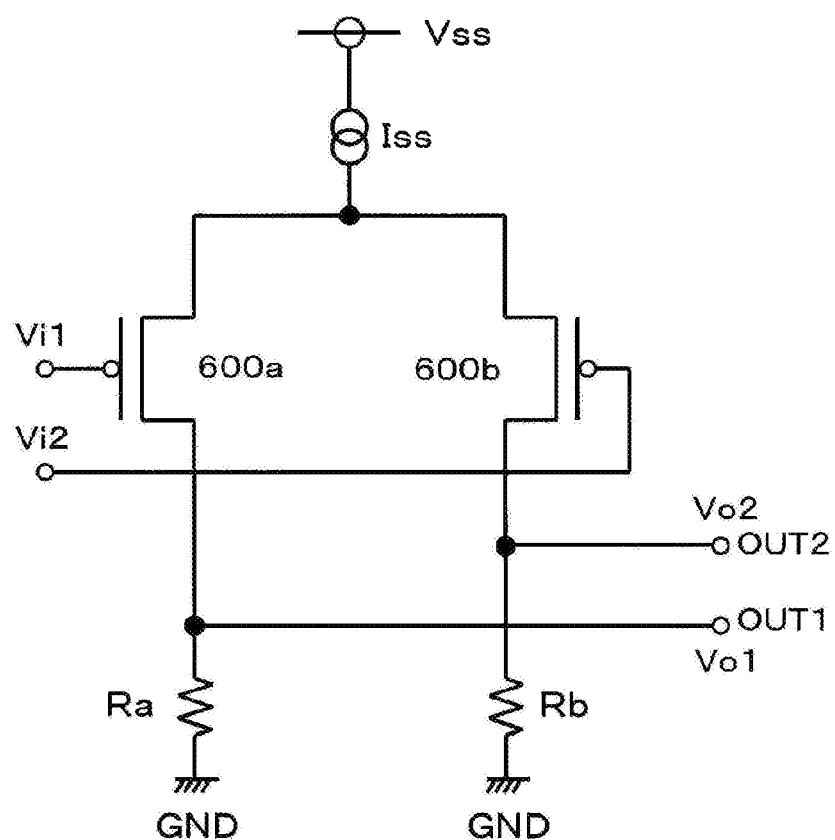
FIG. 25 is a circuit diagram illustrating a configuration where the semiconductor device according to the first to third embodiments of the present disclosure is used in a differential amplifier.

FIG. 25 is a circuit diagram illustrating one example configuration where the semiconductor device according to the first to third embodiments of the present disclosure is used in a differential amplifier.

The differential amplifier of FIG. 25 includes a constant current source Iss, a PMOS transistor 600*a*, a PMOS transistor 600*b*, a resistor Ra and a resistor Rb. The differential amplifier of FIG. 25 includes a differential transistor pair consisting of the PMOS transistor 600*a* and the PMOS transistor 600*b*.

A source of the PMOS transistor 600*a* and a source of the PMOS transistor 600*b* are connected in common to a power terminal (high level terminal) Vss via the constant current source Iss. An input voltage Vi1 is applied to a gate of the PMOS transistor 600*a*. An input voltage Vi2 is applied to a gate of the PMOS transistor 600*b*. A drain of the PMOS transistor 600*a* is connected to one end of the resistor Ra and an output terminal OUT1. A drain of the PMOS transistor 600*b* is connected to one end of the resistor Rb and an output terminal OUT2. The other end of the resistor Ra is connected to a ground terminal (low potential terminal) GND. The other end of the resistor Ra is connected to the ground terminal (low potential terminal) GND. An output voltage Vo1 and an output voltage Vo2 are determined based on the magnitude of the input voltage Vi1, the magnitude of the input voltage Vi2, the magnitude of a current supplied from the constant current source Iss, the size of the resistor Ra and the size of the resistor Rb.

Since a MOS transistor in which no hump (kink) phenomenon occurs is used in the differential amplifier of FIG. 25, a current flowing through the MOS transistor can be adjusted to a predetermined size. That is, the differential amplifier of FIG. 25 can perform a stable operation particularly even in a weak inversion region (pentode region or sub-threshold region).

Figure 26:
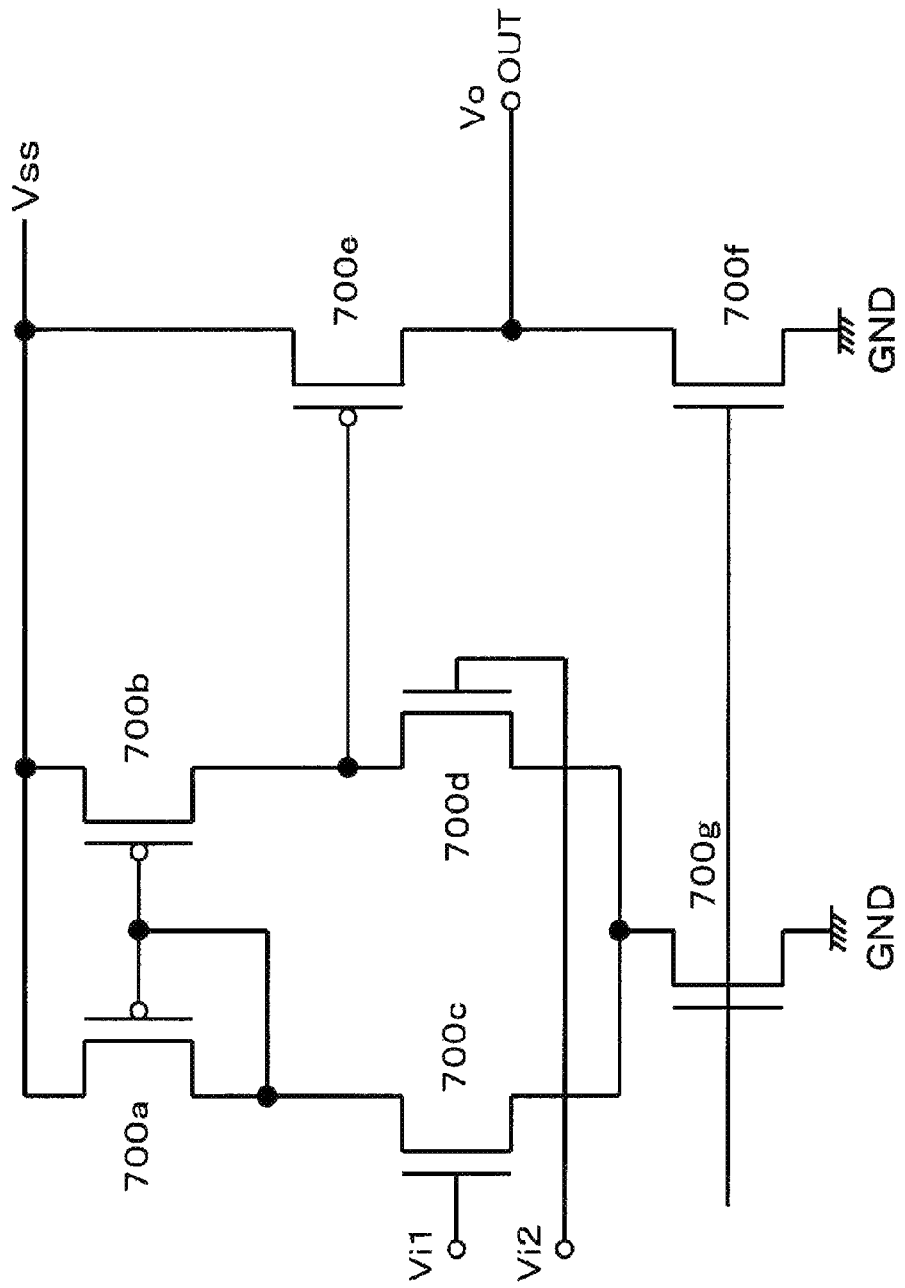
FIG. 26 is a circuit diagram illustrating a configuration where the semiconductor device according to the first to third embodiments of the present disclosure is used in a comparator.

FIG. 26 is a circuit diagram illustrating one example configuration where the semiconductor device according to the first to third embodiments of the present disclosure is used in a comparator.

The comparator of FIG. 26 includes a PMOS transistor 700a, a PMOS transistor 700b, an NMOS transistor 700c, an NMOS transistor 700d, a PMOS transistor 700e and an NMOS transistor 700f In short, a current mirror circuit is constituted by the PMOS transistor 700a and the PMOS transistor 700b and a differential amplifier is constituted by the NMOS transistor 700c and the NMOS transistor 700d.

A source of the PMOS transistor 700a and a source of the PMOS transistor 700b are connected in common to a power terminal (high level terminal) Vss. A gate of the PMOS transistor 700a and a gate of the PMOS transistor 700b are connected in common to a drain of the PMOS transistor 700a. The drain of the PMOS transistor 700a is connected to a drain of the NMOS transistor 700c. A drain of the PMOS transistor 700b is connected to a drain of the NMOS transistor 700d. A source of the NMOS transistor 700c and a source of the NMOS transistor 700d are connected in common to a drain of an NMOS transistor 700g. A source of the NMOS transistor 700g is connected to a ground terminal (low potential terminal) GND. An input voltage Vi1 is input to a gate of the NMOS transistor 700c. An input voltage Vi2 is input to a gate of the NMOS transistor 700d. A gate of the PMOS transistor 700e is connected to the drain of the PMOS transistor 700b. A source of the PMOS transistor 700e is connected to the power terminal (high level terminal) Vss. A drain of the PMOS transistor 700e is connected to a drain of the NMOS transistor 700f A gate of the NMOS transistor 700f is connected to a gate of the NMOS transistor 700g. A source of the NMOS transistor 700f is connected to the ground terminal (low potential terminal) GND. The drain of the NMOS transistor 700f is connected to an output terminal OUT. An output voltage Vo is output to the output terminal OUT.

Since a MOS transistor in which no hump (kink) phenomenon occurs is used in the comparator of FIG. 26, a current flowing through the MOS transistor can be adjusted to a predetermined size. That is, the comparator of FIG. 26 can perform a stable operation even in a weak inversion region (pentode region or sub-threshold region).

Figure 27:
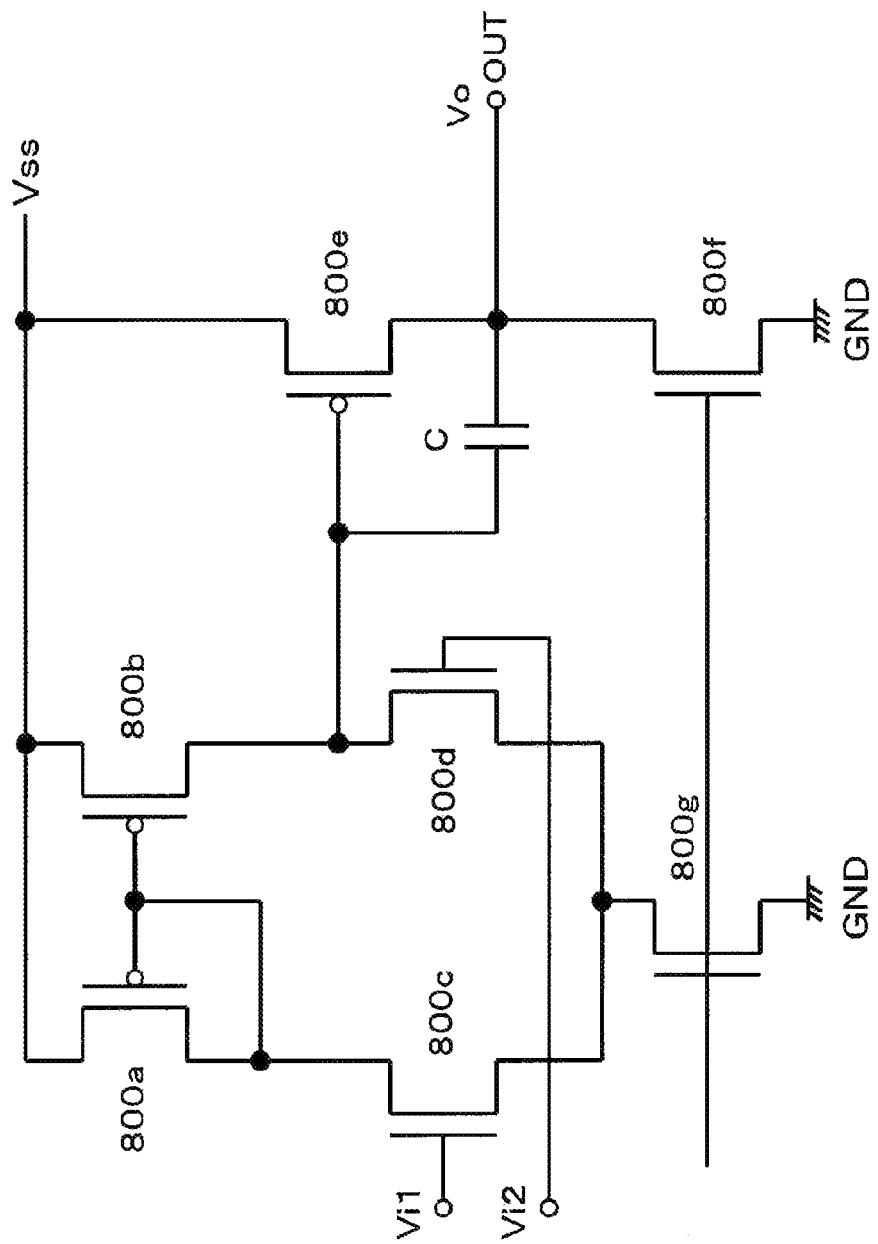
FIG. 27 is a circuit diagram illustrating a configuration where the semiconductor device according to the first to third embodiments of the present disclosure is used in an operational amplifier.

FIG. 27 is a circuit diagram illustrating one example configuration where the semiconductor device according to the first to third embodiments of the present disclosure is used in an operational amplifier.

The operational amplifier of FIG. 27 includes a PMOS transistor 800a, a PMOS transistor 800b, an NMOS transistor 800c, an NMOS transistor 800d, a PMOS transistor 800e, an NMOS transistor 800f and a capacitor C. An operational amplifier has substantially the same circuit configuration as a comparator. Therefore, the operational amplifier of FIG. 27 has partially substantially the same circuit configuration as the comparator of FIG. 26.

A source of the PMOS transistor 800a and a source of the PMOS transistor 800b are connected in common to a power terminal (high level terminal) Vss. A gate of the PMOS transistor 800a and a gate of the PMOS transistor 800b are connected in common to a drain of the PMOS transistor 800a. The drain of the PMOS transistor 800a is connected to a drain of the NMOS transistor 800c. A drain of the PMOS transistor 800b is connected to a drain of the NMOS transistor 800d. A source of the NMOS transistor 800c and a source of the NMOS transistor 800d are connected in common to a drain of an NMOS transistor 800g. A source of the NMOS transistor 800g is connected to a ground terminal (low potential terminal) GND. An input voltage Vi1 is input to a gate of the NMOS transistor 800c. An input voltage Vi2 is input to a gate of the NMOS transistor 800d. A gate of the PMOS transistor 800e is connected to the drain of the PMOS transistor 800b. A source of the PMOS transistor 800e is connected to the power terminal (high level terminal) Vss. A drain of the PMOS transistor 800e is connected to a drain of the NMOS transistor 800f A gate of the NMOS transistor 800f is connected to a gate of the NMOS transistor 800g. A source of the NMOS transistor 800f is connected to the ground terminal (low potential terminal) GND. The drain of the NMOS transistor 800f is connected to an output terminal OUT. An output voltage Vo is output to the output terminal OUT. The capacitor C is connected between the gate of the PMOS transistor 800e and the drain of the NMOS transistor 800f Phase compensation is achieved by the capacitor C.

Since a MOS transistor in which no hump (kink) phenomenon occurs is used in the operational amplifier of FIG. 27, a current flowing through the MOS transistor can be adjusted to a predetermined size. That is, the operational amplifier of FIG. 27 can perform a stable operation even in a weak inversion region (pentode region or sub-threshold region).

Figure 28:
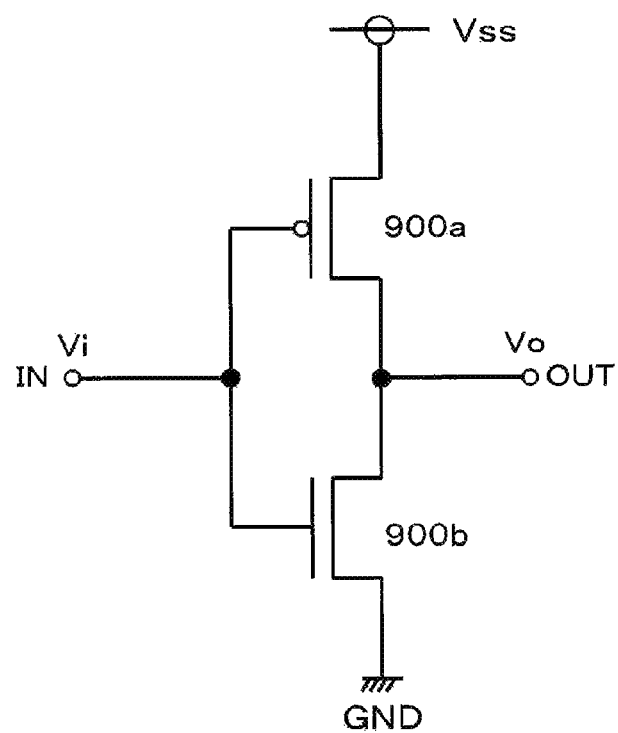
FIG. 28 is a circuit diagram illustrating a configuration where the semiconductor device according to the first to third embodiments of the present disclosure is used in a CMOS inverter.
Figure 29:
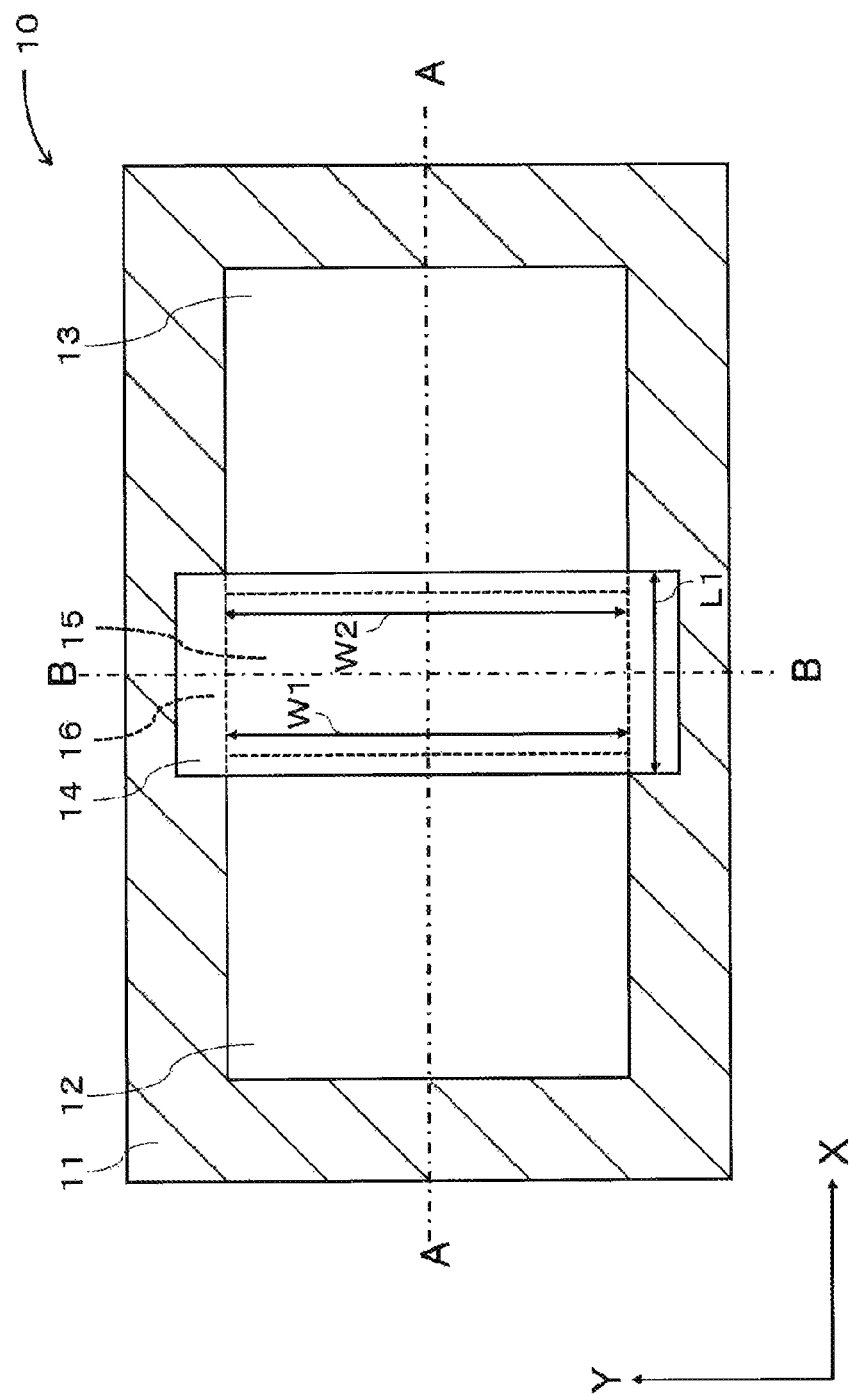
FIG. 29 is a schematic plan view illustrating the configuration of a semiconductor device in the related art.
Figure 30:
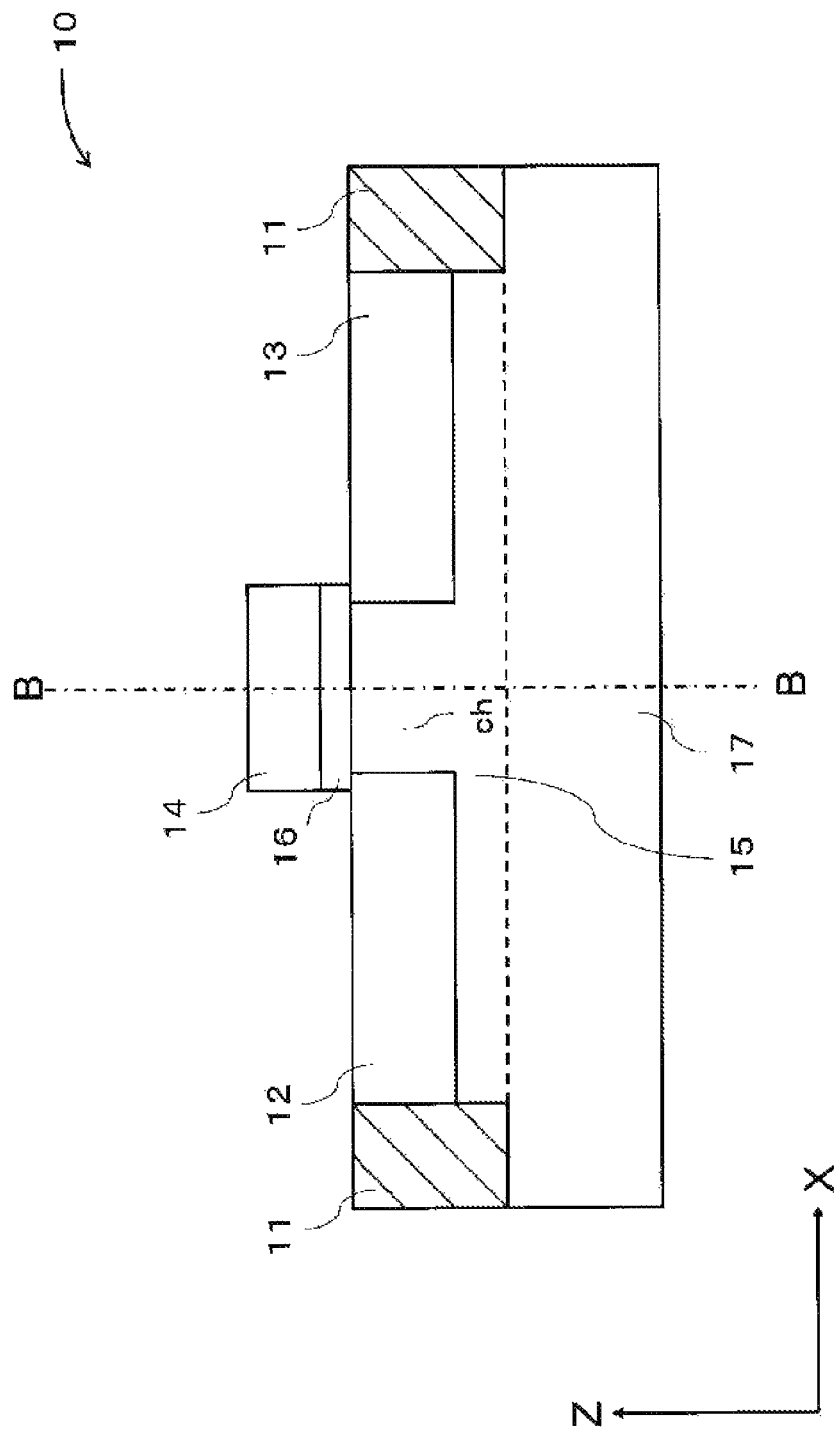
FIG. 30 is a schematic sectional view taken along line A-A of the semiconductor device of FIG. 29.
Figure 31:
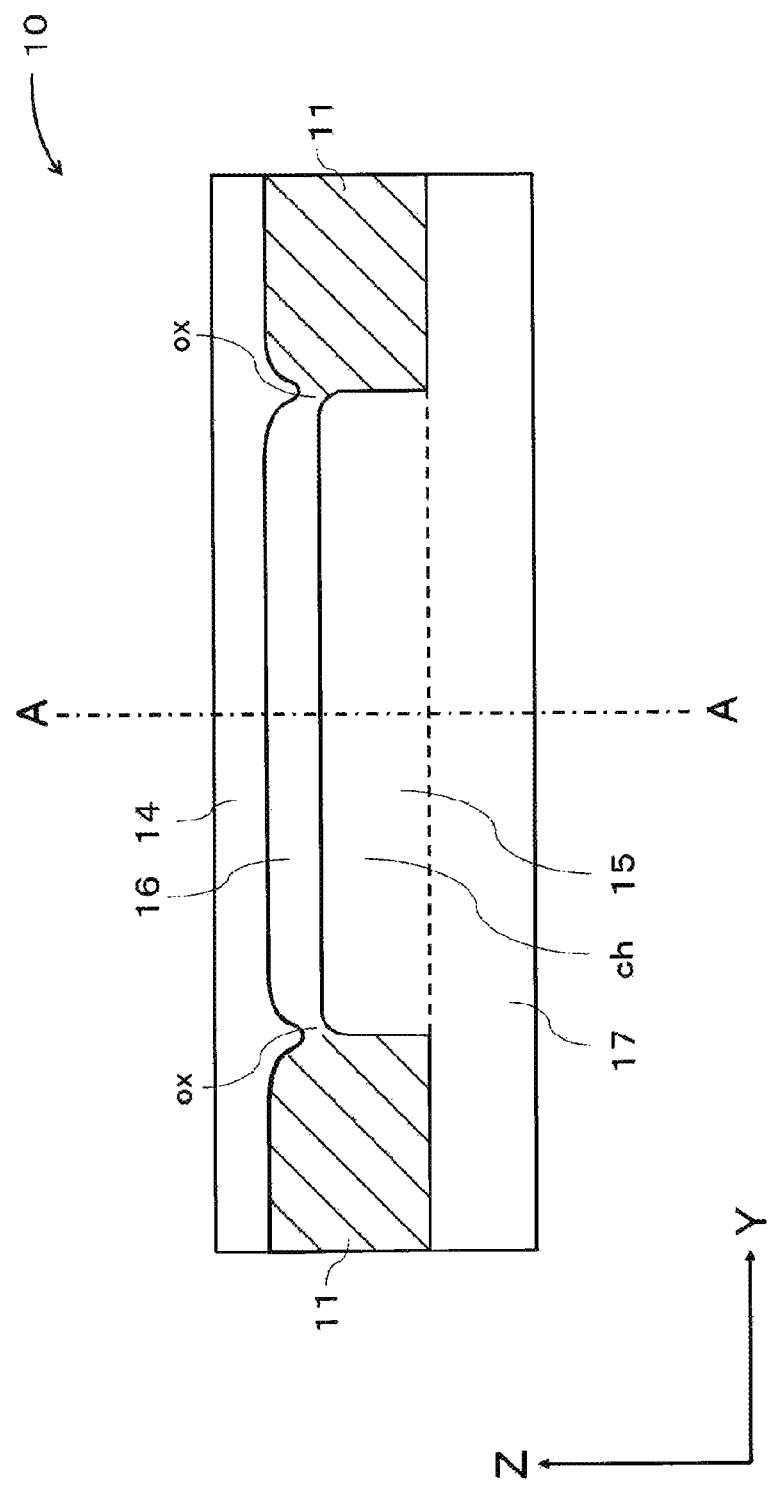
FIG. 31 is a schematic sectional view taken along line B-B of the semiconductor device of FIG. 29.
Figure 32:
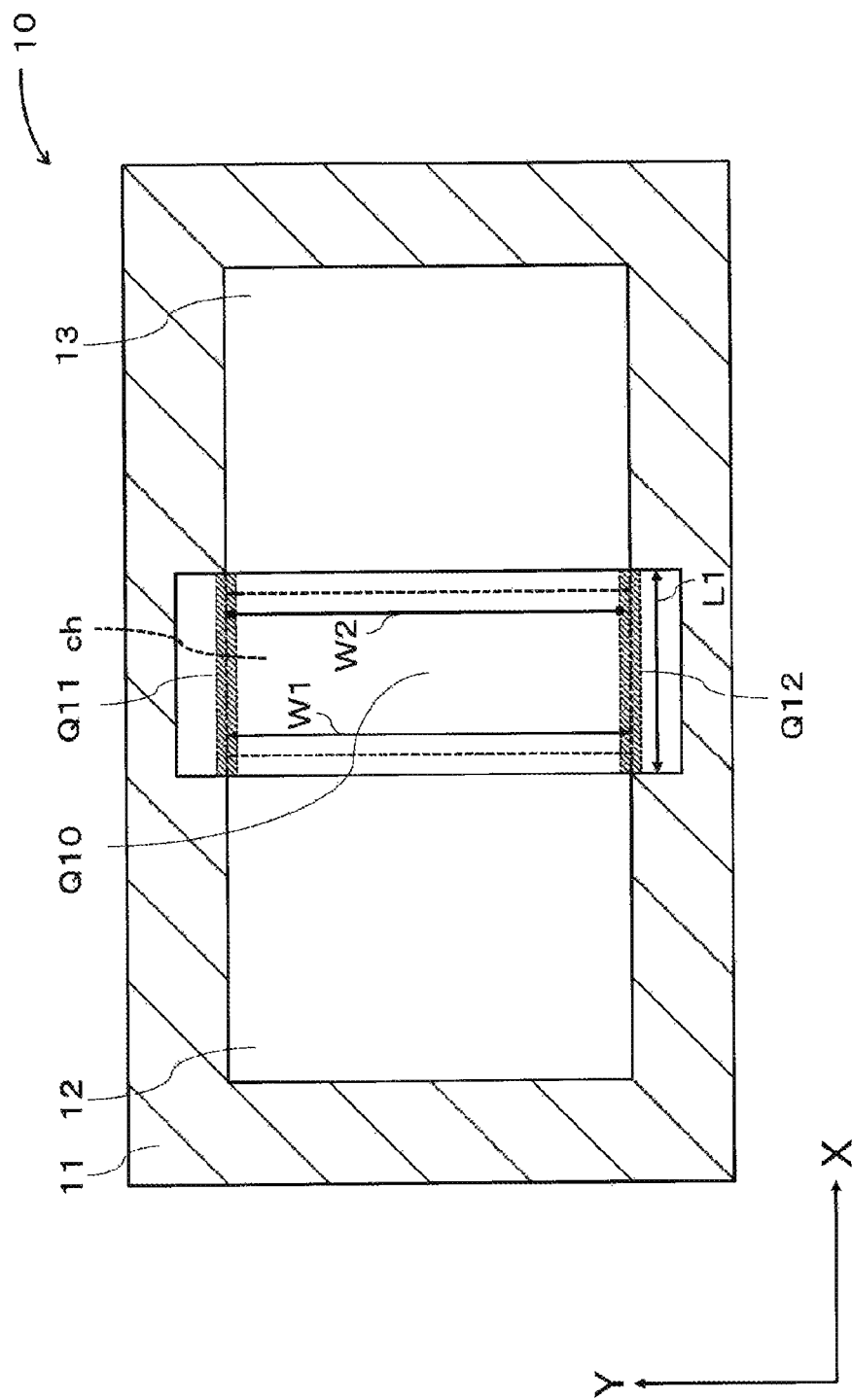
FIG. 32 is a schematic plan view illustrating a relationship between a main transistor and a parasitic transistor of the semiconductor device of FIG. 29.
Figure 33:
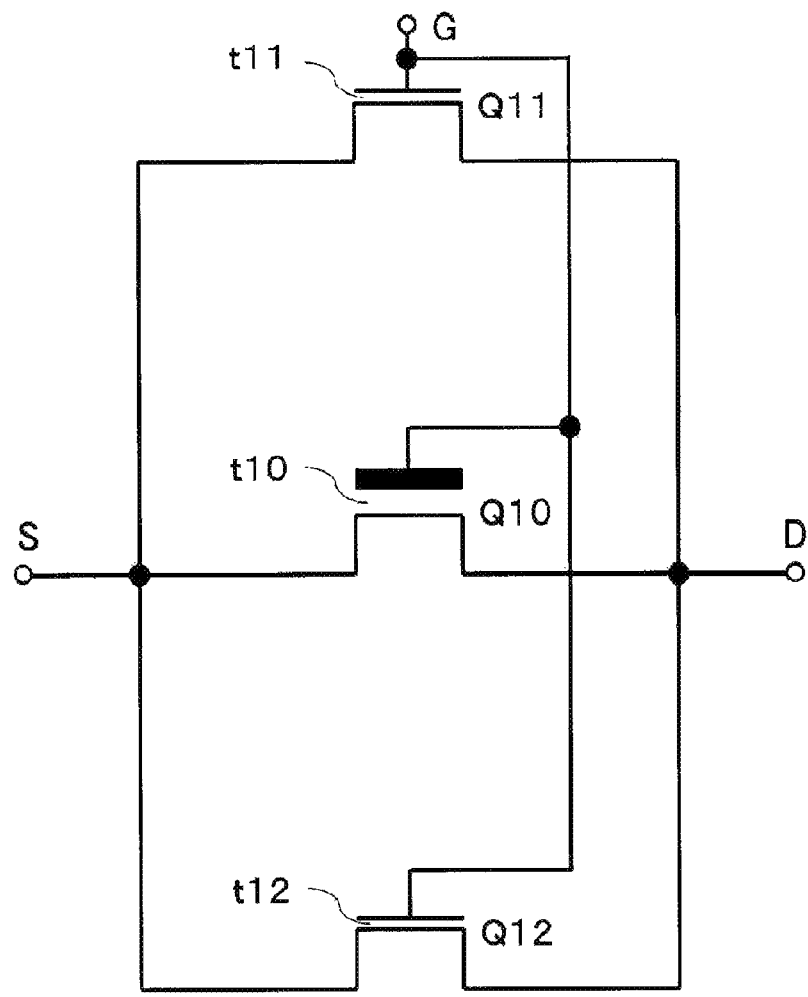
FIG. 33 is a circuit diagram illustrating a relationship between the main transistor and the parasitic transistor of the semiconductor device of FIG. 29.
Figure 34:
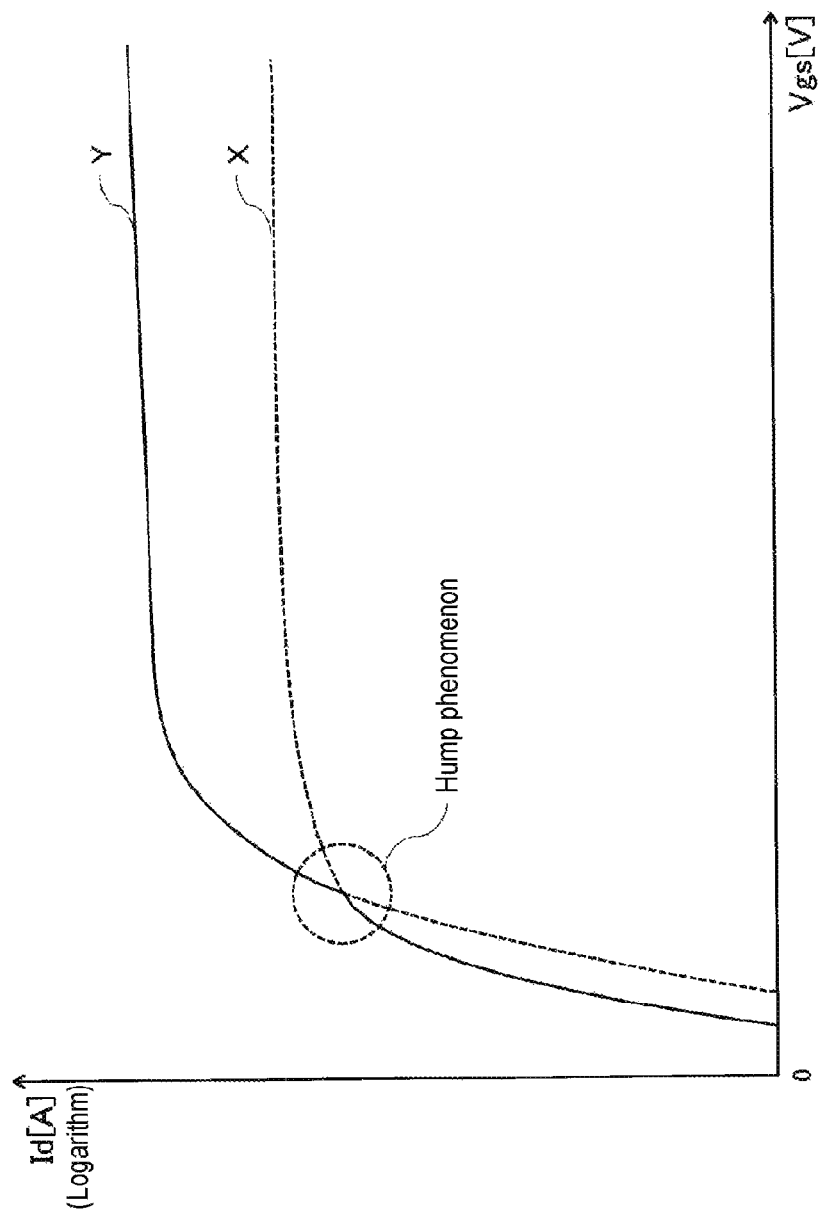
FIG. 34 is a graph showing a gate-source voltage (Vgs)-drain current (Id) characteristic of the semiconductor device of FIG. 29.
Figure 35:
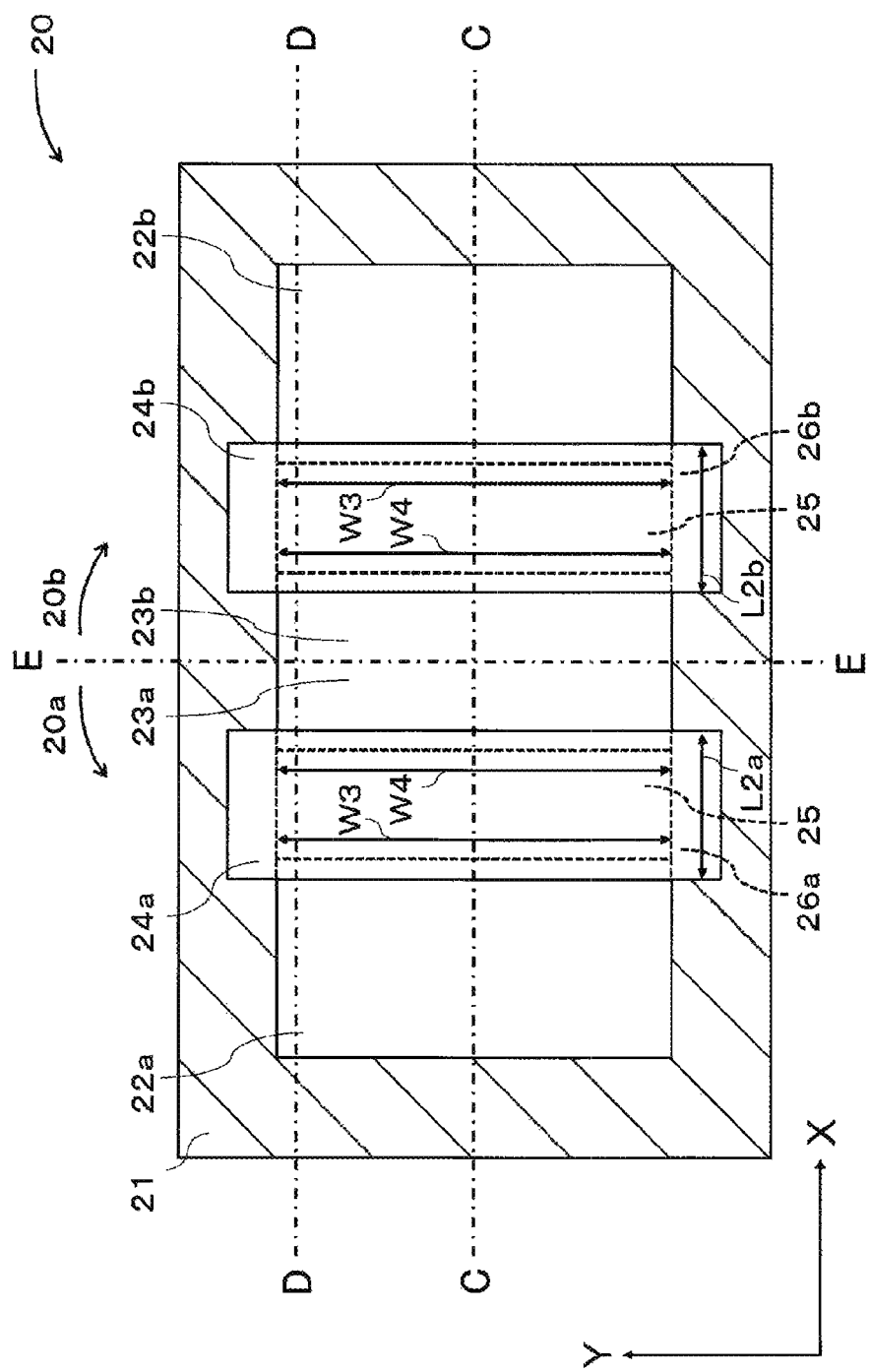
FIG. 35 is a schematic plan view illustrating another example of the semiconductor device in the related art.
Figure 36:
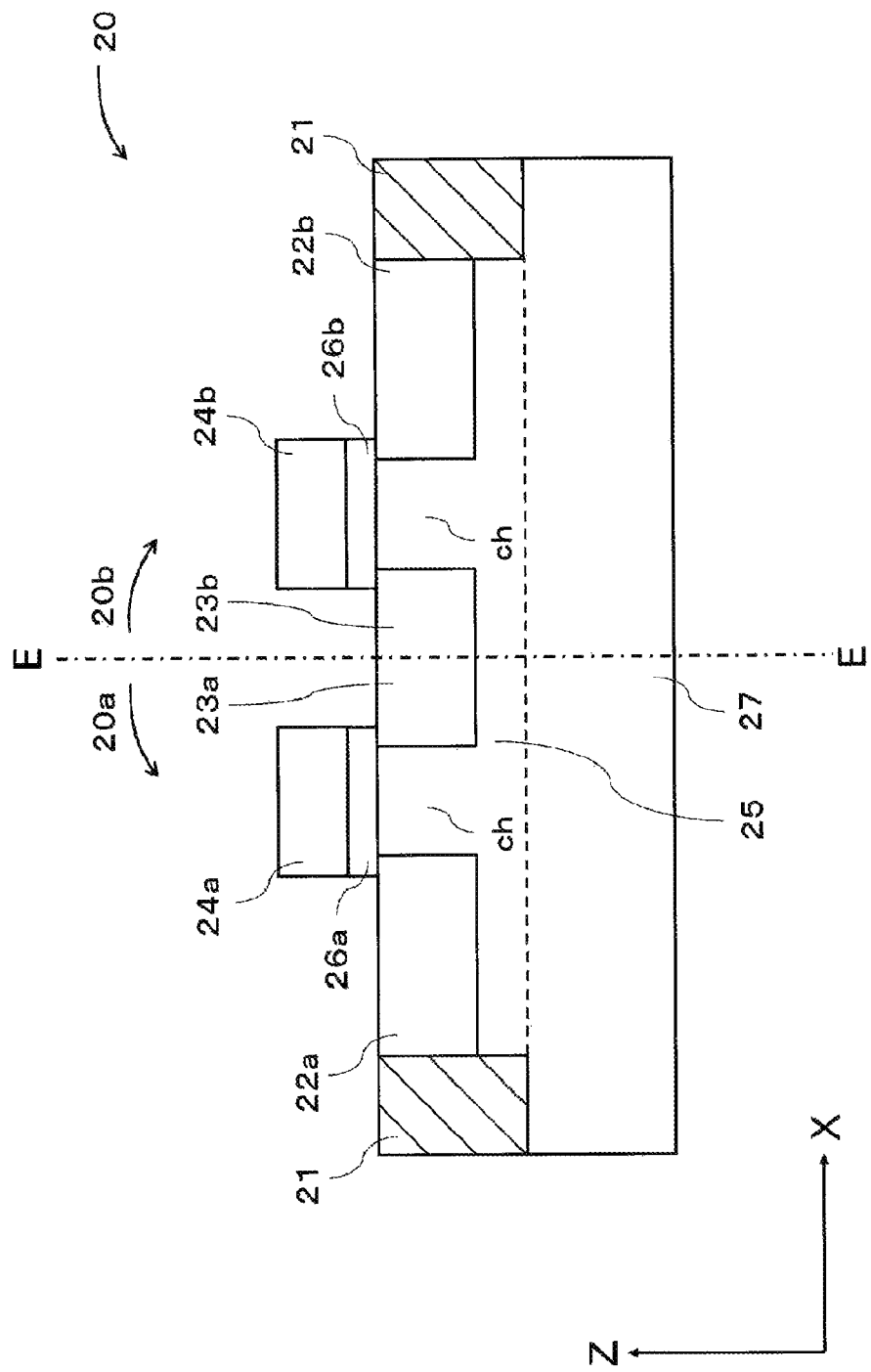
FIG. 36 is a schematic sectional view taken along line C-C of the semiconductor device of FIG. 35.
Figure 37:
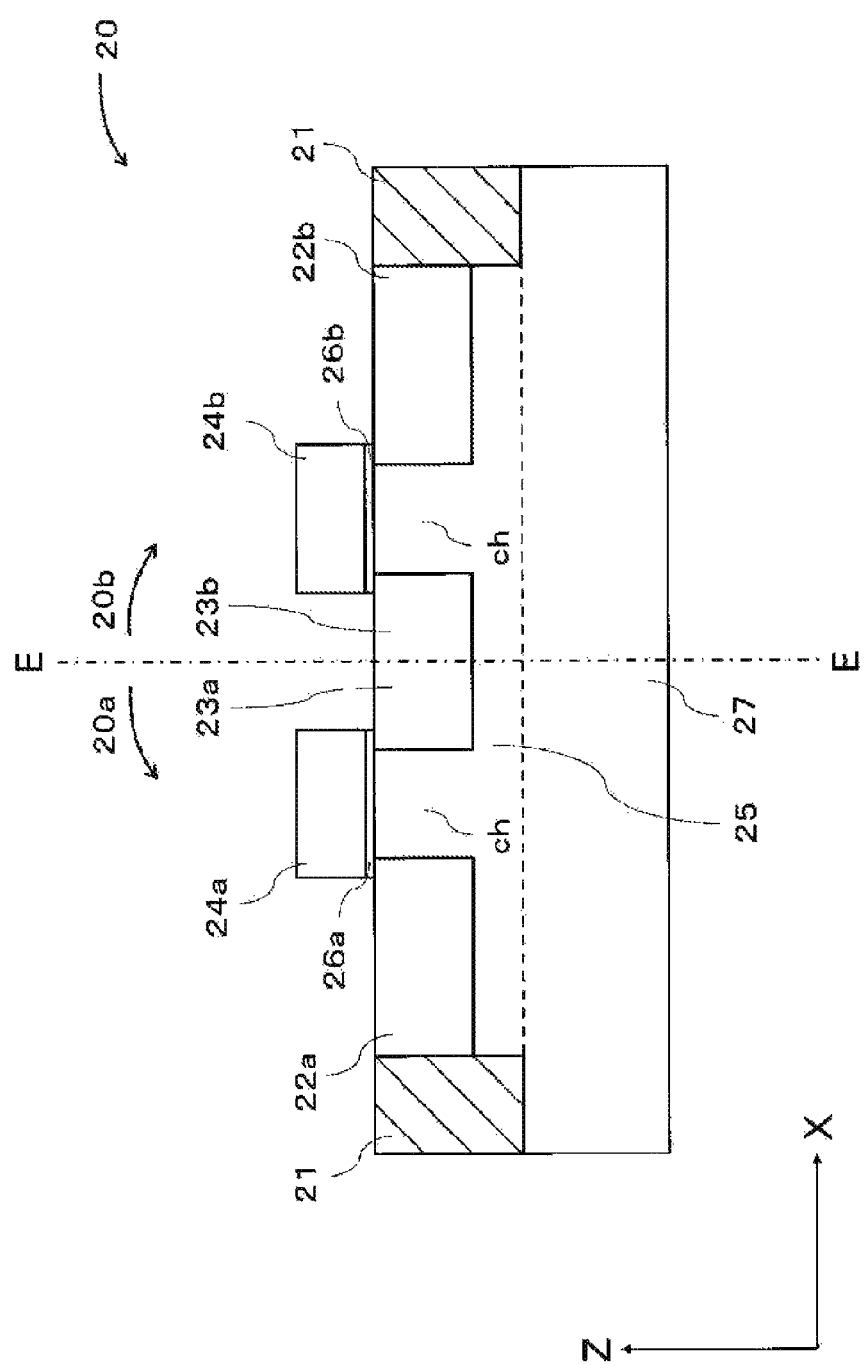
FIG. 37 is a schematic sectional view taken along line D-D of the semiconductor device of FIG. 35.
Figure 38:
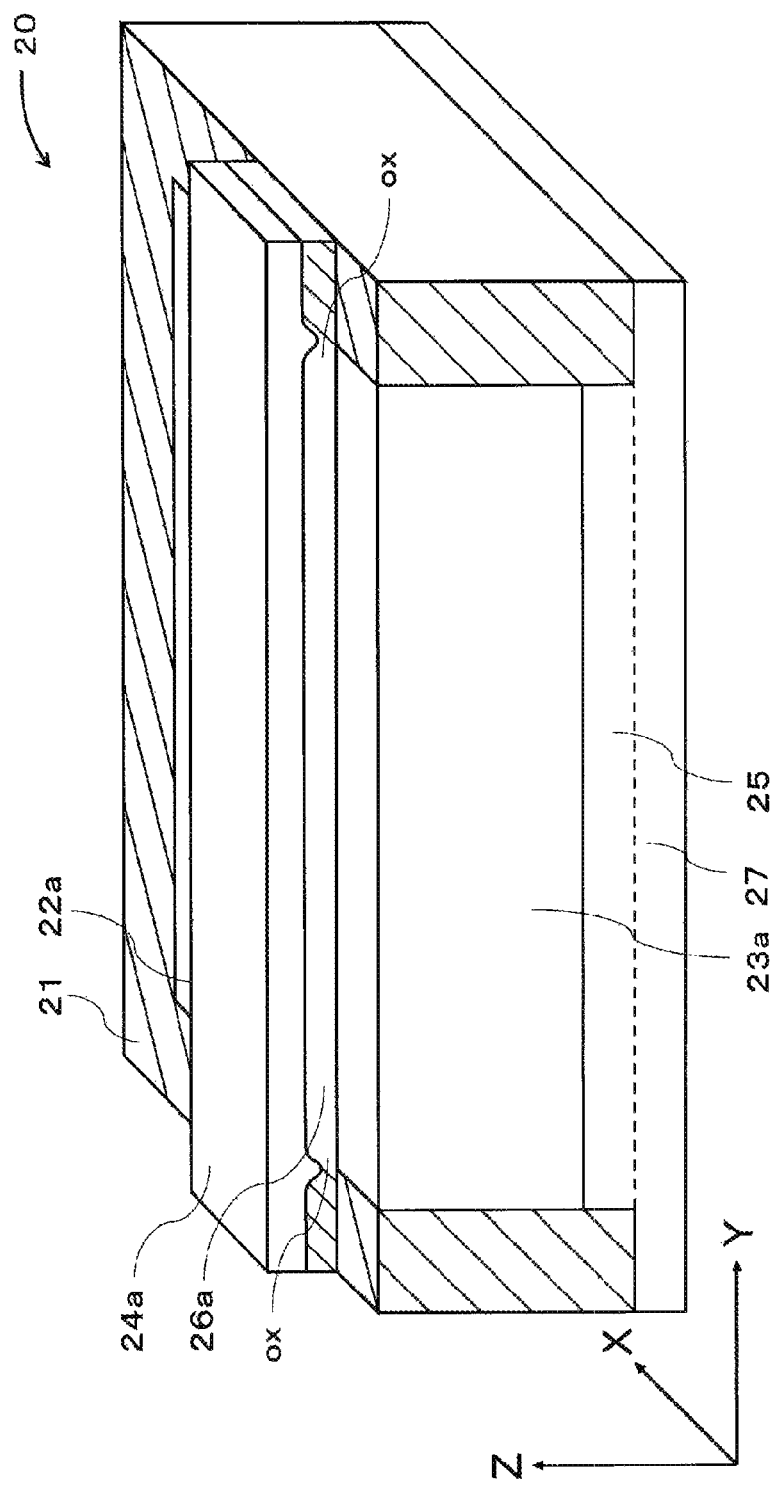
FIG. 38 is a schematic perspective sectional view taken along line E-E of the semiconductor device of FIG. 35.
Figure 39:
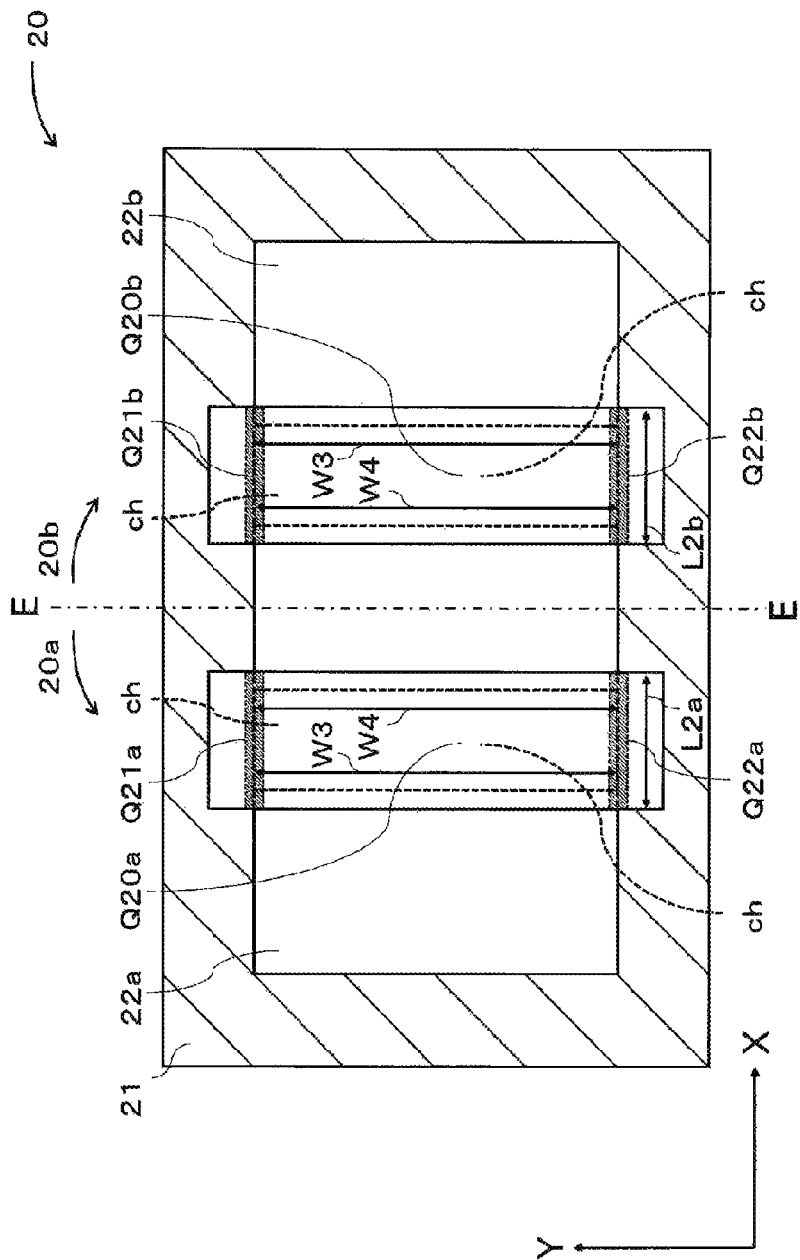
FIG. 39 is a schematic plan view illustrating a relationship between a main transistor and a parasitic transistor of the semiconductor device of FIG. 35.
Figure 40:
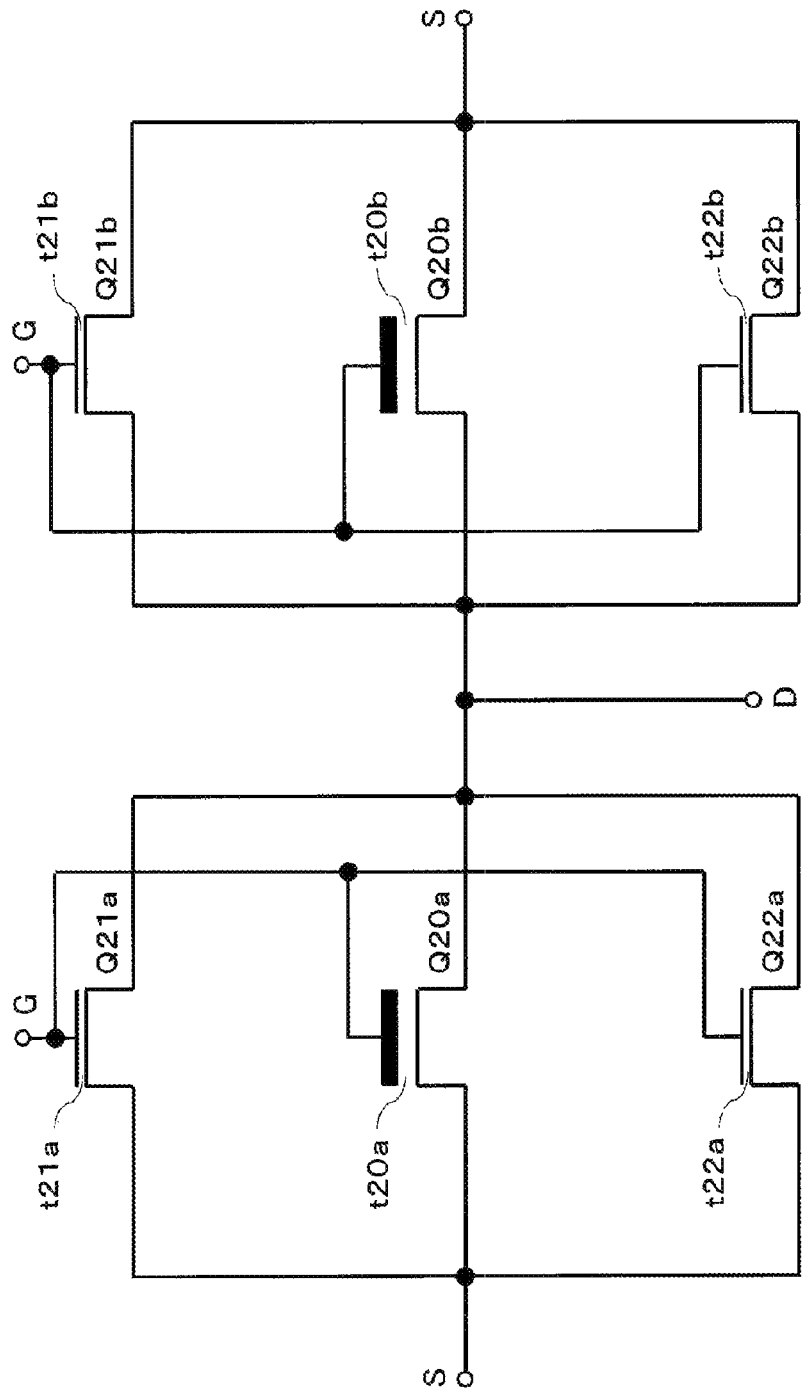
FIG. 40 is a circuit diagram illustrating a relationship between the main transistor and the parasitic transistor of the semiconductor device of FIG. 35.

FIG. 28 is a circuit diagram illustrating one example configuration where the semiconductor device according to the first to third embodiments of the present disclosure is used in a CMOS inverter.

The CMOS inverter of FIG. 28 includes a PMOS transistor 900a and an NMOS transistor 900b.

A source of the PMOS transistor 900a is connected to a power terminal (high level terminal) Vss. A source of the NMOS transistor 900b is connected to a ground terminal (low level terminal) GND. A gate of the PMOS transistor 900a and a gate of the NMOS transistor 900b are connected in common to an input terminal IN. A drain of the PMOS transistor 900a and a drain of the NMOS transistor 900b are connected in common to an output terminal OUT. An input voltage Vi is input to the input terminal IN and an output voltage Vo is input to the output terminal OUT.

In general, without being limited to the CMOS inverter of FIG. 28, a CMOS inverter does not contain the differential transistor pair shown in FIGS. 25 to 27. However, when irregularity occurs in the electrical characteristics of the PMOS transistor 900a and the NMOS transistor 900b, timings of turn-on/off of both transistors are deviated. Therefore, the semiconductor device according to the present disclosure is suitable to be used in a CMOS inverter as well as a semiconductor integrated circuit using a differential transistor pair.

Since a MOS transistor in which no hump (kink) phenomenon occurs is used in the CMOS inverter of FIG. 28, a current flowing through the MOS transistor can be adjusted to a predetermined size. That is, the CMOS inverter of FIG. 28 can perform a stable operation even in a weak inversion region (pentode region or sub-threshold region).

In addition, in the first to fourth embodiments, a drain region and a source region may be arranged in reverse. In addition, a P-type drain region and a P-type source region may be replaced for an N-type drain region and an N-type source region, respectively, and an N-type semiconductor region may be replaced for a P-type semiconductor region. Further, the transistor used in the semiconductor devices 100 to 300 may be not only a MOS transistor but also a MIS transistor in general. In addition, the semiconductor integrated circuit used therein may also be a MOS-type circuit in general.

The present disclosure can be used in a semiconductor device, a semiconductor integrated circuit using the semiconductor device, and an apparatus using the semiconductor device and the semiconductor integrated circuit in general. Thus, the present disclosure has high industrial applicability.

According to the above embodiments of the present disclosure, it is possible to provide a semiconductor device and a semiconductor integrated circuit using the same, which are capable of eliminating the complexity of a manufacturing process without increasing the number of manufacturing processes only by changing a mask layout, preventing a reverse narrow channel effect and a hump (kink) phenomenon, and reducing a leak current in an off state of a transistor.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a first region of a first conductivity type;
a second region of the first conductivity type and a third region of the first conductivity type with the first region interposed between the second region and the third region;
a first channel region of a second conductivity type formed between the first region and the second region;
a second channel region of the second conductivity type formed between the first region and the third region;
a first gate insulating film formed on the first channel region;
a first gate electrode formed on the first gate insulating film;
a second gate insulating film formed on the second channel region;
a second gate electrode formed on the second gate insulating film;
a semiconductor region of the second conductivity type on which the first region, the second region, the third region, the first channel region and the second channel region are formed;
an element isolation region which surrounds the semiconductor region;
a third gate insulating film and a fourth gate insulating film formed on the semiconductor region between the element isolation region and the first region; and
a third gate electrode and a fourth gate electrode formed on the third gate insulating film and the fourth gate insulating film, respectively,
wherein the first gate electrode extends beyond a first boundary portion between the first channel region and the element isolation region,
wherein the second gate electrode extends beyond a second boundary portion between the second channel region and the element isolation region, and
wherein a width of the first region is smaller than widths of the second region and the third region in a channel width direction of the first region, the second region and the third region,
wherein the first gate insulating film, the second gate insulating film, the third gate insulating film and the fourth gate insulating film are integrated, and
wherein the first gate electrode, the second gate electrode, the third gate electrode and the fourth gate electrode are integrated.

2. The semiconductor device of claim 1, wherein both ends of the first region are located more inside than both ends of the second region and both ends of the third region in the channel width direction, and
wherein a first end of the first region is located between both ends of the first gate insulating film, and a second end of the first region is located between both ends of the second gate insulating film in a channel length direction of the first region, the second region and the third region.

3. The semiconductor device of claim 1, wherein the first region, the second region and the third region overlap with each other when viewed in a first direction parallel to the semiconductor region.

4. The semiconductor device of claim 3, wherein the first region, the second region and the third region does not overlap with each other in a view of a second direction perpendicular to the first direction.

5. The semiconductor device of claim 1, wherein the third gate electrode extends beyond a third boundary portion between the first region and the element isolation region.

6. A semiconductor integrated circuit comprising:
at least one transistor corresponding to a semiconductor device including:
a first region of a first conductivity type;
a second region of the first conductivity type and a third region of the first conductivity type with the first region interposed between the second region and the third region;
a first channel region of a second conductivity type formed between the first region and the second region;
a second channel region of the second conductivity type formed between the first region and the third region;
a first gate insulating film formed on the first channel region;
a first gate electrode formed on the first gate insulating film;
a second gate insulating film formed on the second channel region;
a second gate electrode formed on the second gate insulating film;
a semiconductor region of the second conductivity type on which the first region, the second region, the third region, the first channel region and the second channel region are formed;
an element isolation region which surrounds the semiconductor region;
a third gate insulating film and a fourth gate insulating film formed on the semiconductor region between the element isolation region and the first region; and a third gate electrode and a fourth gate electrode formed on the third gate insulating film and the fourth gate insulating film, respectively, wherein the first gate electrode extends beyond a first boundary portion between the first channel region and the element isolation region, wherein the second gate electrode extends beyond a second boundary portion between the second channel region and the element isolation region, and wherein a width of the first region is smaller than widths of the second region and the third region in a channel width direction of the first region, the second region and the third region, wherein the first gate insulating film, the second gate insulating film, the third gate insulating film and the fourth gate insulating film are integrated, and wherein the first gate electrode, the second gate electrode, the third gate electrode and the fourth gate electrode are integrated.

7. The semiconductor integrated circuit of claim 6, comprising a differential transistor pair including at least two transistors, each of the at least two transistors corresponding to the semiconductor device, and wherein the at least two transistors are common source coupled or common drain coupled.

8. The semiconductor integrated circuit of claim 7, wherein the at least two transistors are operated in a weak inversion region of a MOS transistor operation region.

9. The semiconductor integrated circuit of claim 8, wherein the at least two transistors are configured as at least one selected from a group consisting of a differential amplifier, a cascode circuit, a current mirror circuit, a comparator and an operational amplifier.

10. The semiconductor integrated circuit of claim 7, wherein the at least two transistors are operated in a strong inversion region of a MOS transistor operation region.

11. The semiconductor integrated circuit of claim 6, wherein at least one transistor is configured as a MOS-type circuit formed on a single semiconductor substrate.

12. The semiconductor integrated circuit of claim 11, wherein the MOS-type circuit is a CMOS inverter.

13. The semiconductor integrated circuit of claim 6, wherein at least one transistor comprises a substrate electrode connected to a predetermined potential such that a substrate bias effect occurs in the at least one transistor.

* * * * *